United States Patent
Elsherbini et al.

(10) Patent No.: US 11,494,682 B2
(45) Date of Patent: Nov. 8, 2022

(54) QUANTUM COMPUTING ASSEMBLIES

(71) Applicant: Intel Corporation, Santa Clara, CA (US)

(72) Inventors: Adel A. Elsherbini, Chandler, AZ (US); Shawna M. Liff, Scottsdale, AZ (US); Jeanette M. Roberts, North Plains, OR (US); James S. Clarke, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 195 days.

(21) Appl. No.: 16/766,411

(22) PCT Filed: Dec. 29, 2017

(86) PCT No.: PCT/US2017/068910
§ 371 (c)(1),
(2) Date: May 22, 2020

(87) PCT Pub. No.: WO2019/132963
PCT Pub. Date: Jul. 4, 2019

(65) Prior Publication Data
US 2020/0364600 A1  Nov. 19, 2020

(51) Int. Cl.
*H01L 29/06* (2006.01)
*G06N 10/00* (2022.01)
(Continued)

(52) U.S. Cl.
CPC ......... *G06N 10/00* (2019.01); *H01L 21/4857* (2013.01); *H01L 27/18* (2013.01);
(Continued)

(58) Field of Classification Search
CPC ... H01L 21/4857; H01L 27/18; H01L 39/025; H01L 39/2474; G06N 10/00; G06N 10/20; G06N 10/40
(Continued)

(56) References Cited

U.S. PATENT DOCUMENTS 6,084,308 A   7/2000 Kelkar et al.
6,150,724 A   11/2000 Wenzel et al.
(Continued)

FOREIGN PATENT DOCUMENTS

CN   111902933 A   11/2020
DE   112017008336   9/2020
(Continued)

OTHER PUBLICATIONS

Non Final Office Action in U.S. Appl. No. 16/648,354 dated Mar. 18, 2021, 8 pages.
(Continued)

*Primary Examiner* — Brook Kebede
(74) *Attorney, Agent, or Firm* — Akona IP PC

(57) ABSTRACT

Quantum computing assemblies, and related devices and methods, are disclosed herein. For example, in some embodiments, a quantum computing assembly may include: a package substrate; a first die coupled to the package substrate; and a second die coupled to the second surface of the package substrate and coupled to the first die; wherein the first die or the second die includes quantum processing circuitry.

20 Claims, 71 Drawing Sheets

(51) Int. Cl.
*H01L 21/48* (2006.01)
*H01L 27/18* (2006.01)
*H01L 39/02* (2006.01)
*H01L 39/24* (2006.01)
*B82Y 10/00* (2011.01)

(52) U.S. Cl.
CPC ........ *H01L 39/025* (2013.01); *H01L 39/2474* (2013.01); *B82Y 10/00* (2013.01)

(58) Field of Classification Search
USPC .......................................................... 257/31
See application file for complete search history.

(56) References Cited

U.S. PATENT DOCUMENTS

| | | |
|---|---|---|
| 9,136,236 B2 | 9/2015 | Starkston et al. |
| 10,068,181 B1 * | 9/2018 | Rigetti .............. H01L 21/76891 |
| 10,380,496 B2 * | 8/2019 | Elsherbini .............. H01L 24/85 |
| 10,826,492 B2 | 11/2020 | Dubey et al. |
| 2004/0036152 A1 | 2/2004 | Harper et al. |
| 2009/0072381 A1 | 3/2009 | Ishihara et al. |
| 2012/0074386 A1 | 3/2012 | Rachmady et al. |
| 2012/0119360 A1 | 5/2012 | Kim et al. |
| 2012/0261838 A1 | 10/2012 | Braunisch et al. |
| 2013/0221470 A1 | 8/2013 | Kinsman et al. |
| 2013/0264617 A1 | 10/2013 | Joshi et al. |
| 2014/0251669 A1 | 9/2014 | Manusharow et al. |
| 2015/0084210 A1 | 3/2015 | Chiu et al. |
| 2015/0145116 A1 | 5/2015 | Uzoh et al. |
| 2015/0214074 A1 | 7/2015 | Liu et al. |
| 2015/0216030 A1 | 7/2015 | Semmelmeyer et al. |
| 2015/0255427 A1 | 9/2015 | Sung et al. |
| 2015/0270209 A1 | 9/2015 | Woychik et al. |
| 2015/0325553 A1 | 11/2015 | Park et al. |
| 2015/0357309 A1 | 12/2015 | Liu et al. |
| 2016/0056102 A1 | 2/2016 | Konchady et al. |
| 2016/0111539 A1 | 4/2016 | Nayak |
| 2016/0147463 A1 | 5/2016 | Han et al. |
| 2016/0233203 A1 | 8/2016 | Chen et al. |
| 2017/0084553 A1 | 3/2017 | Jiang et al. |
| 2017/0084576 A1 | 3/2017 | Yu et al. |
| 2017/0092621 A1 † | 3/2017 | Das et al. |
| 2017/0110407 A1 | 4/2017 | Chaware et al. |
| 2017/0125332 A1 | 5/2017 | Song et al. |
| 2017/0141088 A1 | 5/2017 | Zhai et al. |
| 2017/0195602 A1 | 7/2017 | Iwabuchi et al. |
| 2017/0221952 A1 | 8/2017 | Huang et al. |
| 2017/0250166 A1 | 8/2017 | Cheng et al. |
| 2018/0013052 A1 † | 1/2018 | Oliver et al. |
| 2019/0006572 A1 | 1/2019 | Falcon et al. |
| 2019/0067245 A1 † | 2/2019 | Kinsley |
| 2019/0055038 A1 | 3/2019 | Jeon et al. |
| 2019/0066840 A1 | 4/2019 | Schoenberg |
| 2019/0066843 A1 | 4/2019 | Carlson |
| 2019/0131511 A1 | 5/2019 | Clarke et al. |
| 2019/0140073 A1 | 5/2019 | Pillarisetty et al. |
| 2019/0148530 A1 | 5/2019 | Pillarisetty et al. |
| 2019/0157393 A1 | 5/2019 | Roberts et al. |
| 2019/0164077 A1 | 5/2019 | Roberts et al. |
| 2019/0164959 A1 | 5/2019 | Thomas et al. |
| 2019/0165152 A1 | 5/2019 | Roberts et al. |
| 2019/0117883 A1 | 6/2019 | Abrams et al. |
| 2019/0117929 A1 | 6/2019 | Reinberg |
| 2019/0117930 A1 | 6/2019 | Al-Ali |
| 2019/0117972 A1 | 6/2019 | Schmidt et al. |
| 2019/0117973 A1 | 6/2019 | Schmidt et al. |
| 2019/0117974 A1 | 6/2019 | Creasey et al. |
| 2019/0117975 A1 | 6/2019 | Grossman et al. |
| 2019/0117977 A1 | 6/2019 | Puleo et al. |
| 2019/0125348 A1 | 6/2019 | Shelton, IV et al. |
| 2019/0125423 A1 | 6/2019 | Hinton et al. |
| 2019/0125456 A1 | 6/2019 | Shelton, IV et al. |
| 2019/0125498 A1 | 6/2019 | Bernhard |
| 2019/0125499 A1 | 6/2019 | Uchitel et al. |
| 2019/0125500 A1 | 6/2019 | Oskam et al. |
| 2019/0125501 A1 | 6/2019 | Esbech et al. |
| 2019/0181256 A1 | 6/2019 | Roberts et al. |
| 2019/0194016 A1 | 6/2019 | Roberts et al. |
| 2019/0198618 A1 | 6/2019 | George et al. |
| 2019/0206991 A1 | 7/2019 | Pillarisetty et al. |
| 2019/0206992 A1 | 7/2019 | George et al. |
| 2019/0206993 A1 | 7/2019 | Pillarisetty et al. |
| 2019/0214385 A1 | 7/2019 | Roberts et al. |
| 2019/0221659 A1 | 7/2019 | George et al. |
| 2019/0229188 A1 | 7/2019 | Clarke et al. |
| 2019/0229189 A1 | 7/2019 | Clarke et al. |
| 2019/0252377 A1 | 8/2019 | Clarke et al. |
| 2019/0259850 A1 | 8/2019 | Pillarisetty et al. |
| 2019/0266511 A1 | 8/2019 | Pillarisetty et al. |
| 2019/0267692 A1 | 8/2019 | Roberts et al. |
| 2019/0273197 A1 | 9/2019 | Roberts et al. |
| 2019/0288176 A1 | 9/2019 | Yoscovits et al. |
| 2019/0296214 A1 | 9/2019 | Yoscovits et al. |
| 2019/0305037 A1 | 10/2019 | Michalak et al. |
| 2019/0305038 A1 | 10/2019 | Michalak et al. |
| 2019/0312128 A1 | 10/2019 | Roberts et al. |
| 2019/0334020 A1 | 10/2019 | Amin et al. |
| 2019/0341459 A1 | 11/2019 | Pillarisetty et al. |
| 2019/0363181 A1 | 11/2019 | Pillarisetty et al. |
| 2019/0363239 A1 | 11/2019 | Yoscovits et al. |
| 2020/0027384 A1 | 1/2020 | Morita |
| 2020/0227377 A1 | 7/2020 | Liff et al. |
| 2020/0227401 A1 | 7/2020 | Elsherbini et al. |
| 2020/0273839 A1 | 8/2020 | Elsherbini et al. |
| 2020/0364600 A1 | 11/2020 | Elsherbini et al. |
| 2020/0402941 A1 | 12/2020 | Olson et al. |
| 2021/0111124 A1 | 4/2021 | Elsherbini et al. |
| 2021/0111147 A1 | 4/2021 | Liff et al. |
| 2021/0111155 A1 | 4/2021 | Liff et al. |
| 2021/0111156 A1 | 4/2021 | Elsherbini et al. |
| 2021/0111170 A1 | 4/2021 | Elsherbini et al. |

FOREIGN PATENT DOCUMENTS

| | | |
|---|---|---|
| DE | 112017008326 | 10/2020 |
| DE | 112017008327 | 10/2020 |
| KR | 1020160001912 U | 1/2016 |
| WO | 2013127045 † | 6/2013 |
| WO | 2017079424 A1 | 5/2017 |
| WO | 2017155531 A1 | 9/2017 |
| WO | 2017213638 A1 | 12/2017 |
| WO | 2017213639 A1 | 12/2017 |
| WO | 2017213641 A1 | 12/2017 |
| WO | 2017213645 A1 | 12/2017 |
| WO | 2017213646 A1 | 12/2017 |
| WO | 2017213647 A1 | 12/2017 |
| WO | 2017213648 A1 | 12/2017 |
| WO | 2017213649 † | 12/2017 |
| WO | 2017213649 A1 | 12/2017 |
| WO | 2017213651 A1 | 12/2017 |
| WO | 2017213661 A1 | 12/2017 |
| WO | 2017217958 A1 | 12/2017 |
| WO | 2018030977 A1 | 2/2018 |
| WO | 2018044267 A1 | 3/2018 |
| WO | 2018057013 A1 | 3/2018 |
| WO | 2018057015 A1 | 3/2018 |
| WO | 2018057018 A1 | 3/2018 |
| WO | 2018057023 A1 | 3/2018 |
| WO | 2018057024 A1 | 3/2018 |
| WO | 2018057027 A1 | 3/2018 |
| WO | 2018063139 A1 | 4/2018 |
| WO | 2018063168 A1 | 4/2018 |
| WO | 2018063170 A1 | 4/2018 |
| WO | 2018063202 A1 | 4/2018 |
| WO | 2018063203 A1 | 4/2018 |
| WO | 2018063205 A1 | 4/2018 |
| WO | 2018106215 A1 | 6/2018 |
| WO | 2018118098 A1 | 6/2018 |
| WO | 2018143986 A1 | 8/2018 |
| WO | 2018160184 A1 | 9/2018 |
| WO | 2018160185 A1 | 9/2018 |
| WO | 2018160187 A1 | 9/2018 |
| WO | 2018164656 A1 | 9/2018 |

(56) References Cited

FOREIGN PATENT DOCUMENTS

| WO | 2018182571 A1 | 10/2018 |
|---|---|---|
| WO | 2018182584 A1 | 10/2018 |
| WO | 2018200006 A1 | 11/2018 |
| WO | 2018231212 A1 | 12/2018 |
| WO | 2018231241 A1 | 12/2018 |
| WO | 2018236374 A1 | 12/2018 |
| WO | 2018236403 A1 | 12/2018 |
| WO | 2018236404 A1 | 12/2018 |
| WO | 2018236405 A1 | 12/2018 |
| WO | 2019004990 A1 | 1/2019 |
| WO | 2019004991 A1 | 1/2019 |
| WO | 2019032114 A1 | 2/2019 |
| WO | 2019032115 A1 | 2/2019 |
| WO | 2019132963 A1 | 7/2019 |
| WO | 2019132967 A1 | 7/2019 |
| WO | 2019132970 A1 | 7/2019 |
| WO | 2019132971 A1 | 7/2019 |

OTHER PUBLICATIONS

Non Final Office Action in U.S. Appl. No. 16/648,432 dated Mar. 17, 2021, 10 pages.
Non Final Office Action in U.S. Appl. No. 16/650,499 dated Apr. 1, 2021, 11 pages.
International Search Report and Written Opinion in International Patent Application No. PCT/US2017/068910 dated Sep. 28, 2018, 13 pages.
International Preliminary Report on Patentability in International Patent Application No. PCT/US2017/068906 dated Jul. 9, 2020, 9 pages.
International Preliminary Report on Patentability in International Patent Application No. PCT/US2017/068915 dated Jul. 9, 2020, 11 pages.
International Preliminary Report on Patentability in International Patent Application No. PCT/US2017/068920 dated Jul. 9, 2020, 8 pages.
International Preliminary Report on Patentability in International Patent Application No. PCT/US2017/068921, dated Jul. 9, 2020, 13 pages.
International Preliminary Report on Patentability in International Patent Application No. PCT/US2019/032159 dated Dec. 24, 2020, 9 pages.
"A Nanodamascene Process for Advanced Single-Electron Transistor Fabrication," Dubuc et al, IEEE Transactions on Nanotechnology, vol. 7, No. 1, Jan. 2008, pp. 68-73.
"A two-qubit logic gate in silicon," Veldhorst et al., Nature, vol. 526, Oct. 15, 2015, pp. 410-414.
"Gate-Defined Quantum Dots in Intrinsic Silicon," Angus et al., Nano Letters 2007, vol. 7, No. 7, 2051-2055, publication date Jun. 14, 2007, retrieved from http://pubs.acs.org on Mar. 31, 2009, 6 pages.
"Independent, extensible control of same-frequency superconducting qubits by selective broadcasting," Asaad et al., Netherlands Organisation for Applied Scientific Research, Aug. 28, 2015, 17 pages.
"Fast sensing of double-dot charge arrangement and spin state with an rf sensor quantum dot," Barthel et al, Materials Department, University of California, Santa Barbara, Jan. 16, 2014, 4 pages.
"Undoped accumulation-mode Si/SiGe quantum dots," Borselli et al, HRL Laboratories, LLC., Jul. 15, 2014, 4 pages.
"Multilayer microwave integrated quantum circuits for scalable quantum computing," Brecht et al, Department of Applied Physics, Yale University, Sep. 4, 2015, 5 pages.
"Reducing intrinsic loss in superconducting resonators by surface treatment and deep etching of silicon substrates," Bruno, et al., QuTech Advanced Research Center and Kavli Institute of Nanoscience, Delft University of Technology, The Netherlands, Feb. 16, 2015, 9 pages.
"Spin Relaxation and Decoherence of Holes in Quantum Dots," Bulaev et al., Phys. Rev. Lett. 95, 076805, Aug. 11, 2005, 1 page.
"Fundamentals of Silicon Material Properties for Successful Exploitation of Strain Engineering in Modern CMOS Manufacturing," Chidambaram et al, IEE Transactions on Electron Devices, vol. 53, No. 5, May 2006, pp. 944-964.
"Ultrafast optical control of individual quantum dot spin qubits," De Greve et al, Reports on Progress in Physics, vol. 76, No. 9, Sep. 4, 2013, 2 pages.
"Fabrication and Characterization of Sidewall Defined Silicon-on-Insulator Single-Electron Transistor," Jung et al., IEEE Transactions on Nanotechnology, vol. 7, No. 5, Sep. 2008, pp. 544-550.
"How it's built: Micron/Intel3D NAND Micron Opens the Veil a Little," Moyer, Bryon, retrieved from https://www.eejournal.com/article/20160201-micron/ on Nov. 29, 2017, 9 pages.
"Investigation of Vertical Type Single-Electron Transistor with Sidewall Spacer Quantum Dot," Kim et al, Student Paper, Inter-University Semiconductor Research Center and School of Electrical Engineering and Computer Science, Seoul National University, ISDRS 2011, Dec. 7-9, 2011, ISDRS 2011—http://www.ece.umd.edu/ISDR2011, 2 pages.
"Platinum single-electron transistors with tunnel barriers made by atomic layer deposition", George et al., Department of Electrical Engineering, University of Notre Dame, Received Jul. 7, 2010:Published Nov. 5, 2010, 3 pages.
"Surface loss simulations of superconducting coplanar waveguide resonators," Wenner et al, Applied Physics Letters 99, 113513 (2011), pp. 113513-1 through 3.
"Quantum computation with quantum dots," Loss et al, Physical Review A, vol. 57, No. 1, Jan. 1998, pp. 120-126.
"Ultafast high-fidelity initialization of a quantum-dot spin qubit without magnetic fields," Mar et al., Phys. Rev. B 90 241303®, published Dec. 15, 2014, 1 page.
"Delaying Forever: Uniaxial Strained Silicon Transistors in a 90nm CMOS Technology," Mistry et al. Portland Technology Department, TCAD, Intel Corp., 2 pages.
Supplementary Information, retrieved from www.nature.com, doi:10.1038/nature 15263, 8 pages.
"Magnetic field tuning of coplanar waveguide resonators," Healey, et al., Applied Physics Letters 93, 043513 (2008), pp. 043513-1 through 3 (4 pages with cover sheet).
"Embracing the quantum limit in silicon computing," Morton et al, Macmillan Publishers, Nov. 17, 2011, vol. 479, Nature, pp. 345-353.
"Review : Towards Spintronic Quantum Technologies with Dopants in Silicon," Morley, Gavin, Department of Physics, University of Warwich, 13 pages.
"A Reconfigurable Gate Architecture for Si/SiGe Quantum Dots," Zajac et al., Department of Physics, Princeton University; Department of Physics, University of California; Feb. 6, 2015, 5 pages.
"Scalable quantum circuit and control for a superconducting surface code," Versluis et al., Netherlands Organisation for Applied Scientific Research, Dec. 28, 2016, 9 pages.
"Defect reduction of selective Ge epitaxy in trenches on Si(001) substrates using aspect ratio trapping," Park et al., Applied Physics Letter 90, 052113 (2007), pp. 052113-1 through 3.
"Photon- and phonon-assisted tunneling in the three-dimensional charge stability diagram of a triple quantum dot array," Braakman et al., Applied Physics Letters 102, 112110 (2013), pp. 112110-1 through 4 (5 pages with cover sheet).
"Radio frequency measurements of tunnel couplings and singlet-triplet spin states in Si:P quantum dots," House et al., Nature Communications, 6:884, DOI: 10.1038/ncomms 9848, Nov. 9, 2015, pp. 1-6.
"Detecting bit-flip errors in a logical qubit using stabilizer measurements," Riste et al., Nature Communications, 6:6983, DOI: 10.1038/ncomms7983, Apr. 29, 2015, pp. 1-6.
"Scalable gate architecture for densely packed semiconductor spin qubits," Zajac et al, Department of Physics, Princeton University; Sandia National Laboratories, retrieved [cond-mat.mes-hall] Jul. 24, 2016, 8 pages.
"Silicon CMOS architecture for a spin-based quantum computer," Veldhorst et al., Qutech, TU Delft, The Netherlands, Centre for Quantum Computation and Communication Technology, School of Electrical Engineering and Telecommunications, The University of

(56) References Cited

OTHER PUBLICATIONS

New South Wales, NanoElectronics Group, MESA + Institute for Nanotechnology, University of Twente, The Netherlands, Oct. 2, 2016, 13 pages.
"Single-electron Transistors fabricated with sidewall spacer patterning," Park et al., Superlattices and Microstructures 34 (2003) 231-239.
"Single-electron Transistors with wide operating temperature range," Dubuc et al., Applied Physics Letters 90, 113104 (2007) pp. 113104-1 through 3.
"Single-shot read-out of an individual electron spin in a quantum dot," Elzerman et al., Nature, vol. 430, Jul. 22, 2004, pp. 431-435.
"Suspending superconducting qubits by silicon micromachining," Chu et al., Department of Applied Physics, Yale University, Jun. 10, 2016, 10 pages.
"Single-charge tunneling in ambipolar silicon quantum dots," Müller, Filipp, Dissertation, University of Twente, Jun. 19, 2015, 148 pages.
"An addressable quantum dot qubit with fault-tolerant control-fidelity," Veldhorst et al., Nature Nanotechnology vol. 9, Dec. 2014, pp. 981-985.

\* cited by examiner
† cited by third party

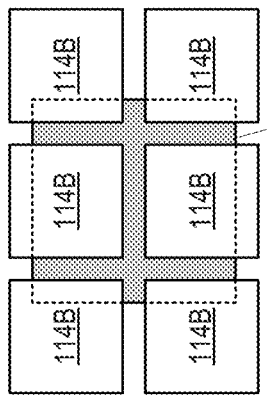
FIG. 12
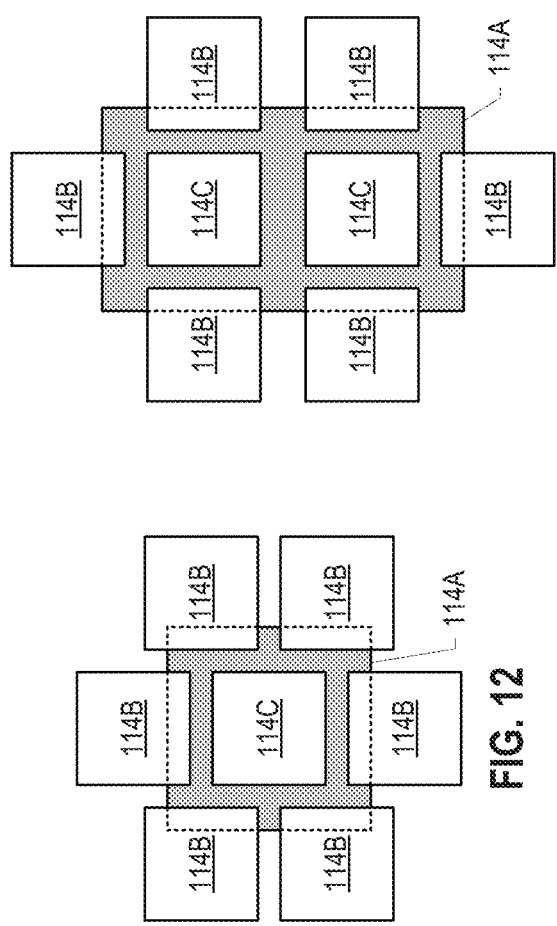
FIG. 13
FIG. 14
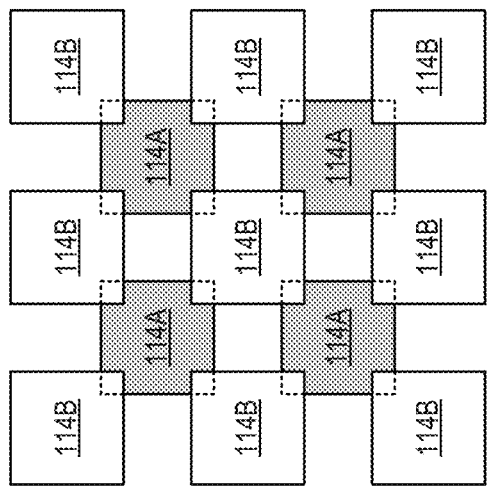
FIG. 16
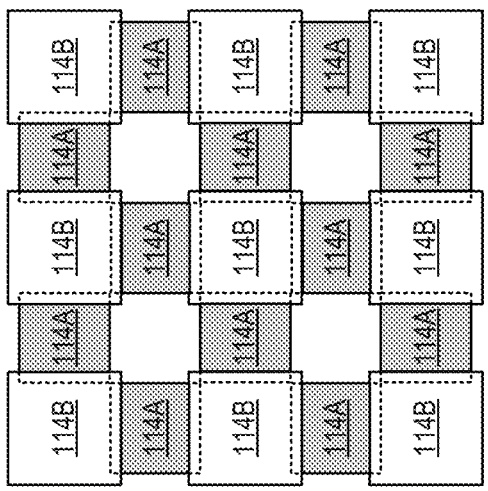
FIG. 15

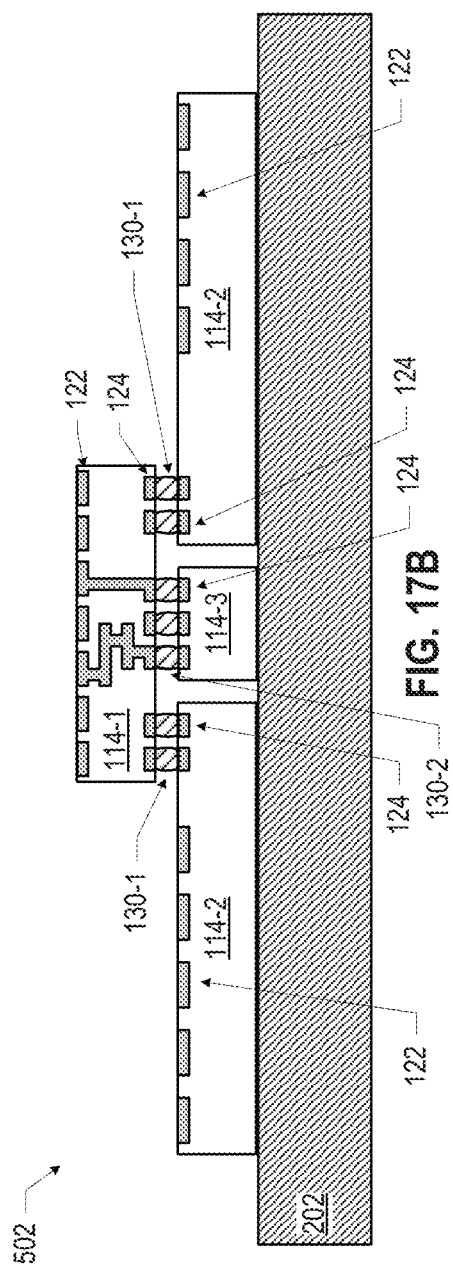

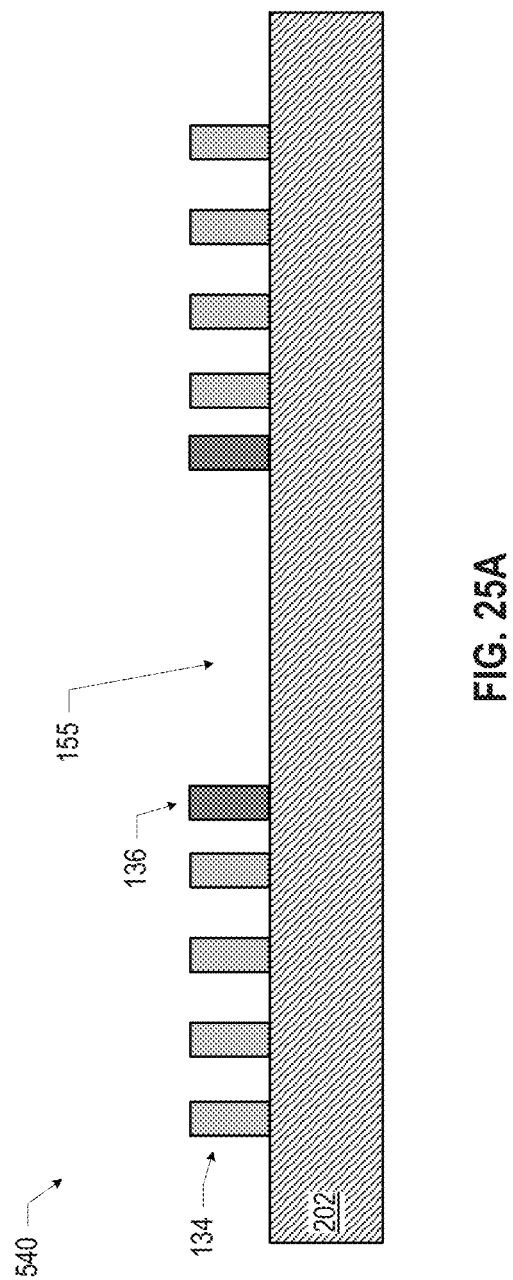

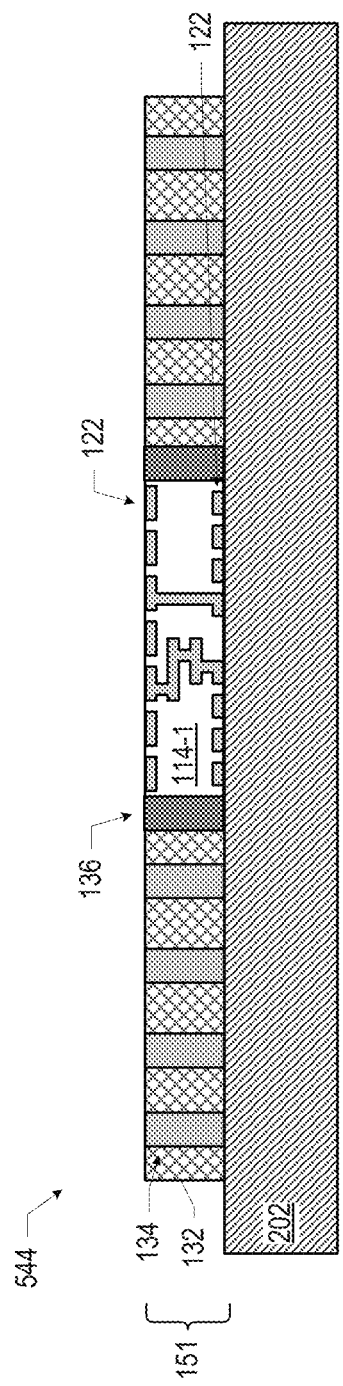

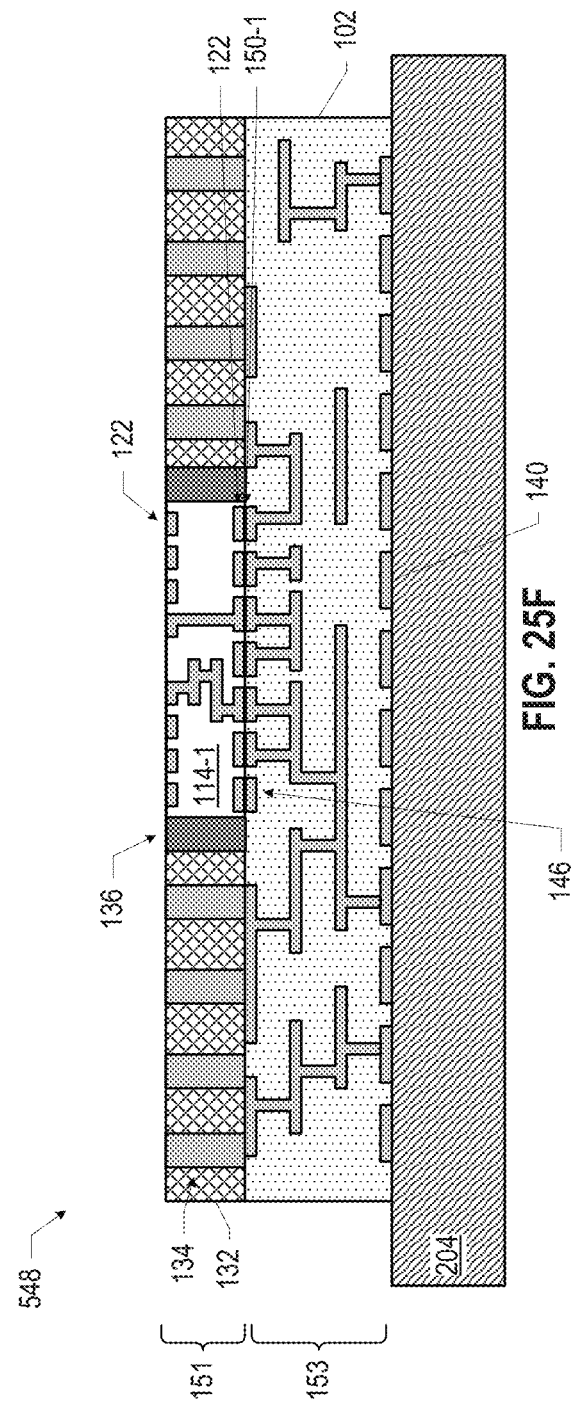

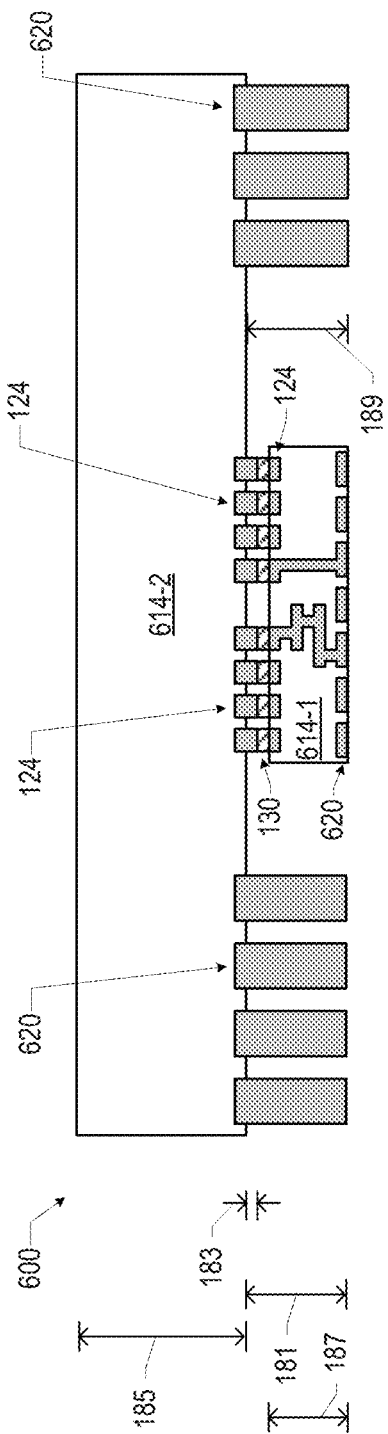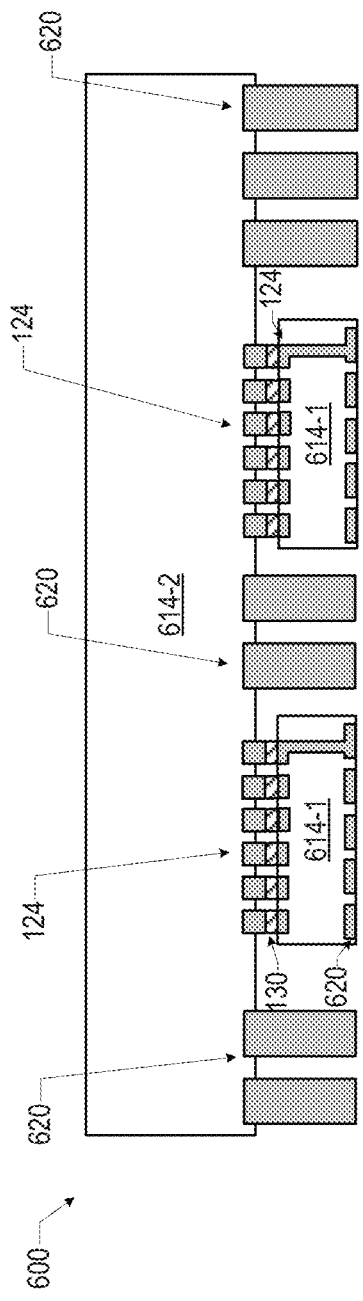

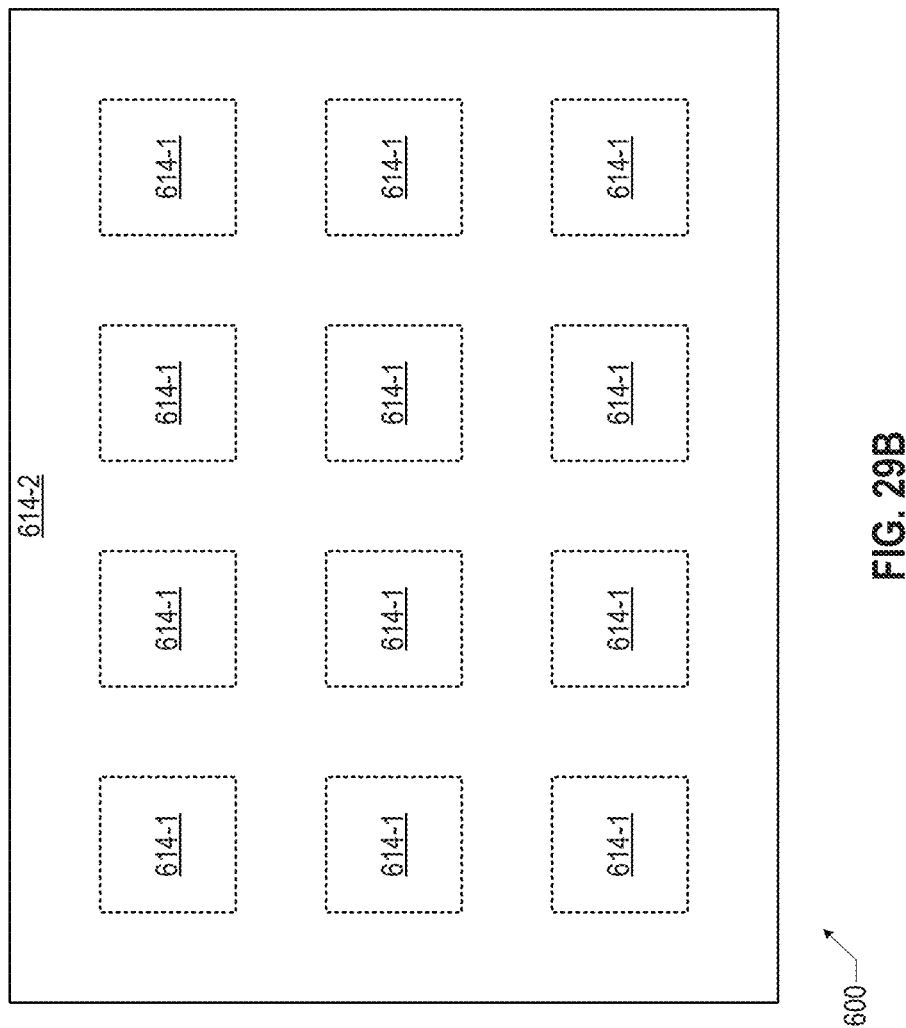

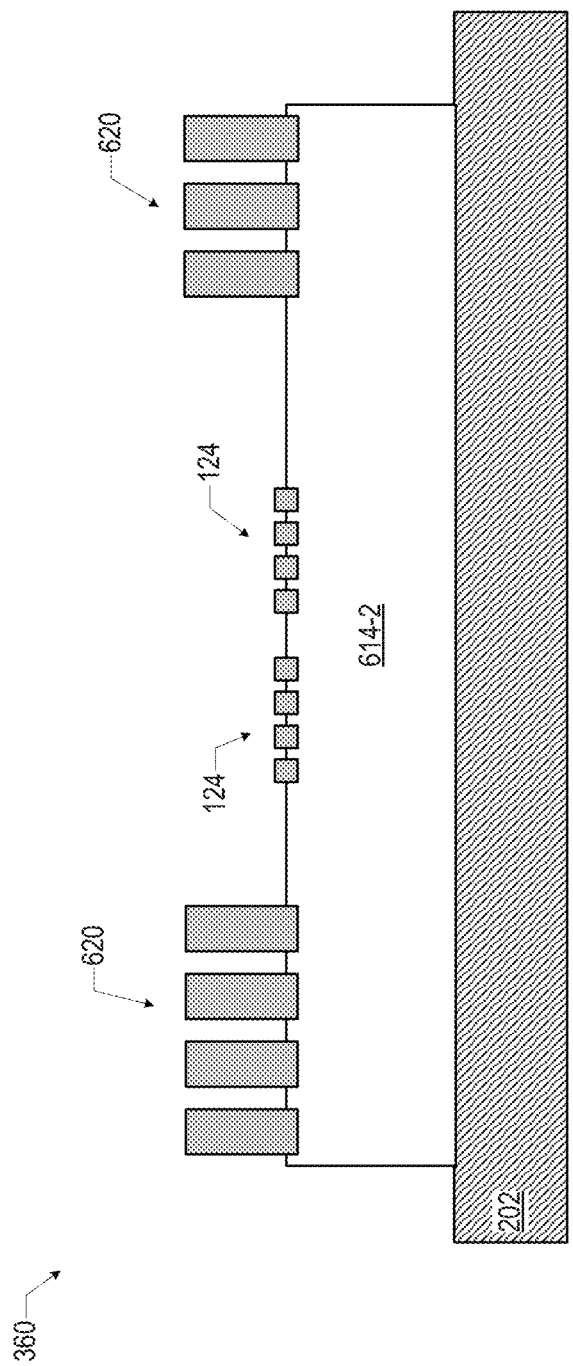

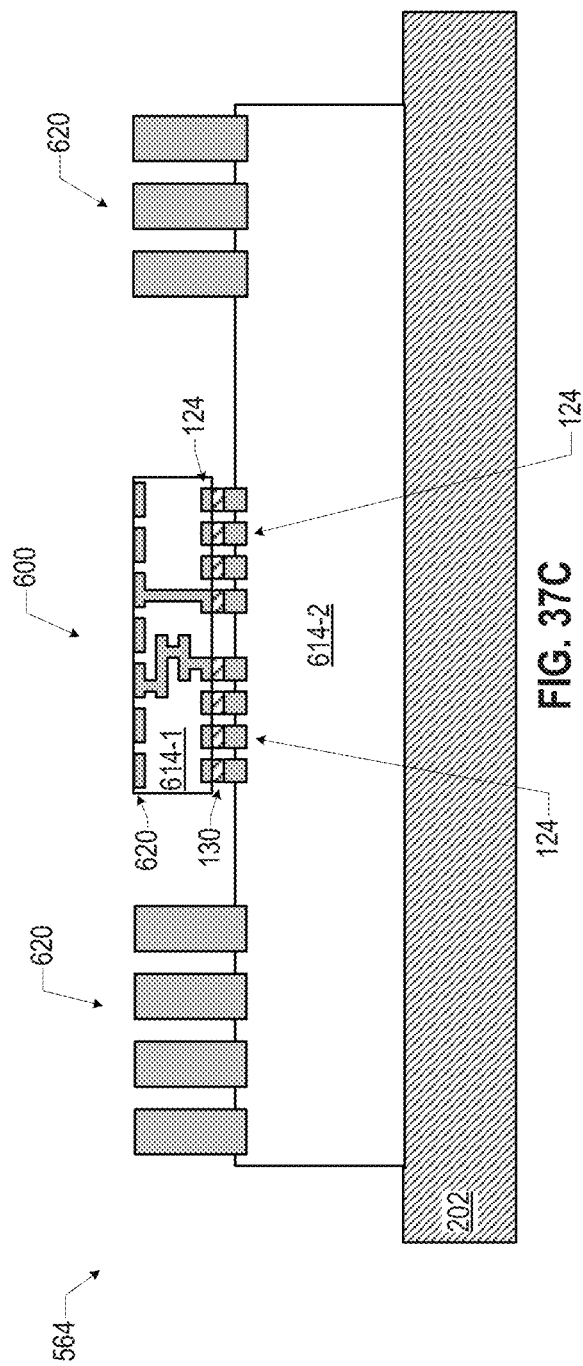

QUANTUM COMPUTING ASSEMBLIES

CROSS-REFERENCE TO RELATED APPLICATION

This application is a national stage application under 35 U.S.C. § 371 of PCT International Application Serial No. PCT/US2017/068910, filed on Dec. 29, 2017 and entitled "QUANTUM COMPUTING ASSEMBLIES," which is hereby incorporated by reference herein in its entirety.

BACKGROUND

Quantum computing refers to the field of research related to computation systems that use quantum mechanical phenomena to manipulate data. These quantum mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIGS. 12-16 are top views of example arrangements of multiple dies in a quantum computing assembly, in accordance with various embodiments.

FIGS. 17A-17F are side, cross-sectional views of various stages in an example process for manufacturing the quantum computing assembly of FIG. 5, in accordance with various embodiments.

FIGS. 25A-25F are side, cross-sectional views of various stages in an example process for manufacturing the quantum computing assembly of FIG. 22, in accordance with various embodiments.

FIGS. 28, 29A, 29B, and 30 are views of example composite dies, in accordance with various embodiments.

FIGS. 37A-37E are side, cross-sectional views of various stages in an example process for manufacturing the quantum computing assembly of FIG. 31, in accordance with various embodiments.

DETAILED DESCRIPTION

Figure 1:
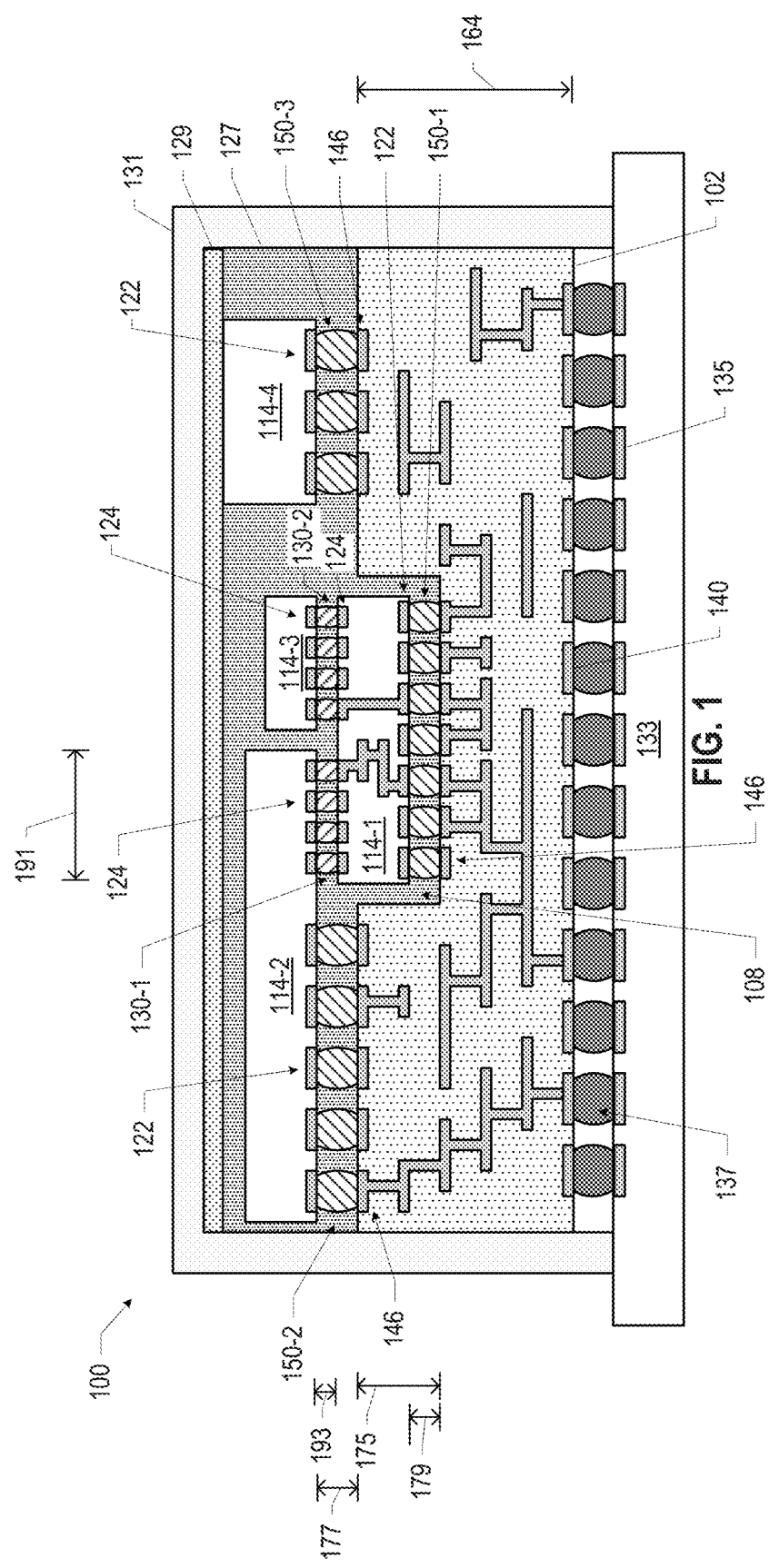
FIG. 1 is a side, cross-sectional view of an example quantum computing assembly, in accordance with various embodiments.

Quantum computing assemblies, and related devices and methods, are disclosed herein. For example, in some embodiments, a quantum computing assembly may include: a package substrate; a first die coupled to the package substrate; and a second die coupled to the second surface of the package substrate and coupled to the first die; wherein the first die or the second die includes quantum processing circuitry.

Communicating large numbers of signals between two or more dies in a multi-die electronics package is challenging due to the increasingly small size of such dies, thermal constraints, and power delivery constraints, among others. Conventional package technologies may not be adequate for quantum computing applications, which often involve extreme operational environments (e.g., vacuum, very low temperatures, etc.) and extra sensitivity to electrical losses (e.g., the losses caused by organic materials around interconnects in conventional packages). Further, as the number of qubits or other quantum computing circuitry in a die increases, the die size may increase, potentially resulting in greater mechanical stresses on the interface between the die and other components (e.g., between the die and a package substrate, or between the die and other dies).

Various ones of the embodiments disclosed herein may help achieve reliable attachment of multiple dies in a quantum computing assembly with lower losses (e.g., to achieve an adequate qubit coherence time) and/or greater mechanical and electrical reliability than conventional approaches. Various ones of the quantum computing assemblies disclosed herein may exhibit better power delivery and signal speed while reducing the size of the package relative to conventional approaches.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The terms "top" and "bottom" may be used herein to explain various features of the drawings, but these terms are simply for ease of discussion, and do not imply a desired or required orientation. As used herein, the term "insulating" means "electrically insulating," unless otherwise specified.

When used to describe a range of dimensions, the phrase "between X and Y" represents a range that includes X and Y. For convenience, the phrase "FIG. 17" may be used to refer to the collection of drawings of FIGS. 17A-17F, the phrase "FIG. 18" may be used to refer to the collection of drawings of FIGS. 18A-18B, etc. Although certain elements may be referred to in the singular herein, such elements may include multiple sub-elements. For example, "an insulating material" may include one or more insulating materials. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket, or portion of a conductive line or via).

FIG. 1 is a side, cross-sectional view of a quantum computing assembly 100, in accordance with various embodiments. A number of elements are illustrated in FIG. 1 as included in the quantum computing assembly 100, but a number of these elements may not be present in a quantum computing assembly 100. For example, in various embodiments, the heat spreader 131, the thermal interface material 129, the mold material 127, the die 114-3, the die 114-4, the second-level interconnects 137, and/or the circuit board 133 may not be included. Further, FIG. 1 illustrates a number of elements that are omitted from subsequent drawings for ease of illustration, but may be included in any of the quantum computing assemblies 100 disclosed herein. Examples of such elements include the heat spreader 131, the thermal interface material 129, the mold material 127, the second-level interconnects 137, and/or the circuit board 133. Many of the elements of the quantum computing assembly 100 of FIG. 1 are included in other ones of the accompanying figures; the discussion of these elements is not repeated when discussing these figures, and any of these elements may take any of the forms disclosed herein. In some embodiments, individual ones of the quantum computing assemblies 100 disclosed herein may serve as a system-in-package (SiP) in which multiple dies 114 having different functionality are included. In such embodiments, the quantum computing assembly 100 may be referred to as an SiP.

The dies 114 included in any of the quantum computing assemblies 100 disclosed herein may perform quantum processing operations, or may support quantum processing operations. For example, one or more of the dies 114 in a quantum computing assembly 100 may be a control die. A control die may include one or more non-quantum circuits for controlling the operation of one or more quantum processing (QP) dies (discussed below). In some embodiments, a control die may provide peripheral logic to support the operation of one or more QP dies. For example, a control die may control the performance of a read operation, control the performance of a write operation, control the clearing of quantum bits, etc. The control that the control die may exercise over the operation of a QP die may depend on the type of qubits implemented by the QP die. For example, if the QP die implements superconducting qubits (discussed below with reference to FIGS. 38-40), the control die may provide and/or detect appropriate electrical signals in any of the flux bias lines, microwave lines, and/or drive lines to initialize and manipulate the superconducting dots. In another example, if the QP die implements spin qubits (discussed below with reference to FIGS. 41-42), the control die may provide and/or detect appropriate electrical signals in any of the gates 706/708, the quantum well layer 752, the magnet lines 721, etc.

A control die may also perform conventional computing functions to supplement the computing functions that may be provided by one or more QP dies. For example, a control die may interface with one or more of the other components of a quantum computing device, such as the quantum computing device discussed below with reference to FIG. 51, in a conventional manner, and may serve as an interface between one or more QP dies and conventional components. In some embodiments, one or more control dies may be implemented in or may be used to implement the non-quantum processing device 2028 described below with reference to FIG. 51. In some embodiments, one or more control dies may include radio frequency (RF) devices, memory, amplifiers, power management devices, antennas, arrays, sensors, microelectromechanical systems (MEMS) devices, mixers, multiplexers, filters, analog-to-digital converters, digital-to-analog converters, and/or analog-to-digital converters, for example.

One or more of the dies 114 in a quantum computing assembly 100 may be a QP die. A QP die may include circuitry for performing quantum computations. For example, in some embodiments, a QP die may include some or all components of a superconducting qubit-type quantum device (examples of which are discussed in further detail below with reference to FIGS. 38-40) or a spin qubit-type quantum device (examples of which are discussed in further detail below with reference to FIGS. 41-42).

The quantum computing assembly 100 may include a package substrate 102 coupled to a die 114-1 by die-to-package substrate (DTPS) interconnects 150-1. In particular, the top surface of the package substrate 102 may include a set of conductive contacts 146, and the bottom surface of the die 114-1 may include a set of conductive contacts 122; the conductive contacts 122 at the bottom surface of the die 114-1 may be electrically and mechanically coupled to the conductive contacts 146 at the top surface of the package substrate 102 by the DTPS interconnects 150-1. In the embodiment of FIG. 1, the top surface of the package substrate 102 includes a recess 108 in which the die 114-1 is at least partially disposed; the conductive contacts 146 to which the die 114-1 is coupled are located at the bottom of the recess 108. In other embodiments, the die 114-1 may not be disposed in a recess (e.g., as discussed below with reference to FIGS. 9-11). Any of the conductive contacts disclosed herein (e.g., the conductive contacts 122, 124, 146, 140, and/or 135) may include bond pads, posts, or any other suitable conductive contact, for example.

The package substrate 102 may include an insulating material (e.g., a dielectric material formed in multiple layers, as known in the art) and one or more conductive pathways through the dielectric material (e.g., including conductive traces and/or conductive vias, as shown). In some embodiments, the insulating material of the package substrate 102 may be a dielectric material, such as an organic dielectric material, a fire-retardant grade 4 material (FR-4), bismaleimide triazine (BT) resin, polyimide materials, glass reinforced epoxy matrix materials, or low-k and ultra low-k dielectric (e.g., carbon-doped dielectrics, fluorine-doped dielectrics, porous dielectrics, and organic polymeric dielectrics). In particular, when the package substrate 102 is formed using standard printed circuit board (PCB) processes, the package substrate 102 may include FR-4, and the conductive pathways in the package substrate 102 may be formed by patterned sheets of copper separated by build-up layers of the FR-4. The conductive pathways in the package substrate 102 may be bordered by liner materials, such as adhesion liners and/or barrier liners, as suitable.

In some embodiments, one or more of the conductive pathways in the package substrate 102 may extend between a conductive contact 146 at the top surface of the package substrate 102 and a conductive contact 140 at the bottom surface of the package substrate 102. In some embodiments, one or more of the conductive pathways in the package substrate 102 may extend between a conductive contact 146 at the bottom of the recess 108 and a conductive contact 140 at the bottom surface of the package substrate 102. In some embodiments, one or more of the conductive pathways in the package substrate 102 may extend between different conductive contacts 146 at the top surface of the package substrate 102 (e.g., between a conductive contact 146 at the bottom of the recess 108 and a different conductive contact 146 at the top surface of the package substrate 102). In some embodiments, one or more of the conductive pathways in the package substrate 102 may extend between different conductive contacts 140 at the bottom surface of the package substrate 102.

In some embodiments, the package substrate 102 may have a core (not shown) formed of a stiff material to impart additional mechanical stiffness to the quantum computing assembly 100. This additional stiffness may aid in mitigating warpage of the quantum computing assembly 100 (e.g., when the quantum computing assembly 100 is subjected to extremely low temperatures). In some embodiments, this core may include ceramic or glass.

The dies 114 disclosed herein may include an insulating material (e.g., a dielectric material formed in multiple layers, as known in the art) and multiple conductive pathways formed through the insulating material. In some embodiments, the insulating material of a die 114 may include a dielectric material, such as silicon dioxide, silicon nitride, oxynitride, polyimide materials, glass reinforced epoxy matrix materials, or a low-k or ultra low-k dielectric (e.g., carbon-doped dielectrics, fluorine-doped dielectrics, porous dielectrics, organic polymeric dielectrics, photo-imageable dielectrics, and/or benzocyclobutene-based polymers). In some embodiments, the insulating material of a die 114 may include a semiconductor material, such as silicon, germanium, or a III-V material (e.g., gallium nitride), and one or more additional materials. For example, an insulating material may include silicon oxide or silicon nitride. The conductive pathways in a die 114 may include conductive traces and/or conductive vias, and may connect any of the conductive contacts in the die 114 in any suitable manner (e.g., connecting multiple conductive contacts on a same surface or on different surfaces of the die 114). The conductive pathways in the dies 114 may be bordered by liner materials, such as adhesion liners and/or barrier liners, as suitable.

In some embodiments, the die 114-1 may include conductive pathways to route power, ground, and/or signals to/from some of the other dies 114 included in the quantum computing assembly 100. For example, the die 114-1 may include through-substrate vias (TSVs, including a conductive material via, such as a metal via, isolated from the surrounding silicon or other semiconductor material by a barrier oxide) or other conductive pathways through which power, ground, and/or signals may be transmitted between the package substrate 102 and one or more dies 114 "on top" of the die 114-1 (e.g., in the embodiment of FIG. 1, the die 114-2 and/or the die 114-3). In some embodiments, the die 114-1 may include conductive pathways to route power, ground, and/or signals between different ones of the dies 114 "on top" of the die 114-1 (e.g., in the embodiment of FIG. 1, the die 114-2 and the die 114-3). In some embodiments, the die 114-1 may be the source and/or destination of signals communicated between the die 114-1 and other dies 114 included in the quantum computing assembly 100.

In some embodiments, the die 114-1 may not route power and/or ground to the die 114-2; instead, the die 114-2 may couple directly to power and/or ground lines in the package substrate 102. By allowing the die 114-2 to couple directly to power and/or ground lines in the package substrate 102, such power and/or ground lines need not be routed through the die 114-1, allowing the die 114-1 to be made smaller or to include more active circuitry or signal pathways.

In some embodiments, the die 114-1 may only include conductive pathways, and may not contain active or passive circuitry. In other embodiments, the die 114-1 may include active or passive circuitry (e.g., transistors, diodes, resistors, inductors, and capacitors, among others). In some embodiments, the die 114-1 may include one or more device layers including transistors (e.g., when the die 114-1 is a control die) or quantum processing devices (e.g., when the die 114-1 is a QP die). When the die 114-1 includes active circuitry, power and/or ground signals may be routed through the package substrate 102 and to the die 114-1 through the conductive contacts 122 on the bottom surface of the die 114-1.

Although FIG. 1 illustrates a specific number and arrangement of conductive pathways in the package of 102 and/or one or more of the dies 114, these are simply illustrative, and any suitable number and arrangement may be used. The conductive pathways disclosed herein (e.g., conductive traces and/or conductive vias) may be formed of any appropriate conductive material, such as copper, silver, nickel, gold, aluminum, or other metals or alloys, for example.

In some embodiments, the package substrate 102 may be a lower density medium and the die 114-1 may be a higher density medium. As used herein, the term "lower density" and "higher density" are relative terms indicating that the conductive pathways (e.g., including conductive lines and conductive vias) in a lower density medium are larger and/or have a greater pitch than the conductive pathways in a higher density medium. In some embodiments, a higher density medium may be manufactured using a modified semi-additive process or a semi-additive build-up process with advanced lithography (with small vertical interconnect features formed by advanced laser or lithography processes), while a lower density medium may be a PCB manufactured using a standard PCB process (e.g., a standard subtractive process using etch chemistry to remove areas of unwanted copper, and with coarse vertical interconnect features formed by a standard laser process).

Figure 2:
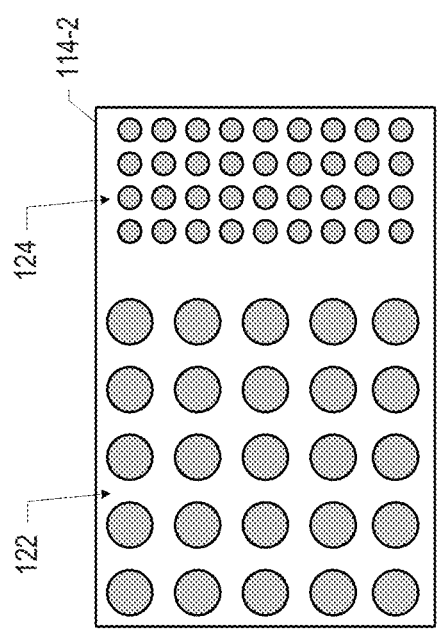
FIG. 2 is a bottom view of a die included in the quantum computing assembly of FIG. 1, in accordance with various embodiments.

The quantum computing assembly 100 of FIG. 1 may also include a die 114-2. The die 114-2 may be electrically and mechanically coupled to the package substrate 102 by DTPS interconnects 150-2, and may be electrically and mechanically coupled to the die 114-1 by die-to-die (DTD) interconnects 130-1. In particular, the top surface of the package substrate 102 may include a set of conductive contacts 146, and the bottom surface of the die 114-2 may include a set of conductive contacts 122; the conductive contacts 122 at the bottom surface of the die 114-1 may be electrically and mechanically coupled to the conductive contacts 146 at the top surface of the package substrate 102 by the DTPS interconnects 150-2. Further, the top surface of the die 114-1 may include a set of conductive contacts 124, and the bottom surface of the die 114-2 may include a set of conductive contacts 124; the conductive contacts 124 at the bottom surface of the die 114-2 may be electrically and mechanically coupled to some of the conductive contacts 124 at the top surface of the die 114-1 by the DTD interconnects 130-1. FIG. 2 is a bottom view of the die 114-2 of the quantum computing assembly 100 of FIG. 1, showing the "coarser" conductive contacts 122 and the "finer" conductive contacts 124. The die 114-2 of the quantum computing assembly 100 may thus be a single-sided die (in the sense that the die 114-2 only has conductive contacts 122/124 on a single surface), and may be a mixed-pitch die (in the sense that the die 114-2 has sets of conductive contacts 122/124 with different pitch). Although FIG. 2 illustrates the conductive contacts 122 and the conductive contacts 124 as each being arranged in a rectangular array, this need not be the case, and the conductive contacts 122 and 124 may be arranged in any suitable pattern (e.g., hexagonal, rectangular, different arrangements between the conductive contacts 122 and 124, etc.). A die 114 that has DTPS interconnects 150 and DTD interconnects 130 at the same surface may be referred to as a mixed pitch die 114; more generally, a die 114 that has interconnects 130 of different pitches at a same surface may be referred to as a mixed pitch die 114.

The die 114-2 may extend over the die 114-1 by an overlap distance 191. In some embodiments, the overlap distance 191 may be between 0.5 millimeters and 5 millimeters (e.g., between 0.75 millimeters and 2 millimeters, or approximately 1 millimeter).

The quantum computing assembly 100 of FIG. 1 may also include a die 114-3. The die 114-3 may be electrically and mechanically coupled to the die 114-1 by DTD interconnects 130-2. In particular, the bottom surface of the die 114-3 may include a set of conductive contacts 124 that are electrically and mechanically coupled to some of the conductive contacts 124 at the top surface of the die 114-1 by the DTD interconnects 130-2. In the embodiment of FIG. 1, the die 114-3 may be a single-sided, single-pitch die; in other embodiments, the die 114-3 may be a double-sided (or "multi-level," or "omni-directional") die, and additional components may be disposed on the top surface of the die 114-3.

As discussed above, in the embodiment of FIG. 1, the die 114-1 may provide high density interconnect routing in a localized area of the quantum computing assembly 100. In some embodiments, the presence of the die 114-1 may support direct chip attach of fine-pitch dies (e.g., the dies 114-2 and 114-3) that cannot be attached entirely directly to the package substrate 102. In particular, as discussed above, the die 114-1 may support trace widths and spacings that are not achievable in the package substrate 102. Various embodiments of the quantum computing assemblies 100 disclosed herein may be capable of supporting chips with high-density interconnects and chips with low-density interconnects without sacrificing performance or manufacturability.

The quantum computing assembly 100 of FIG. 1 may also include a die 114-4. The die 114-4 may be electrically and mechanically coupled to the package substrate 102 by DTPS interconnects 150-3. In particular, the bottom surface of the die 114-4 may include a set of conductive contacts 122 that are electrically and mechanically coupled to some of the conductive contacts 146 at the top surface of the package substrate 102 by the DTPS interconnects 150-3. In the embodiment of FIG. 1, the die 114-4 may be a single-sided, single-pitch die; in other embodiments, the die 114-4 may be a double-sided die, and additional components may be disposed on the top surface of the die 114-4. Additional passive components, such as surface-mount resistors, capacitors, and/or inductors, may be disposed on the top surface or the bottom surface of the package substrate 102, or embedded in the package substrate 102.

The quantum computing assembly 100 of FIG. 1 may also include a circuit board 133. The package substrate 102 may be coupled to the circuit board 133 by second-level interconnects 137 at the bottom surface of the package substrate 102. In particular, the package substrate 102 may include conductive contacts 140 at its bottom surface, and the circuit board 133 may include conductive contacts 135 at its top surface; the second-level interconnects 137 may electrically and mechanically couple the conductive contacts 135 and the conductive contacts 140. The second-level interconnects 137 illustrated in FIG. 1 are solder balls (e.g., for a ball grid array arrangement), but any suitable second-level interconnects 137 may be used (e.g., pins in a pin grid array arrangement or lands in a land grid array arrangement). The circuit board 133 may be a motherboard, for example, and may have other components attached to it (not shown). The circuit board 133 may include conductive pathways and other conductive contacts (not shown) for routing power, ground, and signals through the circuit board 133, as known in the art. In some embodiments, the second-level interconnects 137 may not couple the package substrate 102 to a circuit board 133, but may instead couple the package substrate 102 to another package, an interposer, or any other suitable component.

The quantum computing assembly 100 of FIG. 1 may also include a mold material 127. The mold material 127 may extend around one or more of the dies 114 on the package substrate 102. In some embodiments, the mold material 127 may extend above one or more of the dies 114 on the package substrate 102. The mold material 127 may be an insulating material, such as an appropriate epoxy material. The mold material 127 may be selected to have a coefficient of thermal expansion (CTE) that may mitigate or minimize the stress between the dies 114 and the package substrate 102 arising from uneven thermal expansion in the quantum computing assembly 100. In some embodiments, the CTE of the mold material 127 may have a value that is intermediate to the CTE of the package substrate 102 (e.g., the CTE of the dielectric material of the package substrate 102) and a CTE of the dies 114.

The quantum computing assembly 100 of FIG. 1 may also include a thermal interface material (TIM) 129. The TIM 129 may include a thermally conductive material (e.g., metal particles) in a polymer or other binder. The TIM 129 may be a thermal interface material paste or a thermally conductive epoxy (which may be a fluid when applied and may harden upon curing, as known in the art). The TIM 129 may provide a path for heat generated by the dies 114 to readily flow to the heat spreader 131, where it may be spread and/or dissipated. Some embodiments of the quantum computing assembly 100 of FIG. 1 may include a sputtered back side metallization (not shown) across the mold material 127 and the dies 114; the TIM 129 (e.g., a solder TIM) may be disposed on this back side metallization.

The quantum computing assembly 100 of FIG. 1 may also include a heat spreader 131. The heat spreader 131 may be used to move heat away from the dies 114 (e.g., so that the heat may be more readily dissipated by a heat sink or other thermal management device). The heat spreader 131 may include any suitable thermally conductive material (e.g., metal, appropriate ceramics, etc.), and may include any suitable features (e.g., fins). In some embodiments, the heat spreader 131 may be an integrated heat spreader.

In some embodiments, the heat spreader 131 may also provide mechanical stiffening to the quantum computing assembly 100. For example, the heat spreader 131 may include a frame-like portion that is disposed on the package substrate 102. In other embodiments, a frame or other stiffening structure that does not also act as a heat spreader 131 may be included in a quantum computing assembly 100.

In some embodiments, the heat spreader 131 may provide a hermetic seal around the dies 114 of the quantum computing assembly 100. For example, the heat spreader 131 may be secured to the package substrate 102, and the volume inside the heat spreader 131 may be put under vacuum or filled with a nonreactive gas (e.g., nitrogen) to mitigate the oxidation of the interconnects (e.g., the DTPS interconnects 150 and/or the DTD interconnects 130) and extend the lifetime of the quantum computing assembly 100. In other embodiments, a hermetic seal structure different from the heat spreader 131 may be included in a quantum computing assembly 100. In some embodiments, a structure may serve as both a stiffening structure and a hermetic seal structure. In some embodiments, a quantum computing assembly 100 may not include a hermetic seal structure; in some such embodiments, the components of the quantum computing assembly 100 may be cleaned before the quantum computing assembly 100 is inserted into a cryogenic refrigerator (e.g., as discussed below). In embodiments with or without a hermetic seal structure, the components of a quantum computing assembly 100 may be cleaned (e.g., with a liquid or plasma cleanse) prior to operation in order to remove any assembly residues (e.g., hydrocarbons) or oxide layers on solder junctions. Such cleaning may improve the quality factor of the DTD interconnects 130 and/or the DTPS interconnects 150.

The DTPS interconnects 150 disclosed herein may take any suitable form. In some embodiments, a set of DTPS interconnects 150 may include solder (e.g., solder bumps or balls that are subject to a thermal reflow to form the DTPS interconnects 150). DTPS interconnects 150 that include solder may include any appropriate solder material, such as a solder that includes a superconductor (e.g., an indium-based solder). Using a cryogenically compliant solder, like an indium-based solder, for the DTPS interconnects 150 may reduce the risk of mechanical failure (relative to non-cryogenically compliant solders) due to the differential thermal expansion of the package substrate 102 and the dies 114.

In some embodiments, a set of DTPS interconnects 150 may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects 130 disclosed herein may take any suitable form. The DTD interconnects 130 may have a finer pitch than the DTPS interconnects 150 in a quantum computing assembly. In some embodiments, the dies 114 on either side of a set of DTD interconnects 130 may be unpackaged dies, and/or the DTD interconnects 130 may include small conductive bumps or pillars (e.g., copper bumps or pillars) attached to the conductive contacts 124 by solder. The DTD interconnects 130 may have too fine a pitch to couple to the package substrate 102 directly (e.g., to fine to serve as DTPS interconnects 150). In some embodiments, a set of DTD interconnects 130 may include solder. DTD interconnects 130 that include solder may include any appropriate solder material, such as any of the materials discussed above. In some embodiments, a set of DTD interconnects 130 may include an anisotropic conductive material, such as any of the materials discussed above. In some embodiments, the DTD interconnects 130 may be used as data transfer lanes, while the DTPS interconnects 150 may be used for power and ground lines, among others.

In some embodiments, some or all of the DTD interconnects 130 in a quantum computing assembly 100 may be metal-to-metal interconnects (e.g., copper-to-copper interconnects, or plated interconnects). In such embodiments, the conductive contacts 124 on either side of the DTD interconnect 130 may be bonded together (e.g., under elevated pressure and/or temperature) without the use of intervening solder or an anisotropic conductive material. In some embodiments, one side of a DTD interconnect 130 may include a metal pillar (e.g., a copper pillar), and the other side of the DTD interconnect may include a metal contact (e.g., a copper contact) recessed in a dielectric. In some embodiments, a thin cap of solder may be used in a metal-to-metal interconnect to accommodate planarity, and this solder may become an intermetallic compound during processing. In some metal-to-metal interconnects that utilize hybrid bonding, a dielectric material (e.g., silicon oxide, silicon nitride, silicon carbide, or an organic layer) may be present between the metals bonded together (e.g., between copper pads or posts that provide the associated conductive contacts 124). In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, some or all of the electrically conductive elements in the quantum computing assemblies 100 disclosed herein may include superconducting materials. Example superconducting materials may include aluminum, niobium, tin, titanium, osmium, zinc, molybdenum, tantalum, vanadium, or composites of such materials (e.g., niobium titanium, niobium aluminum, or niobium tin).

In the quantum computing assemblies 100 disclosed herein, some or all of the DTPS interconnects 150 may have a larger pitch than some or all of the DTD interconnects 130. DTD interconnects 130 may have a smaller pitch than DTPS interconnects 150 due to the greater similarity of materials in the different dies 114 on either side of a set of DTD interconnects 130 than between the die 114 and the package substrate 102 on either side of a set of DTPS interconnects 150. In particular, the differences in the material composition of a die 114 and a package substrate 102 may result in differential expansion and contraction of the die 114 and the package substrate 102 due to heat generated during operation (as well as the heat applied during various manufacturing operations). To mitigate damage caused by this differential expansion and contraction (e.g., cracking, solder bridging, etc.), the DTPS interconnects 150 may be formed larger and farther apart than DTD interconnects 130, which may experience less thermal stress due to the greater material similarity of the pair of dies 114 on either side of the DTD interconnects. In some embodiments, the DTPS interconnects 150 disclosed herein may have a pitch between 70 microns and 1000 microns, while the DTD interconnects 130 disclosed herein may have a pitch between 3 microns and 100 microns (e.g., between 3 microns and 50 microns, or between 100 microns and 500 microns).

The elements of the quantum computing assembly 100 may have any suitable dimensions. Only a subset of the accompanying figures are labeled with reference numerals representing dimensions, but this is simply for clarity of illustration, and any of the quantum computing assemblies 100 disclosed herein may have components having the dimensions discussed herein. For example, in some embodiments, the thickness 164 of the package substrate 102 may be between 0.1 millimeters and 1.4 millimeters (e.g., between 0.1 millimeters and 0.35 millimeters, between 0.25 millimeters and 0.8 millimeters, or approximately 1 millimeter). In some embodiments, the recess 108 may have a depth 175 between 10 microns and 200 microns (e.g., between 10 microns and 30 microns, between 30 microns and 100 microns, between 60 microns and 80 microns, or approximately 75 microns). In some embodiments, the depth 175 may be equal to a certain number of layers of the dielectric material in the package substrate 102. For example, the depth 175 may be approximately equal to between one and five layers of the dielectric material in the package substrate 102 (e.g., two or three layers of the dielectric material). In some embodiments, the depth 175 may be equal to the thickness of a solder resist material (not shown) on the top surface of the package substrate 102.

In some embodiments, the distance 179 between the bottom surface of the die 114-1 and the proximate top surface of the package substrate 102 (at the bottom of the recess 108) may be less than the distance 177 between the bottom surface of the die 114-2 and the proximate top surface of the package substrate 102. In some embodiments, the distance 179 may be approximately the same as the distance 177. In some embodiments, the distance 177 between the bottom surface of the die 114-2 and the proximate top surface of the package substrate 102 may be greater than the distance 193 between the bottom surface of the die 114-2 and the proximate top surface of the die 114-1. In other embodiments, the distance 177 may be less than or equal to the distance 193. In some embodiments, the distance 179 may be between 100 microns and 400 microns. In some embodiments, the distance 177 may be between 100 microns and 400 microns. In some embodiments, the distance 193 may be between 20 microns and 100 microns.

Figure 3:
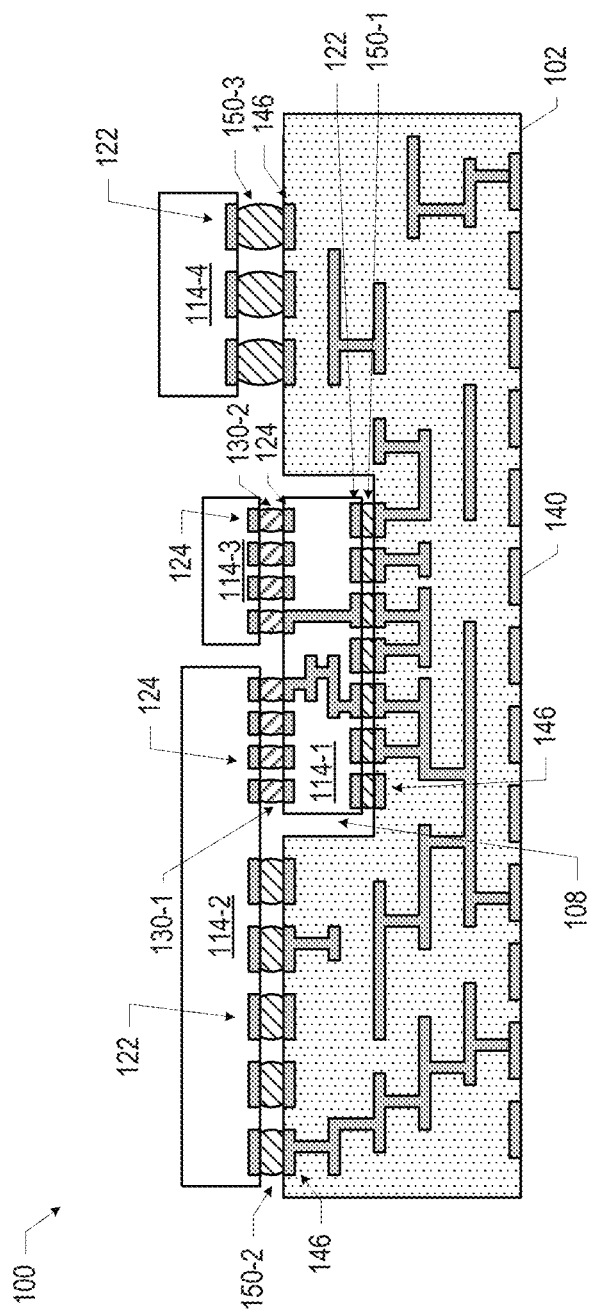
FIGS. 3-11 are side, cross-sectional views of example quantum computing assemblies, in accordance with various embodiments.

In some embodiments, the top surface of the die 114-1 may extend higher than the top surface of the package substrate 102, as illustrated in FIG. 1. In other embodiments, the top surface of the die 114-1 may be substantially coplanar with the top surface of the package substrate 102, or may be recessed below the top surface of the package substrate 102. FIG. 3 illustrates an example of the former embodiment. Although various ones of the figures illustrate quantum computing assemblies 100 having a single recess 108 in the package substrate 102, the thickness of 102 may include multiple recesses 108 (e.g., having the same or different dimensions, and each having a die 114 disposed therein), or no recesses 108. Examples of the former embodiments are discussed below with reference to FIGS. 7-8, and examples of the latter embodiments are discussed below with reference to FIGS. 9-11. In some embodiments, a recess 108 may be located at the bottom surface of the package substrate 102 (e.g., proximate to the conductive contacts 140), instead of or in addition to a recess 108 at the top surface of the package substrate 102.

Figure 4:
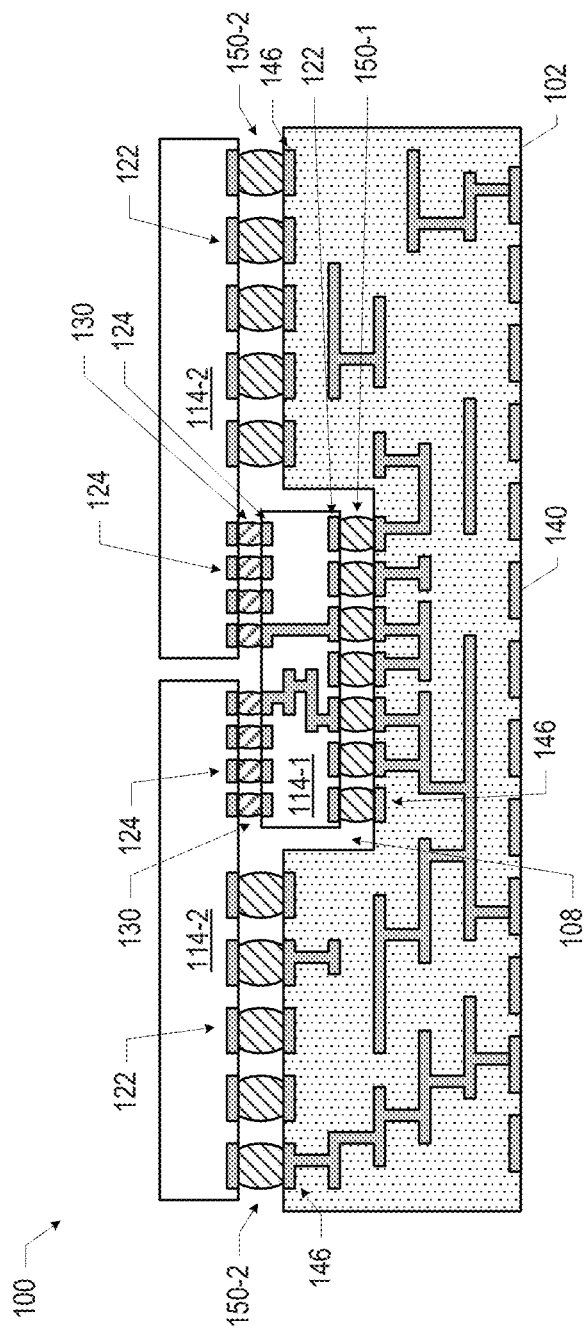

In the embodiment of FIG. 1, a single die 114-2 is illustrated as "spanning" the package substrate 102 and the die 114-1. In some embodiments of the quantum computing assemblies 100 disclosed herein, multiple dies 114 may span the package substrate 102 and another die 114. For example, FIG. 4 illustrates an embodiment in which two dies 114-2 each have conductive contacts 122 and conductive contacts 124 disposed at the bottom surfaces; the conductive contacts 122 of the dies 114-2 are coupled to conductive contacts 146 at the top surface of the package substrate 102 via DTPS interconnects 150-2, and the conductive contacts 124 of the dies 114-2 are coupled to conductive contacts 124 at the top surface of the die 114 via DTD interconnects 130. In some embodiments, power and/or ground signals may be provided directly to the dies 114 of the quantum computing assembly 100 of FIG. 4 through the package substrate 102, and the die 114-1 may, among other things, route signals between the dies 114-2.

Figure 5:
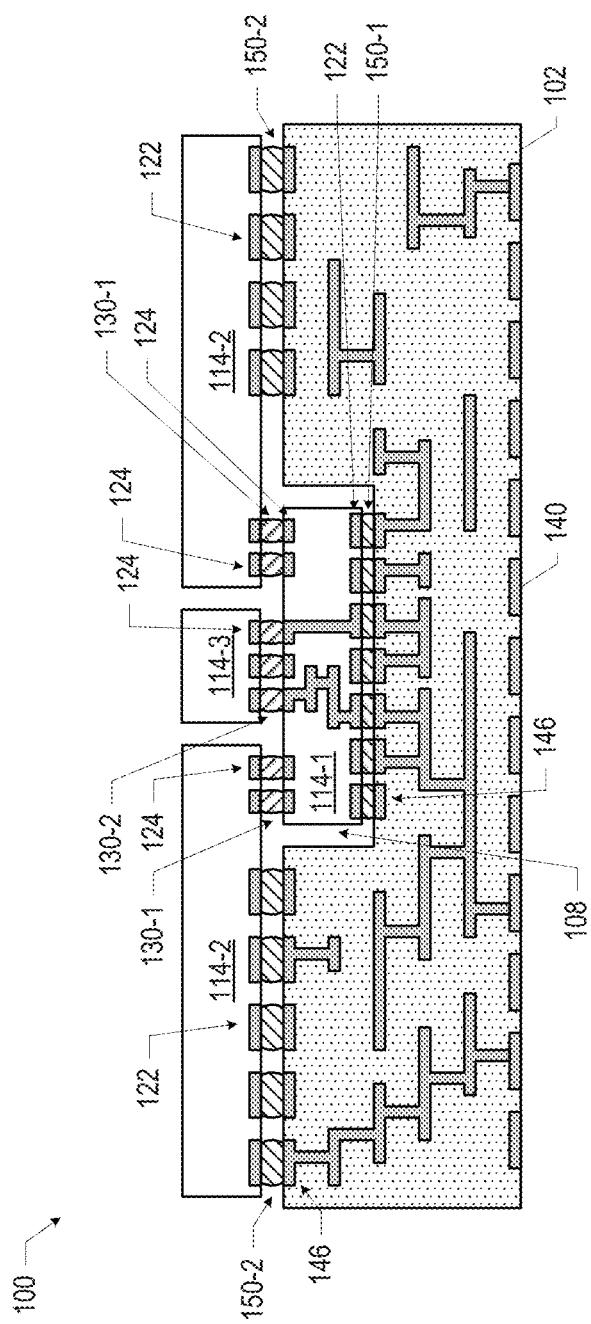

In some embodiments, the die 114-1 may be arranged as a bridge between multiple other dies 114, and may also have additional dies 114 disposed thereon. For example, FIG. 5 illustrates an embodiment in which two dies 114-2 each have conductive contacts 122 and conductive contacts 124 disposed at the bottom surfaces; the conductive contacts 122 of the dies 114-2 are coupled to conductive contacts 146 at the top surface of the package substrate 102 via DTPS interconnects 150-2, and the conductive contacts 124 of the dies 114-2 are coupled to conductive contacts 124 at the top surface of the die 114 via DTD interconnects 130 (e.g., as discussed above with reference to FIG. 4). Additionally, a die 114-3 (or multiple dies 114-3, not shown) is coupled to the die 114-1 by conductive contacts 124 on proximate surfaces of these dies 114 and intervening DTD interconnects 130-2 (e.g., as discussed above with reference to FIG. 1).

Figure 6:
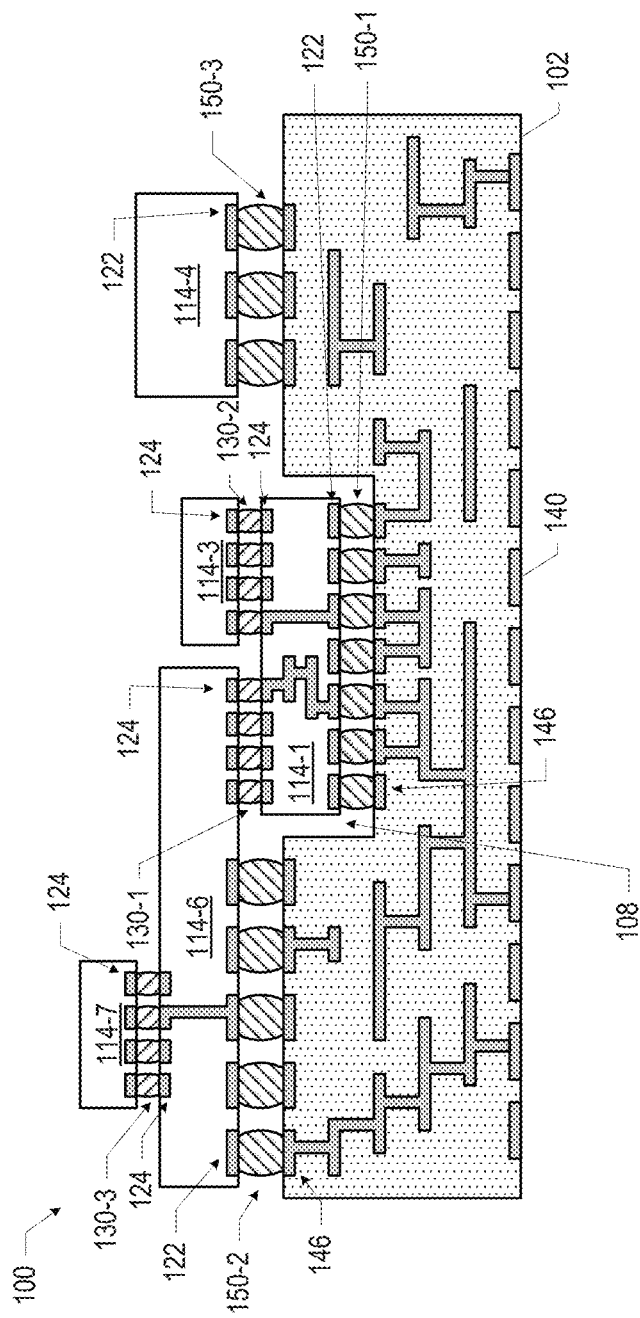

As noted above, any suitable number of the dies 114 in a quantum computing assembly 100 may be double-sided dies 114. For example, FIG. 6 illustrates a quantum computing assembly 100 sharing a number of elements with FIG. 1, but including a double-sided die 114-6. The die 114-6 includes conductive contacts 122 and 124 at its bottom surface; the conductive contacts 122 at the bottom surface of the die 114-6 are coupled to conductive contacts 146 at the top surface of the package substrate 102 via DTPS interconnects 150-2, and the conductive contacts 124 at the bottom surface of the die 114-6 are coupled to conductive contacts 124 at the top surface of the die 114-1 via DTD interconnects 130-1. The die 114-6 also includes conductive contacts 124 at its top surface; these conductive contacts 124 are coupled to conductive contacts 124 at the bottom surface of a die 114-7 by DTD interconnects 130-3.

Figure 7:
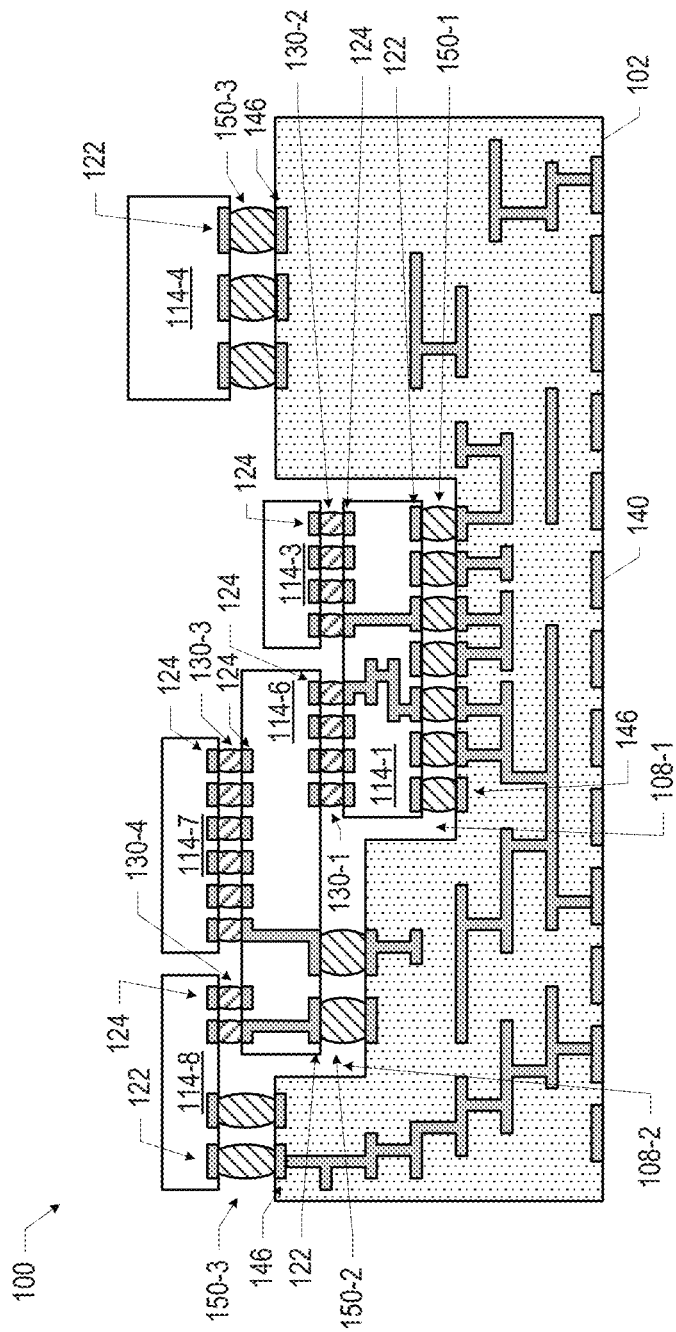

As noted above, a package substrate 102 may include one or more recesses 108 in which dies 114 are at least partially disposed. For example, FIG. 7 illustrates a quantum computing assembly 100 including a package substrate 102 having two recesses: a recess 108-1 and a recess 108-2. In the embodiment of FIG. 7, the recess 108-1 is nested in the recess 108-2, but in other embodiments, multiple recesses 108 need not be nested. In FIG. 7, the die 114-1 is at least partially disposed in the recess 108-1, and the dies 114-6 and 114-3 are at least partially disposed in the recess 108-2. In the embodiment of FIG. 7, like the embodiment of FIG. 6, the die 114-6 includes conductive contacts 122 and 124 at its bottom surface; the conductive contacts 122 at the bottom surface of the die 114-6 are coupled to conductive contacts 146 at the top surface of the package substrate 102 via DTPS interconnects 150-2, and the conductive contacts 124 at the bottom surface of the die 114-6 are coupled to conductive contacts 124 at the top surface of the die 114-1 via DTD interconnects 130-1. The die 114-6 also includes conductive contacts 124 at its top surface; these conductive contacts 124 are coupled to conductive contacts 124 at the bottom surface of a die 114-7 by DTD interconnects 130-3. Further, the quantum computing assembly 100 of FIG. 7 includes a die 114-8 that spans the package substrate 102 and the die 114-6. In particular, the die 114-8 includes conductive contacts 122 and 124 at its bottom surface; the conductive contacts 122 at the bottom surface of the die 114-8 are coupled to conductive contacts 146 at the top surface of the package substrate 102 via DTPS interconnects 150-3, and the conductive contacts 124 at the bottom surface of the die 114-8 are coupled to conductive contacts 124 at the top surface of the die 114-6 via DTD interconnects 130-4.

Figure 8:
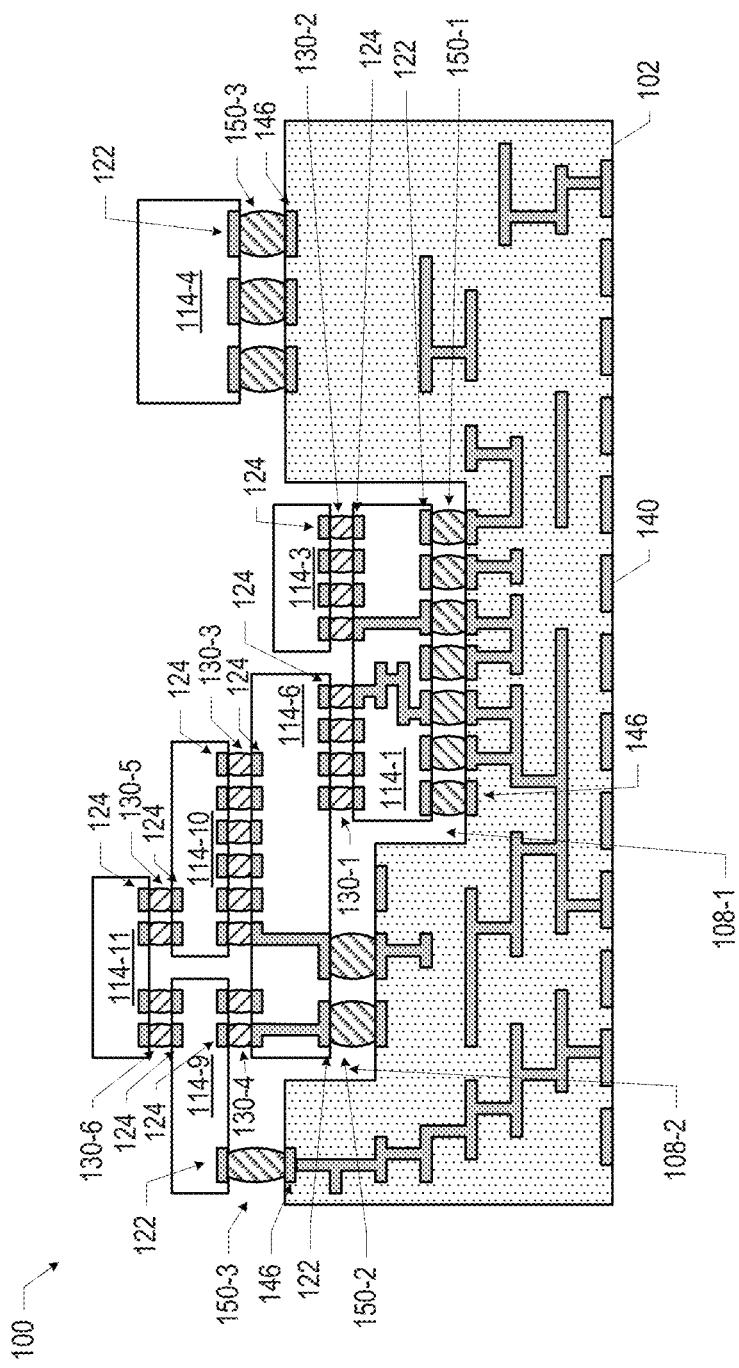

In various ones of the quantum computing assemblies 100 disclosed herein, a single die 114 may bridge to other dies 114 from "below" (e.g., as discussed above with reference to FIGS. 4 and 5) or from "above." For example, FIG. 8 illustrates a quantum computing assembly 100 similar to the quantum computing assembly 100 of FIG. 7, but including two double-sided dies 114-9 and 114-10, as well as an additional die 114-11. The die 114-9 includes conductive contacts 122 and 124 at its bottom surface; the conductive contacts 122 at the bottom surface of the die 114-9 are coupled to conductive contacts 146 at the top surface of the package substrate 102 via DTPS interconnects 150-3, and the conductive contacts 124 at the bottom surface of the die 114-9 are coupled to conductive contacts 124 at the top surface of the die 114-6 via DTD interconnects 130-4. The die 114-6 includes conductive contacts 124 at its top surface; these conductive contacts 124 are coupled to conductive contacts 124 at the bottom surface of a die 114-10 by DTD interconnects 130-3. Further, the die 114-11 includes conductive contacts 124 at its bottom surface; some of these conductive contacts 124 are coupled to conductive contacts 124 at the top surface of the die 114-9 by DTD interconnects 130-6, and some of these conductive contacts 124 are coupled to conductive contacts 124 at the top surface of the die 114-10 by DTD interconnects 130-5. The die 114-11 may thus bridge the dies 114-9 and 114-10.

Figure 9:
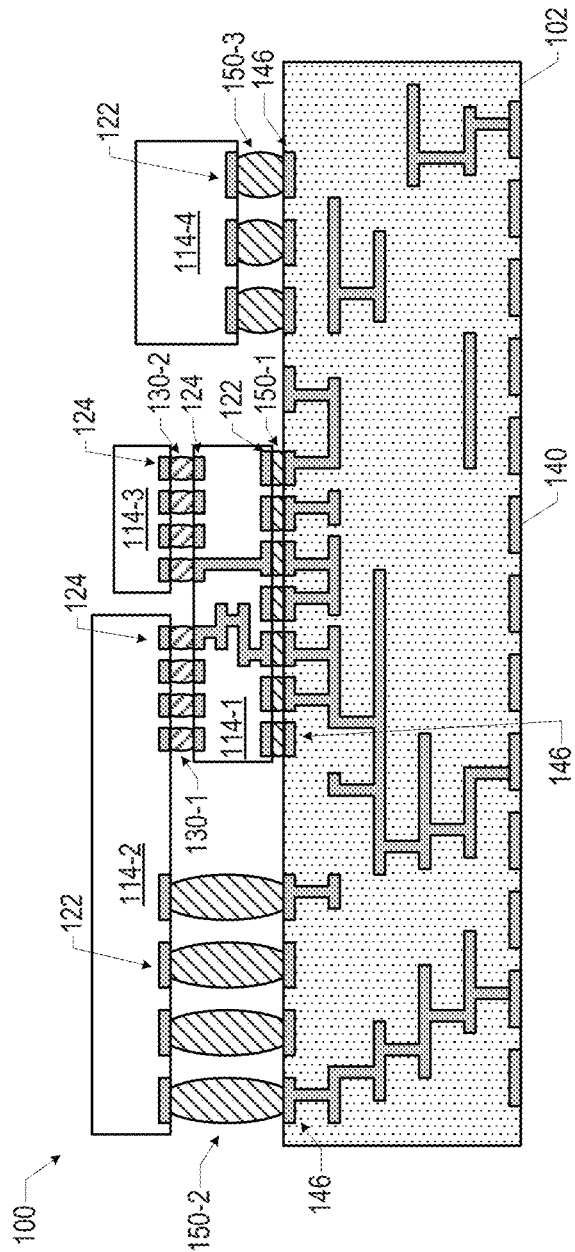
Figure 10:
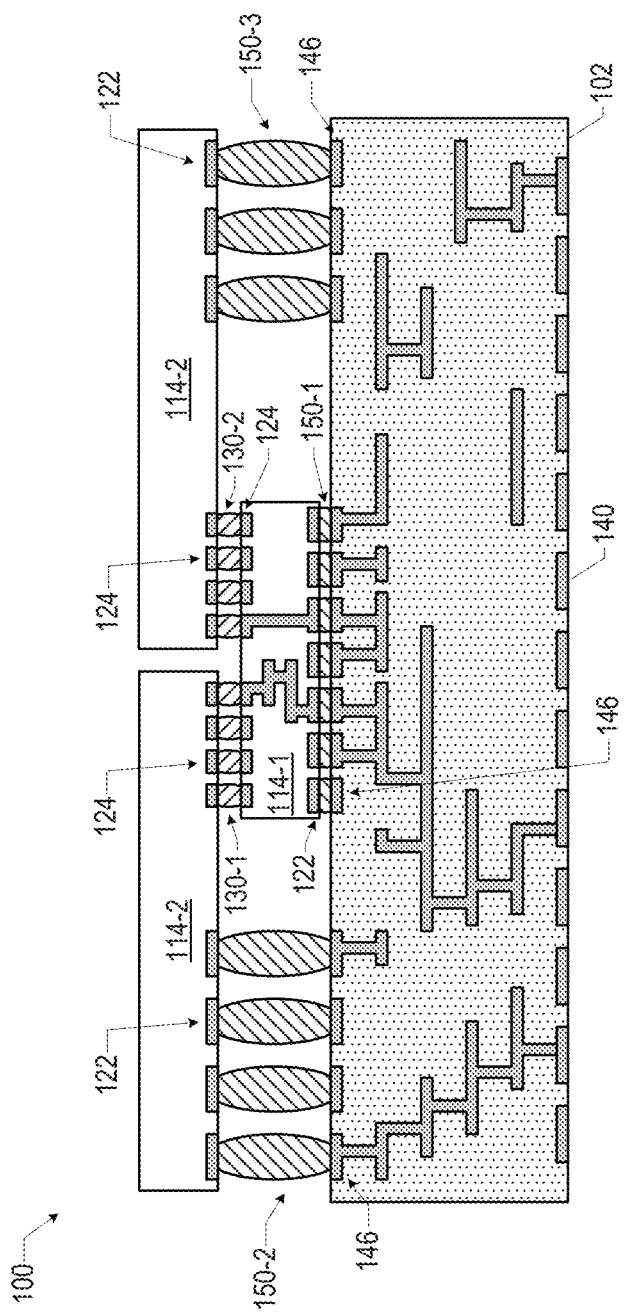

As noted above, in some embodiments, the package substrate 102 may not include any recesses 108. For example, FIG. 9 illustrates an embodiment having dies 114 and a package substrate 102 mutually interconnected in the manner discussed above with reference to FIG. 1, but in which the die 114-1 is not disposed in a recess in the package substrate 102. Instead, the dies 114 are disposed above a planar portion of the top surface of the package substrate 102. Any suitable ones of the embodiments disclosed herein that include recesses 108 may have counterpart embodiments that do not include a recess 108. For example, FIG. 10 illustrates a quantum computing assembly 100 having dies 114 and a package substrate 102 mutually interconnected in the manner discussed above with reference to FIG. 4, but in which the die 114-1 is not disposed in a recess in the package substrate 102.

Figure 11:
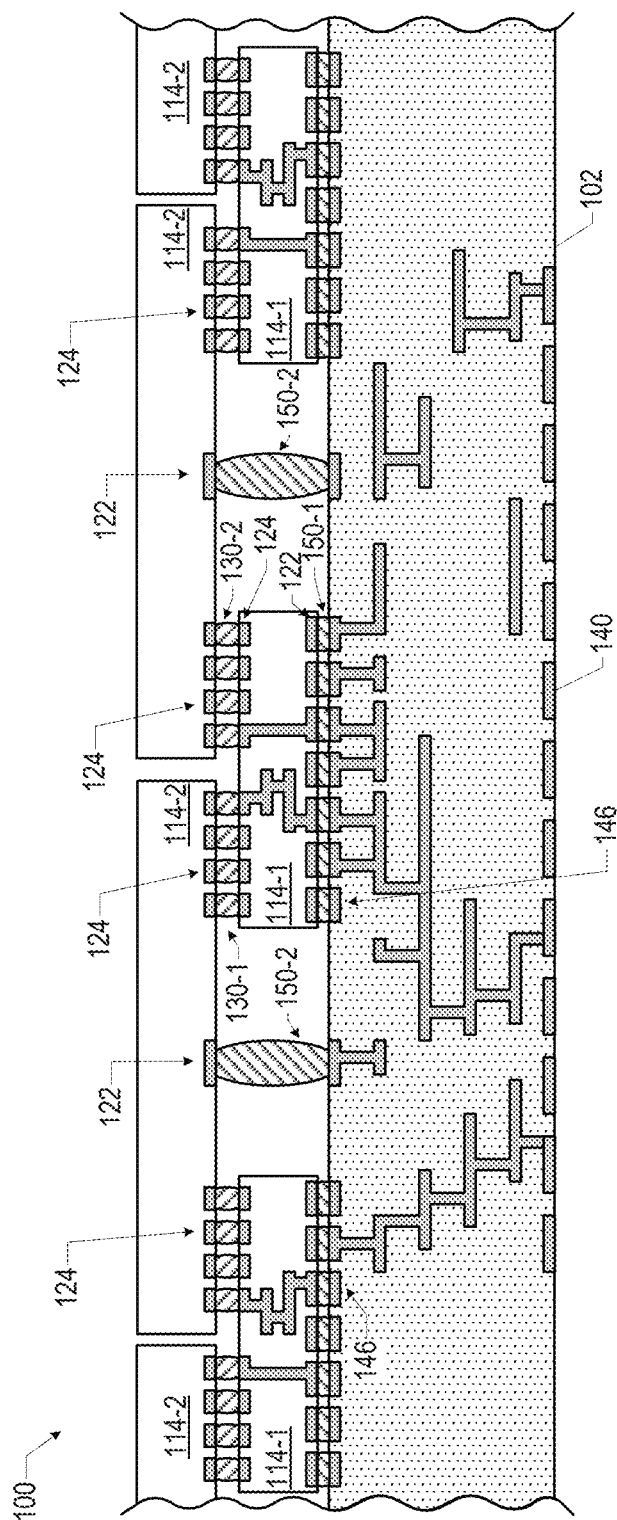

Any of the arrangements of dies 114 illustrated in any of the accompanying figures may be part of a repeating pattern in a quantum computing assembly 100. For example, FIG. 11 illustrates a portion of a quantum computing assembly 100 in which an arrangement like the one of FIG. 10 is repeated, with multiple dies 114-1 and multiple dies 114-2. The dies 114-1 may bridge the adjacent dies 114-2. More generally, the quantum computing assemblies 100 disclosed herein may include any suitable arrangement of dies 114. FIGS. 12-16 are top views of example arrangements of multiple dies 114 in various quantum computing assemblies 100, in accordance with various embodiments. The package substrate 102 is omitted from FIGS. 12-16; some or all of the dies 114 in these arrangements may be at least partially disposed in a recess 108 in a package substrate 102, or may not be disposed in a recess of a package substrate 102. In the arrangements of FIGS. 12-16, the different dies 114 may include any suitable circuitry (e.g., control or QP circuitry). The arrays of FIGS. 12-16 are largely rectangular, but dies 114 may be positioned in any suitable arrangement (e.g., a non-rectangular array, such as a triangular array, a hexagonal array, etc.). Further, although dies 114 having rectangular footprints are illustrated herein, the dies 114 may have any desired footprints (e.g., triangular, hexagonal, etc.), and such dies 114 may be arranged in any desired array (e.g., triangular, hexagonal, etc.).

FIG. 12 illustrates an arrangement in which a die 114A is disposed below multiple different dies 114B. The die 114A may be connected to a package substrate 102 (not shown) in any of the manners disclosed herein with reference to the die 114-1, while the dies 114B may span the package substrate 102 and the die 114A (e.g., in any of the manners disclosed herein with reference to the die 114-2). FIG. 12 also illustrates a die 114C disposed on the die 114A (e.g., in the manner disclosed herein with reference to the die 114-3). In FIG. 12, the dies 114B "overlap" the edges and/or the corners of the die 114A, while the die 114C is wholly above the die 114A. Placing dies 114B at least partially over the corners of the die 114A may reduce routing congestion in the die 114A and may improve utilization of the die 114A (e.g., in case the number of input/outputs needed between the die 114A and the dies 114B is not large enough to require the full edge of the die 114A). In some embodiments, the die 114A may be disposed in a recess 108 in a package substrate 102. In some embodiments, the die 114A may be disposed in a recess 108 in a package substrate 102, and the dies 114B may be disposed in one or more recesses 108 in the package substrate 102. In some embodiments, none of the dies 114A or 114B may be disposed in recesses 108.

FIG. 13 illustrates an arrangement in which a die 114A is disposed below multiple different dies 114B. The die 114A may be connected to a package substrate 102 (not shown) in any of the manners disclosed herein with reference to the die 114-1, while the dies 114B may span the package substrate 102 and the die 114A (e.g., in any of the manners disclosed herein with reference to the die 114-2). FIG. 13 also illustrates dies 114C disposed on the die 114A (e.g., in the manner disclosed herein with reference to the die 114-3). In FIG. 13, the dies 114B "overlap" the edges of the die 114A, while the dies 114C are wholly above the die 114A. In some embodiments, the die 114A may be disposed in a recess 108 in a package substrate 102. In some embodiments, the die 114A may be disposed in a recess 108 in a package substrate 102, and the dies 114B may be disposed in one or more recesses 108 in the package substrate 102. In some embodiments, none of the dies 114A or 114B may be disposed in recesses 108. In the embodiment of FIG. 13, the dies 114B and 114C may be arranged in a portion of a rectangular array. In some embodiments, two dies 114A may take the place of the single die 114A illustrated in FIG. 13, and one or more dies 114C may "bridge" the two dies 114A (e.g., in the manner discussed below with reference to FIG. 15).

FIG. 14 illustrates an arrangement in which a die 114A is disposed below multiple different dies 114B. The die 114A may be connected to a package substrate 102 (not shown) in any of the manners disclosed herein with reference to the die 114-1, while the dies 114B may span the package substrate 102 and the die 114A (e.g., in any of the manners disclosed herein with reference to the die 114-2). In FIG. 14, the dies 114B "overlap" the edges and/or the corners of the die 114A. In some embodiments, the die 114A may be disposed in a recess 108 in a package substrate 102. In some embodiments, the die 114A may be disposed in a recess 108 in a package substrate 102, and the dies 114B may be disposed in one or more recesses 108 in the package substrate 102. In some embodiments, none of the dies 114A or 114B may be disposed in recesses 108. In the embodiment of FIG. 14, the dies 114B may be arranged in a portion of a rectangular array.

FIG. 15 illustrates an arrangement in which multiple dies 114A are disposed below multiple different dies 114B such that each die 114A bridges two or more horizontally or vertically adjacent dies 114B. The dies 114A may be connected to a package substrate 102 (not shown) in any of the manners disclosed herein with reference to the die 114-1, while the dies 114B may span the package substrate 102 and the die 114A (e.g., in any of the manners disclosed herein with reference to the die 114-2). In FIG. 12, the dies 114B "overlap" the edges of the adjacent dies 114A. In some embodiments, the dies 114A may be disposed in one or more recesses 108 in a package substrate 102. In some embodiments, the dies 114A may be disposed in one or more recesses 108 in a package substrate 102, and the dies 114B may be disposed in one or more recesses 108 in the package substrate 102. In some embodiments, none of the dies 114A or 114B may be disposed in recesses 108. In FIG. 15, the dies 114A and the dies 114B may be arranged in rectangular arrays.

FIG. 16 illustrates an arrangement in which multiple dies 114A are disposed below multiple different dies 114B such that each die 114A bridges the four diagonally adjacent dies 114B. The dies 114A may be connected to a package substrate 102 (not shown) in any of the manners disclosed herein with reference to the die 114-1, while the dies 114B may span the package substrate 102 and the die 114A (e.g., in any of the manners disclosed herein with reference to the die 114-2). In FIG. 12, the dies 114B "overlap" the corners of the adjacent dies 114A. In some embodiments, the dies 114A may be disposed in one or more recesses 108 in a package substrate 102. In some embodiments, the dies 114A may be disposed in one or more recesses 108 in a package substrate 102, and the dies 114B may be disposed in one or more recesses 108 in the package substrate 102. In some embodiments, none of the dies 114A or 114B may be disposed in recesses 108. In FIG. 16, the dies 114A and the dies 114B may be arranged in rectangular arrays.

Although FIGS. 12-16 were described above as "top" views of example arrangements of multiple dies 114 in various quantum computing assemblies 100, the arrangements of FIGS. 12-16 may also represent "bottom" views (i.e., arrangements in which the dies 114B are at least partially between the dies 114A and the package substrate 102, and the dies 114C are between the dies 114A and the package substrate 102). In this "flipped" orientation, some or all of the dies 114 in FIGS. 12-16 may be at least partially disposed in a recess 108 in a package substrate 102, or may not be disposed in a recess of a package substrate 102, and the different dies 114 may include any suitable circuitry (e.g., control or QP circuitry).

Any suitable techniques may be used to manufacture the quantum computing assemblies disclosed herein. For example, FIGS. 17A-17F are side, cross-sectional views of various stages in an example process for manufacturing the quantum computing assembly 100 of FIG. 5, in accordance with various embodiments. Although the operations discussed below with reference to FIGS. 17A-17F (and others of the accompanying drawings representing manufacturing processes) are illustrated in a particular order, these operations may be performed in any suitable order. Additionally, although particular assemblies are illustrated in FIGS. 17A-17F (and others of the accompanying drawings representing manufacturing processes), the operations discussed below with reference to FIGS. 17A-17F may be used to form any suitable assemblies. In some embodiments, quantum computing assemblies 100 manufactured in accordance with the process of FIGS. 17A-17F (e.g., any of the quantum computing assemblies 100 of FIGS. 1-11) may have DTPS interconnects 150-1 that are solder interconnects, and DTD interconnects 130-1 and 130-2 that are non-solder interconnects (e.g., metal-to-metal interconnects or anisotropic conductive material interconnects). In the embodiment of FIGS. 17A-17F, the dies 114 may first be assembled into a "composite die," and then the composite die may be coupled to the package substrate 102. This approach may allow for tighter tolerances in the formation of the DTD interconnects 130, and may be particularly desirable for relatively small dies 114.

Figure 17A:
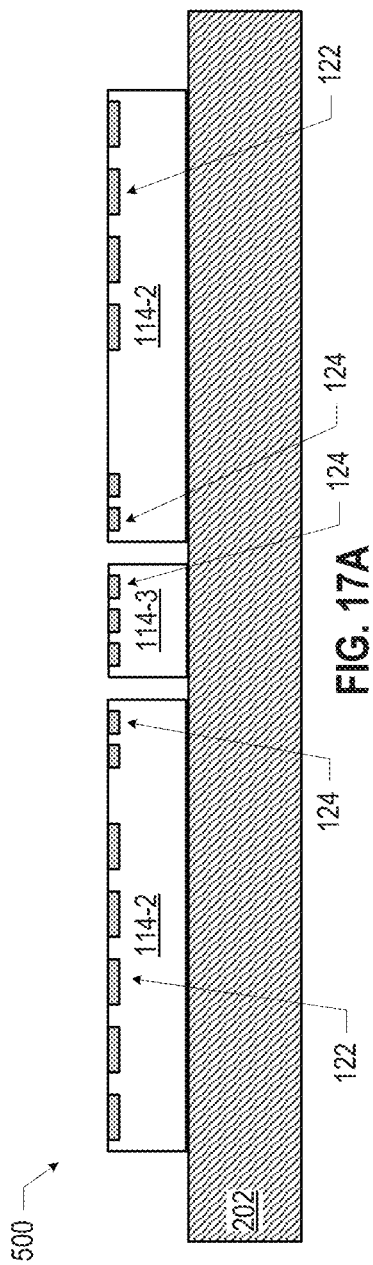

FIG. 17A illustrates an assembly 500 including a carrier 202 on which the dies 114-2 and 114-3 are disposed. The dies 114-2 and 114-3 are "upside down" on the carrier 202, in the sense that the conductive contacts 122 and 124 of the dies 114 are facing away from the carrier 202, and the conductive contacts 124 of the die 114-3 are facing away from the carrier 202. The dies 114-2 and 114-3 may be secured to the carrier using any suitable technique, such as a removable adhesive. The carrier 202 may include any suitable material for providing mechanical stability during subsequent manufacturing operations (e.g., silicon, glass, ceramic, materials having a CTE similar to the dies 114 on the carrier 202, etc.).

FIG. 17B illustrates an assembly 502 subsequent to coupling the die 114-1 to the dies 114-2 and 114-3. In particular, the die 114-1 may be arranged "upside down" in the assembly 502 such that the conductive contacts 124 of the die 114-1 may be coupled to the conductive contacts 124 of the dies 114-2 (via DTD interconnects 130-1) and to the conductive contacts 124 of the die 114-3 (via DTD interconnects 130-2). Any suitable technique may be used to form the DTD interconnects 130 of the assembly 502, such as metal-to-metal attachment techniques, solder techniques, or anisotropic conductive material techniques.

Figure 17C:
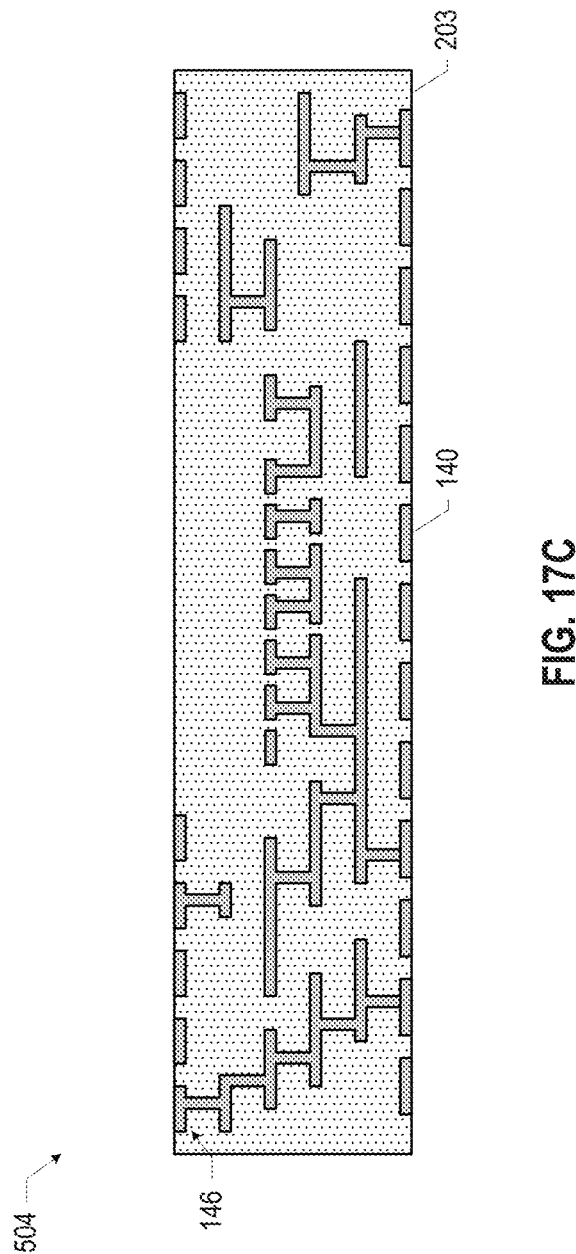

FIG. 17C illustrates an assembly 504 including a package substrate 203. The package substrate 203 may be structurally similar to the package substrate 102 of FIG. 5, but may not include the recess 108 of the package substrate 102. In some embodiments, the package substrate 203 may be manufactured using standard PCB manufacturing processes, and thus the package substrate 203 may take the form of a PCB, as discussed above. In some embodiments, the package substrate 203 may be a set of redistribution layers formed on a panel carrier (not shown) by laminating or spinning on a dielectric material, and creating conductive vias and lines by laser drilling and plating. Any method known in the art for fabrication of the package substrate 203 may be used, and for the sake of brevity, such methods will not be discussed in further detail herein.

Figure 17D:
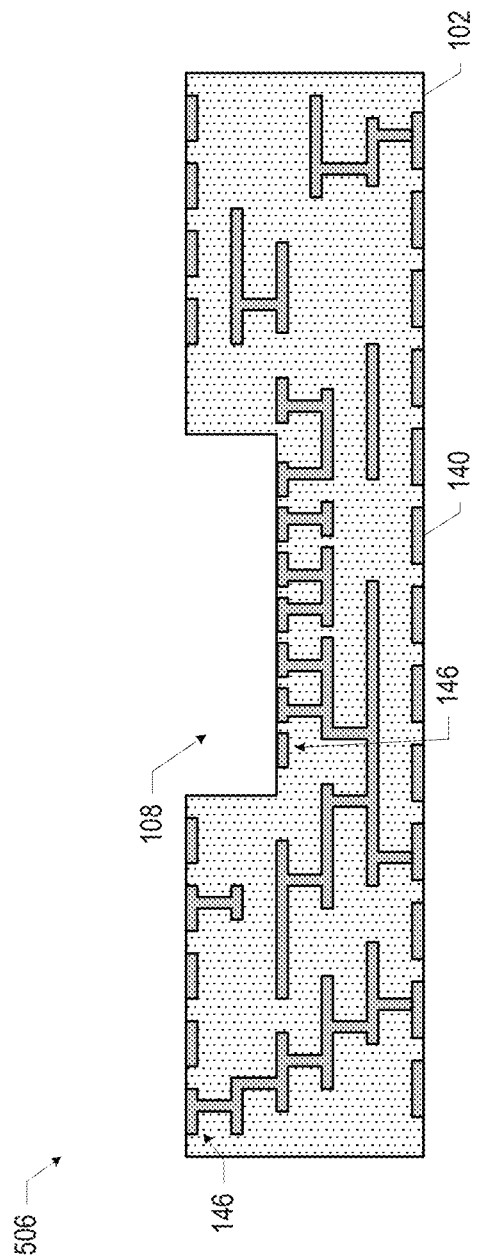

FIG. 17D illustrates an assembly 506 subsequent to forming a recess 108 in the package substrate 203 (FIG. 17C) to form the package substrate 102. The recess 108 may have a bottom surface at which conductive contacts 146 are exposed. Any suitable technique may be used to form the recess 108. For example, in some embodiments, the recess 108 may be laser-drilled down to a planar metal stop in the package substrate 203 (not shown); once the metal stop is reached, the metal stop may be removed to expose the conductive contacts 146 at the bottom of the recess 108. In some embodiments, the recess 108 may be formed by a mechanical drill.

Figure 17E:
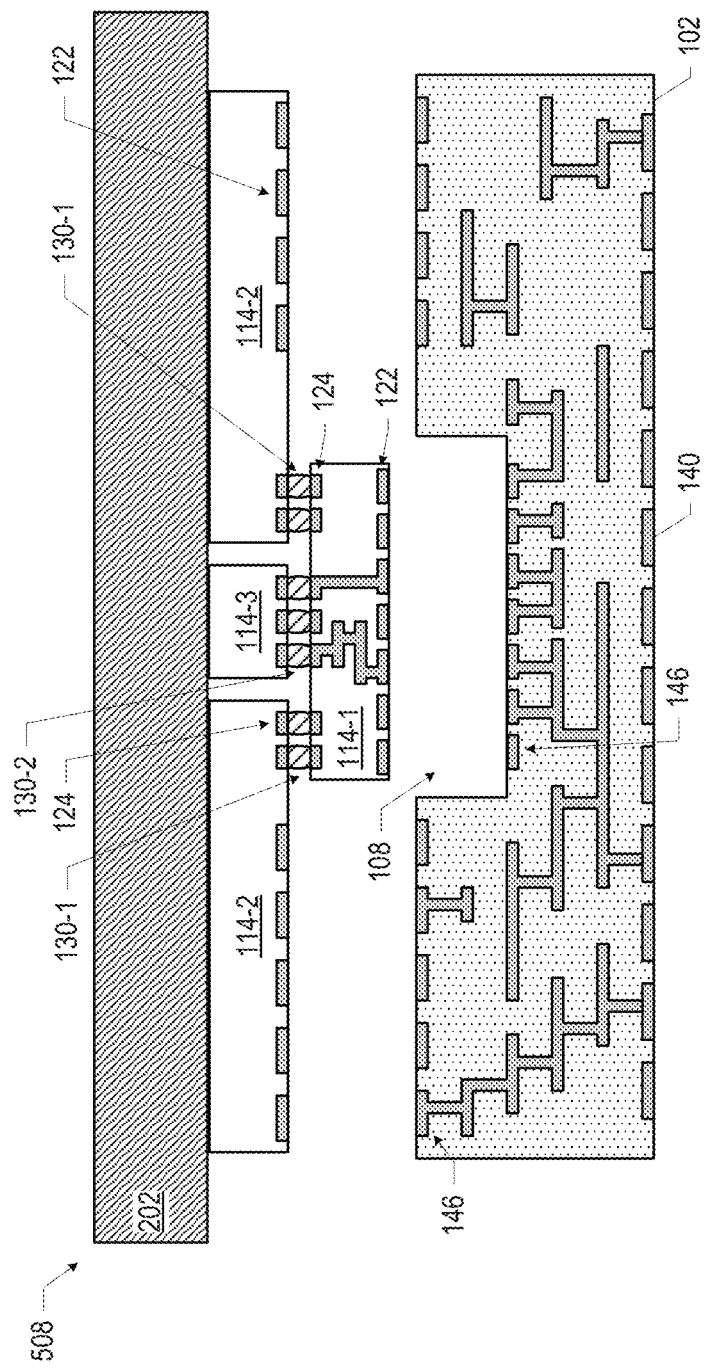

FIG. 17E illustrates an assembly 508 subsequent to "flipping" the assembly 502 (FIG. 17B) and bringing the dies 114-1 and 114-2 into alignment with the package substrate 102 (FIG. 17D) so that the conductive contacts 122 on the dies 114-1 and 114-2 are aligned with their respective conductive contacts 146 on the top surface of the package substrate 102.

Figure 17F:
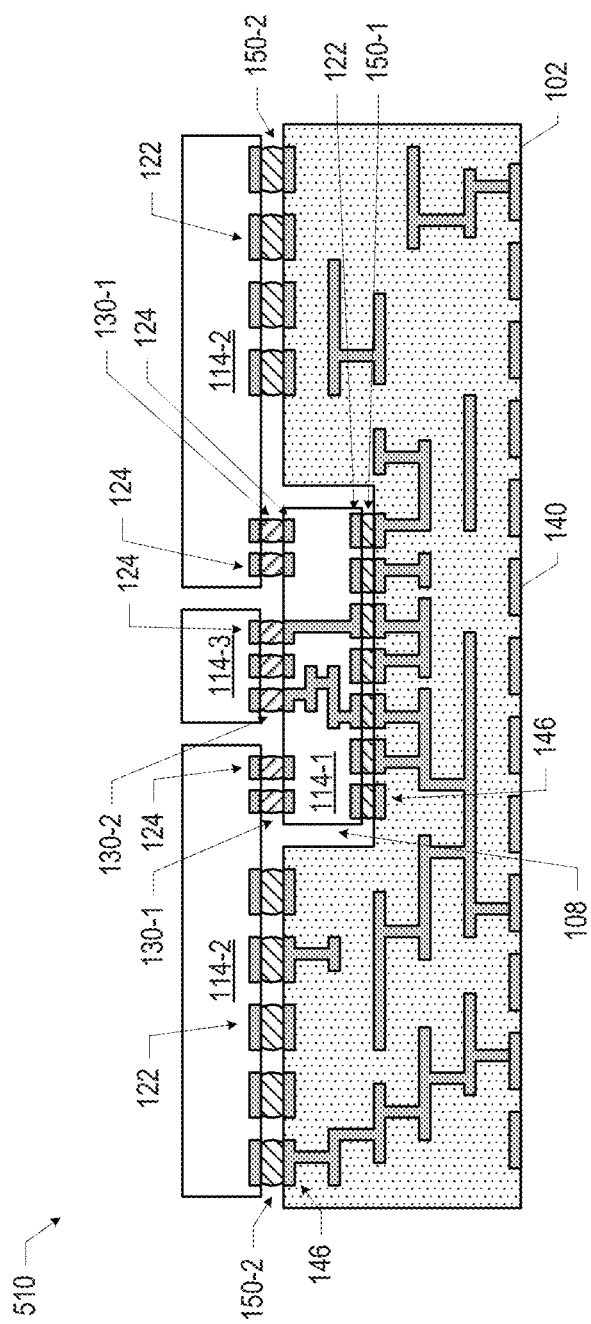

FIG. 17F illustrates an assembly 510 subsequent to forming DTPS interconnects 150 between the dies 114-1/114-2 and the package substrate 102 of the assembly 508 (FIG. 17E), then removing the carrier. The DTPS interconnects 150 may take any of the forms disclosed herein (e.g., solder interconnects, or anisotropic conductive material interconnects), and any suitable techniques may be used to form the DTPS interconnects 150 (e.g., a mass reflow process or a thermal compression bonding process). The assembly 510 may take the form of the quantum computing assembly 100 of FIG. 5. Further operations may be performed as suitable (e.g., providing a mold material 127, providing a TIM 129, providing a heat spreader 131, attaching additional dies 114 to the package substrate 102, etc.).

Figure 18A:
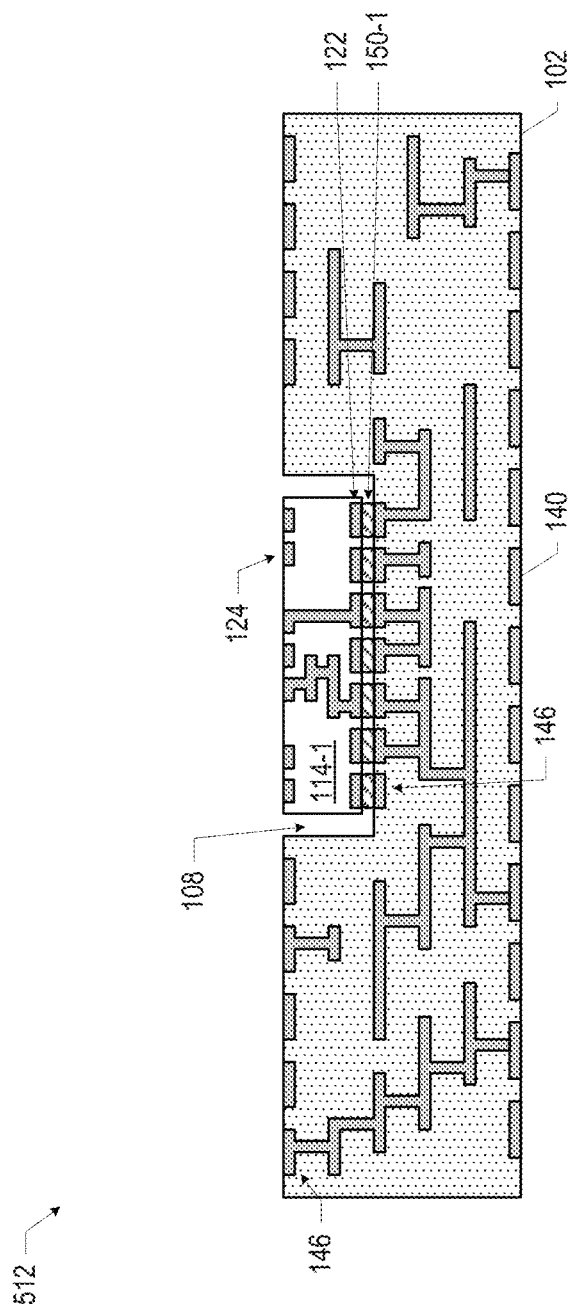
FIGS. 18A-18B are side, cross-sectional views of various stages in another example process for manufacturing the quantum computing assembly of FIG. 5, in accordance with various embodiments.
Figure 18B:
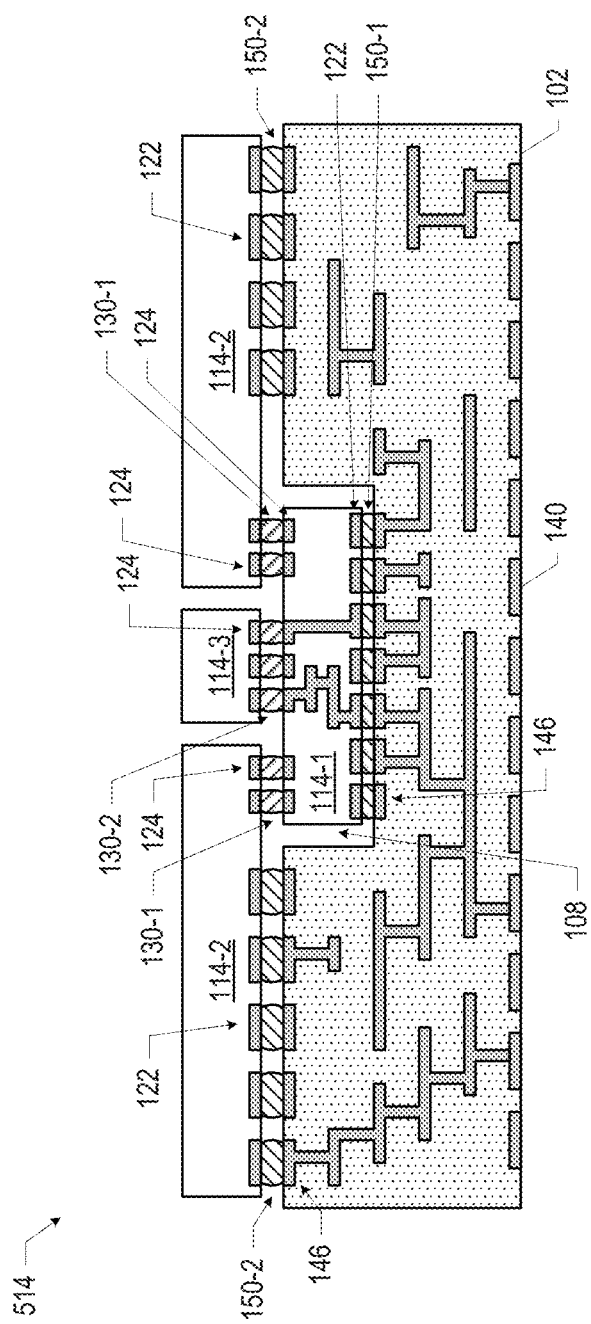

FIGS. 18A-18B are side, cross-sectional views of various stages in another example process for manufacturing the quantum computing assembly 100 of FIG. 5, in accordance with various embodiments. In some embodiments, quantum computing assemblies 100 manufactured in accordance with the process of FIGS. 18A-18B (e.g., any of the quantum computing assemblies 100 of FIGS. 1-11) may have DTPS interconnects 150-1 that are solder interconnects, and DTD interconnects 130-1 and 130-2 that are also solder interconnects. In the embodiment of FIGS. 18A-18B, the die 114-1 may be coupled to the package substrate 102, and then the remaining dies 114 may be attached. This approach may accommodate the tolerance and warpage of the package substrate 102, and may be particularly desirable for relatively larger dies 114. The process of FIGS. 17A-17F may advantageously be more compatible with non-solder DTD interconnects 130, while the process of FIGS. 18A-18B may advantageously involve simpler handling of the dies 114.

FIG. 18A illustrates an assembly 512 subsequent to coupling the die 114-1 to the package substrate 102. In particular, the die 114-1 may be positioned in the recess 108, and conductive contacts 122 at the bottom surface of the die 114-1 may be coupled to conductive contacts 146 at the top surface of the package substrate 102 by DTPS interconnects 150-1. The DTPS interconnects 150-1 may take the form of any of the embodiments disclosed herein, such as solder interconnects or anisotropic conductive material interconnects. The package substrate 102 may be formed in accordance with any of the techniques discussed above with reference to FIGS. 17C-17D.

FIG. 18B illustrates an assembly 514 subsequent to coupling the dies 114-2 and 114-3 to the assembly 512 (FIG. 18A). In particular, the conductive contacts 124 of the die 114-1 may be coupled to the conductive contacts 124 of the dies 114-2 (via DTD interconnects 130-1) and to the conductive contacts 124 of the die 114-3 (via DTD interconnects 130-2). Further, the conductive contacts 122 of the dies 114-2 may be coupled to conductive contacts 146 at the top surface of the package substrate 102 via DTPS interconnects 150-2. Any suitable technique may be used to form the DTD interconnects 130-1 and 130-2, and the DTPS interconnects 150-2, of the assembly 514, such as solder techniques or anisotropic conductive material techniques. For example, the DTPS interconnects 150-2 and the DTD interconnects 130-1/130-2 may be solder interconnects. The assembly 514 may take the form of the quantum computing assembly 100 of FIG. 5. Further operations may be performed as suitable (e.g., providing a mold material 127, providing a TIM 129, providing a heat spreader 131, attaching additional dies 114 to the package substrate 102, etc.).

FIGS. 19A-19H are side, cross-sectional views of various stages in another example process for manufacturing the quantum computing assembly 100 of FIG. 5, in accordance with various embodiments. In some embodiments, quantum computing assemblies 100 manufactured in accordance with the process of FIGS. 19A-19H (e.g., any of the quantum computing assemblies 100 of FIGS. 1-11) may have DTPS interconnects 150-1 that are non-solder interconnects (e.g., anisotropic conductive material interconnects), and DTD interconnects 130-1 and 130-2 that are solder interconnects.

Figure 19A:
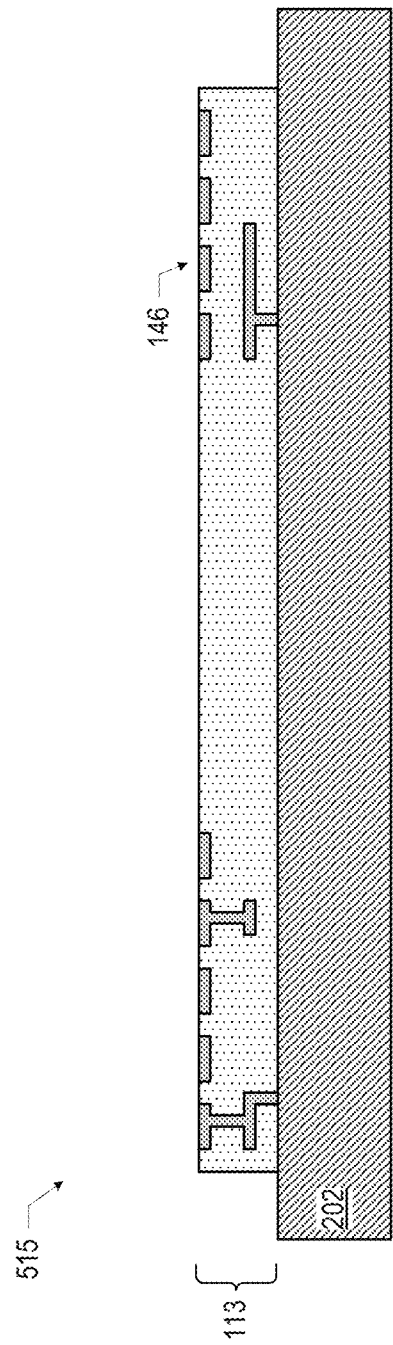
FIGS. 19A-19H are side, cross-sectional views of various stages in another example process for manufacturing the quantum computing assembly of FIG. 5, in accordance with various embodiments.

FIG. 19A illustrates an assembly 515 including a package substrate portion 113 on a carrier 202. The package substrate portion 113 may be the "top" portion of the package substrate 102, as discussed further below, and may include conductive contacts 146 at the surface of the package substrate portion 113 facing away from the carrier 202. The carrier 202 may take any of the forms disclosed herein. The package substrate portion 113 may be formed on the carrier 202 using any suitable technique, such as a redistribution layer technique.

Figure 19B:
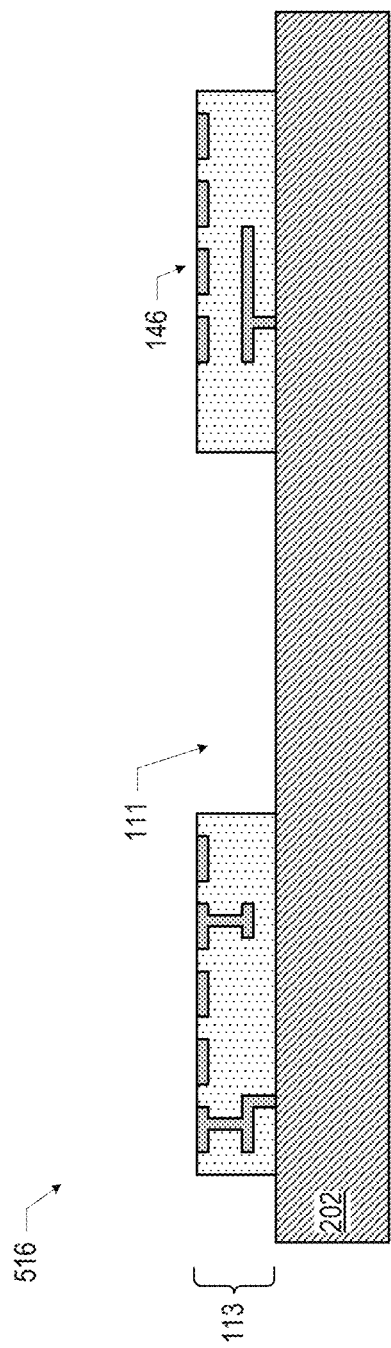

FIG. 19B illustrates an assembly 516 subsequent to forming a cavity 111 in the package substrate portion 113 of the assembly 515 (FIG. 19A). The cavity 111 may be formed using any of the techniques discussed above with reference to the recess 108 of FIG. 17D, for example. As discussed in further detail below, the cavity 111 may correspond to the recess 108.

Figure 19C:
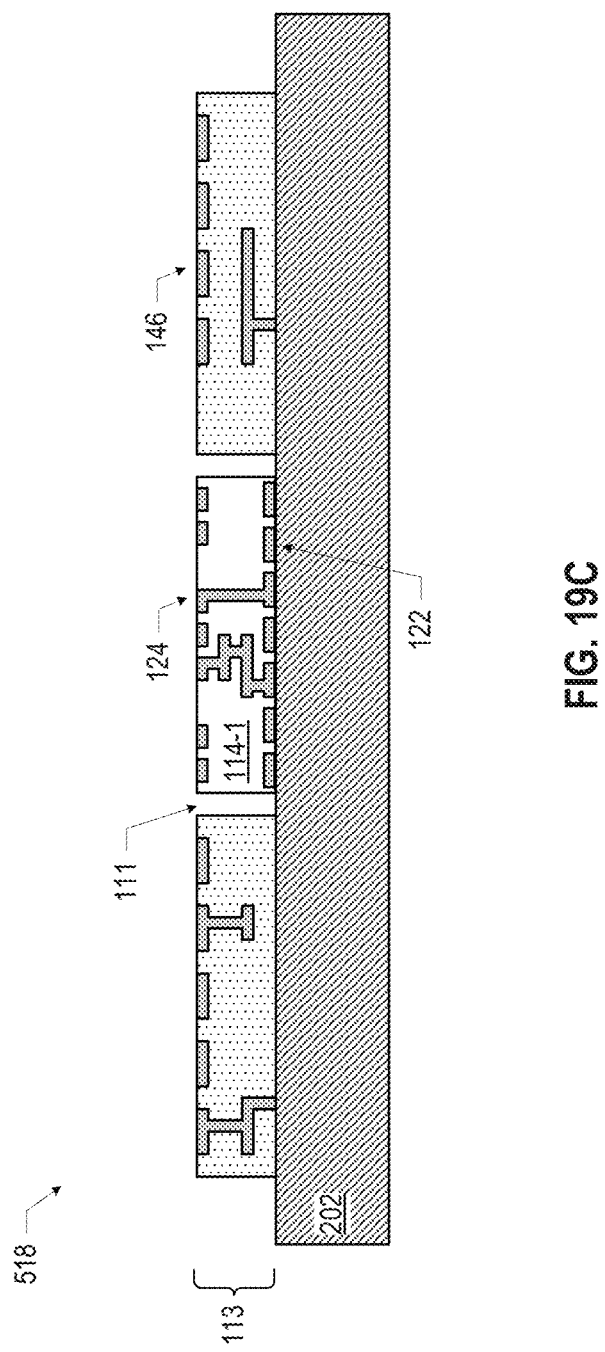

FIG. 19C illustrates an assembly 518 subsequent to positioning the die 114-1 in the cavity 111 of the assembly 516 (FIG. 19B). The die 114-1 may be positioned in the cavity 111 so that the conductive contacts 122 face the carrier 202 and the conductive contacts 124 face away from the carrier 202. In some embodiments, a pick-and-place machine may be used to position the die 114-1 in the cavity 111 on the carrier 202.

Figure 19D:
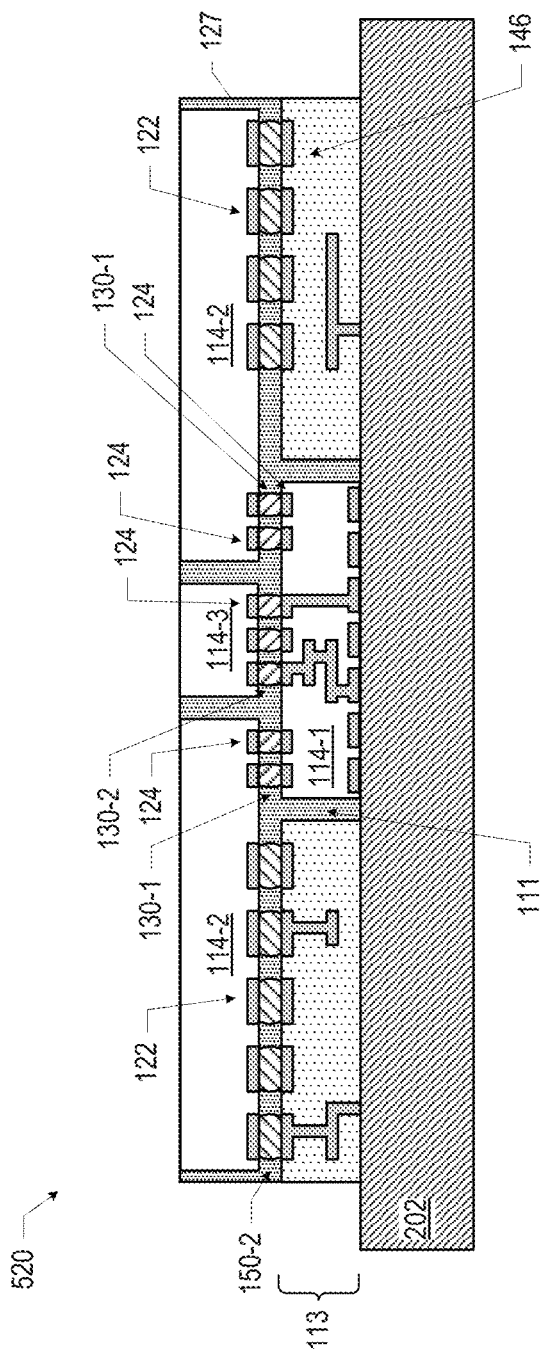

FIG. 19D illustrates an assembly 520 subsequent to coupling the dies 114-2 and 114-3 to the assembly 518 (FIG. 19C), and providing a mold material 127 around the dies 114. In particular, the conductive contacts 124 of the die 114-1 may be coupled to the conductive contacts 124 of the dies 114-2 (via DTD interconnects 130-1) and to the conductive contacts 124 of the die 114-3 (via DTD interconnects 130-2). Further, the conductive contacts 122 of the dies 114-2 may be coupled to conductive contacts 146 at the top surface of the package substrate 102 via DTPS interconnects 150-2. Any suitable technique may be used to form the DTD interconnects 130-1 and 130-2, and the DTPS interconnects 150-2, of the assembly 514, such as solder techniques or anisotropic conductive material techniques. For example, the DTPS interconnects 150-2 and the DTD interconnects 130-1/130-2 may be solder interconnects. The mold material 127 may take any of the forms disclosed herein, and may provide mechanical support for further manufacturing operations.

Figure 19E:
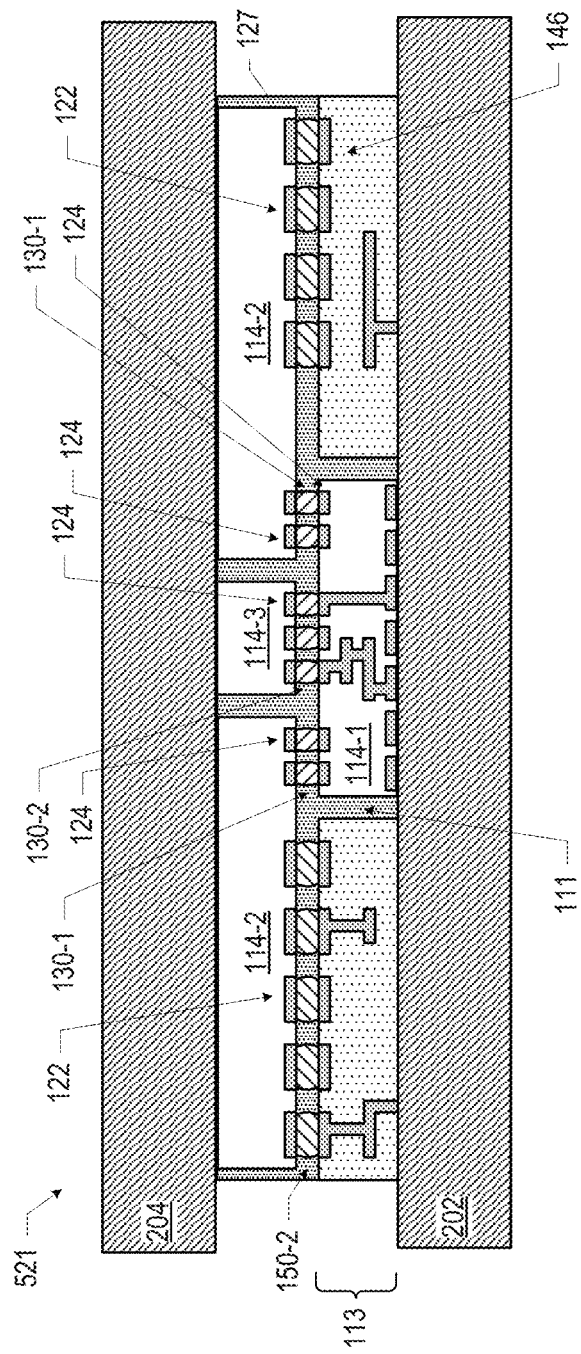

FIG. 19E illustrates an assembly 521 subsequent to attaching another carrier 204 to the top surface of the assembly 520 (FIG. 19D). The carrier 204 may take the form of any of the embodiments of the carrier 202 disclosed herein.

Figure 19F:
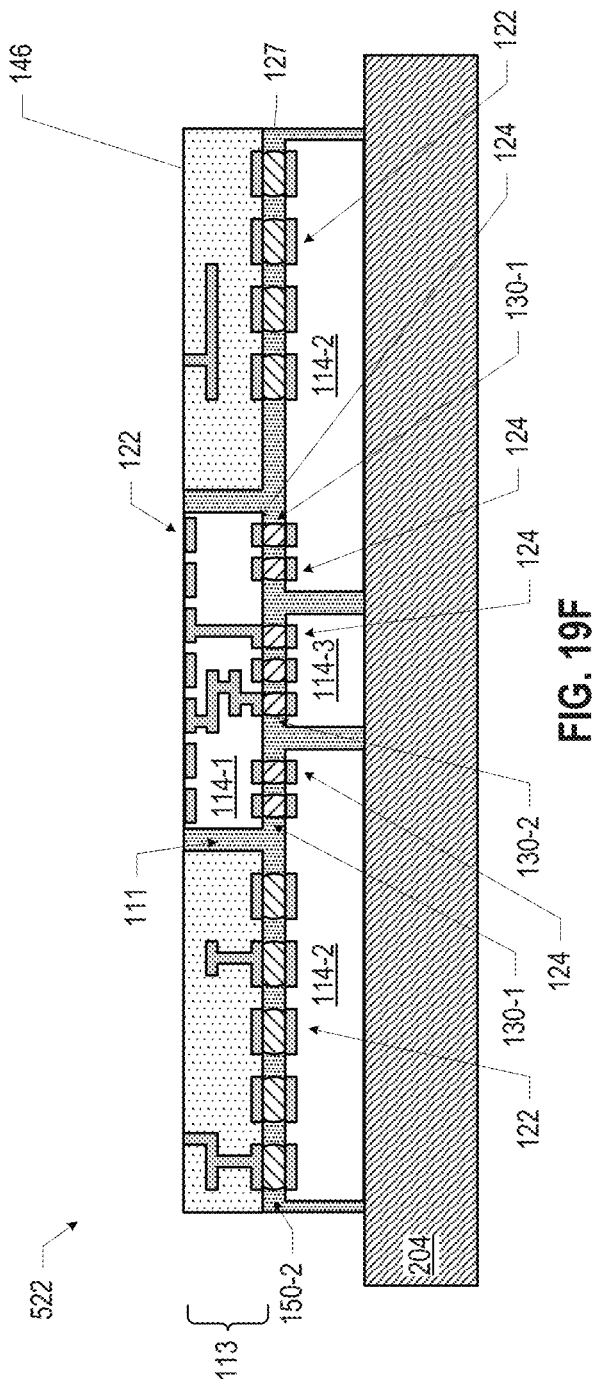

FIG. 19F illustrates an assembly 522 subsequent to removing the carrier 202 from the assembly 521 (FIG. 19E) and flipping the result so that the package substrate portion 113 and the conductive contacts 122 of the die 114-1 are exposed.

Figure 19G:
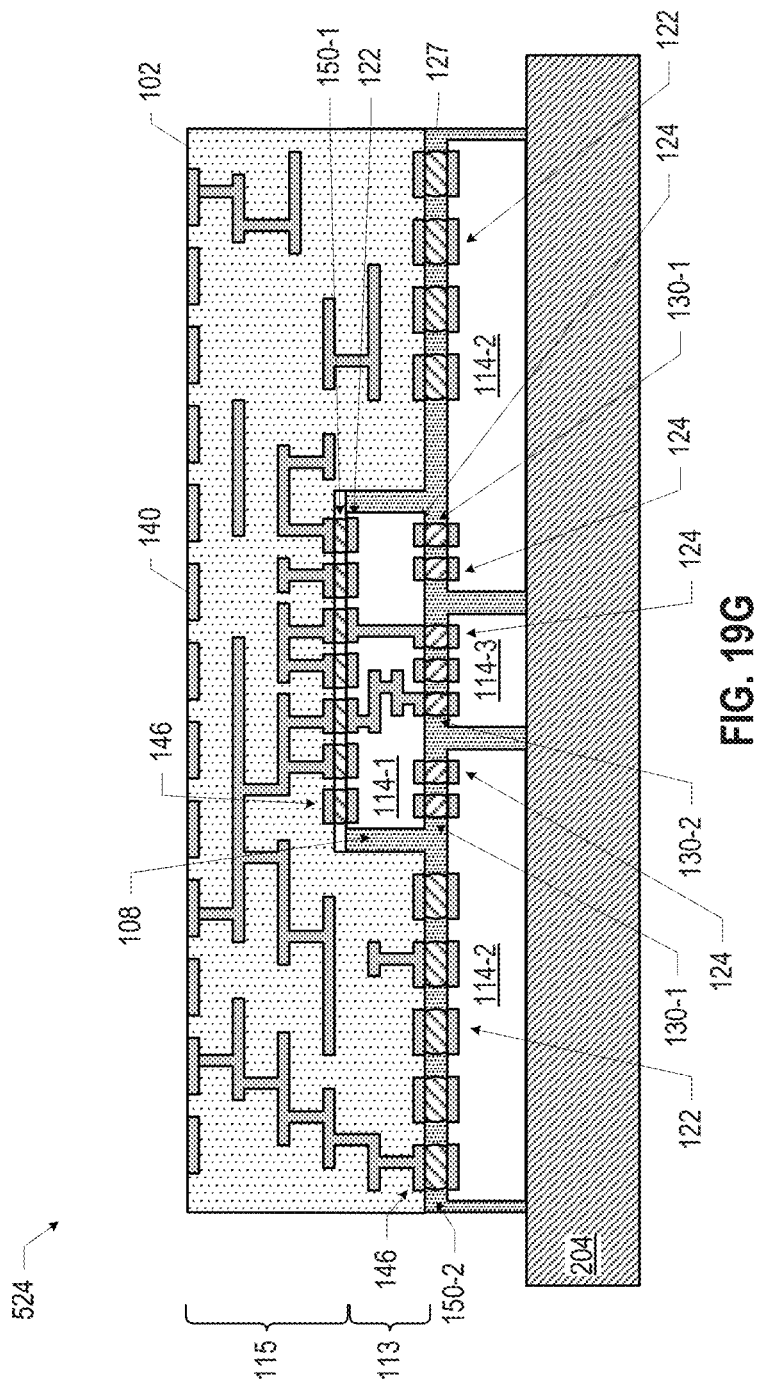

FIG. 19G illustrates an assembly 524 subsequent to forming an additional package substrate portion 115 on the package substrate portion 113 of the assembly 522 (FIG. 19F) to form the package substrate 102. Any suitable technique may be used to form the package substrate portion 113, including any of the techniques discussed above with reference to FIG. 19A, a bumpless build-up layer technique, a carrier-based panel-level coreless package substrate manufacturing technique, or an embedded panel-level bonding technique. In some embodiments, forming the package substrate portion 115 may include plating the conductive contacts 122 of the die 114-1 with a metal or other conductive material as part of forming the proximate conductive contacts 146 of the package substrate 102; consequently, the DTPS interconnects 150-1 between the die 114-1 and the package substrate 102 may be plated interconnects.

Figure 19H:
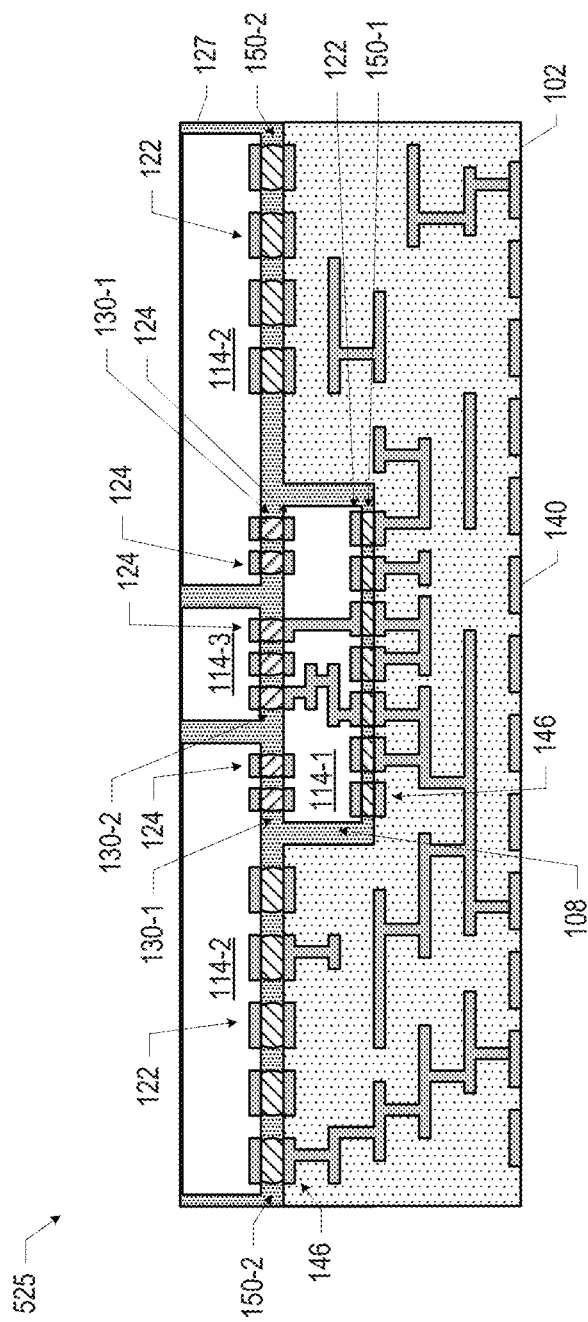

FIG. 19H illustrates an assembly 525 subsequent to removing the carrier 204 from the assembly 524 (FIG. 19G) and flipping the result. The assembly 525 may take the form of the quantum computing assembly 100 of FIG. 5. Further operations may be performed as suitable (e.g., providing a TIM 129, providing a heat spreader 131, attaching additional dies 114 to the package substrate 102, etc.).

Figure 20:
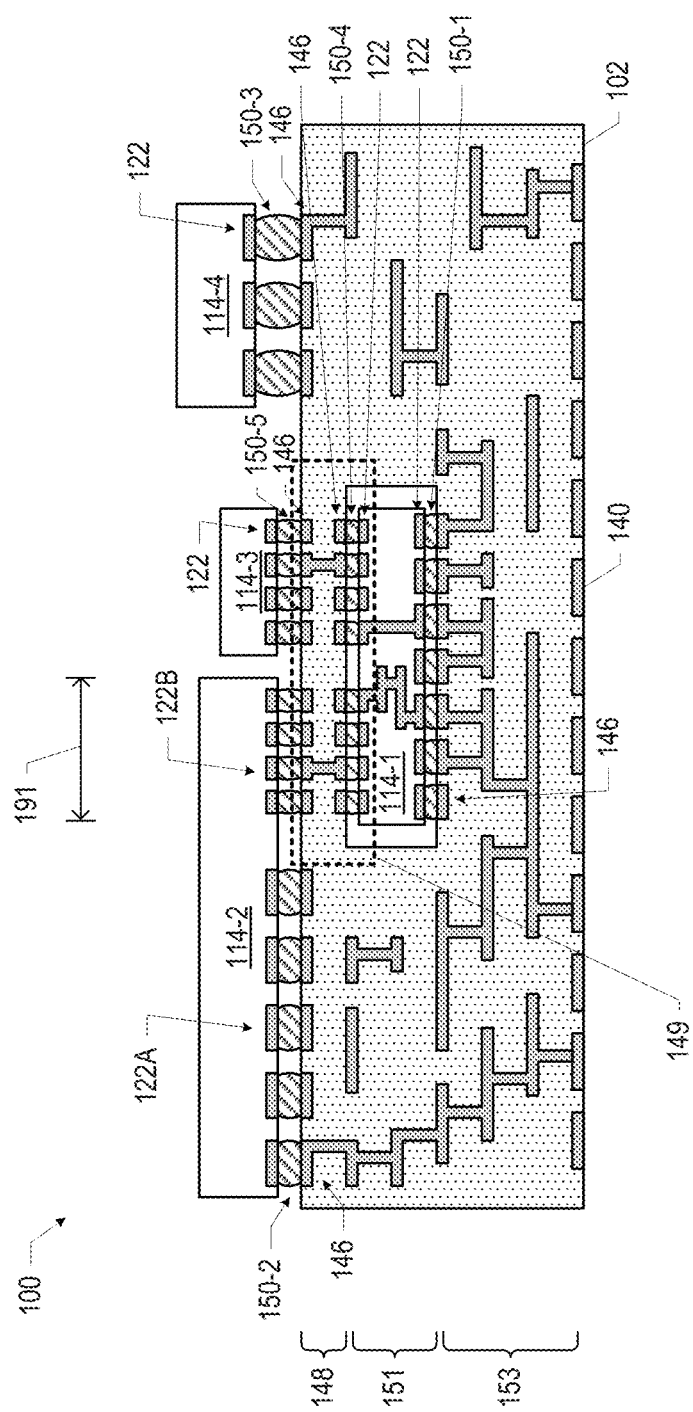
FIGS. 20-22 are side, cross-sectional views of example quantum computing assemblies, in accordance with various embodiments.
Figure 21:
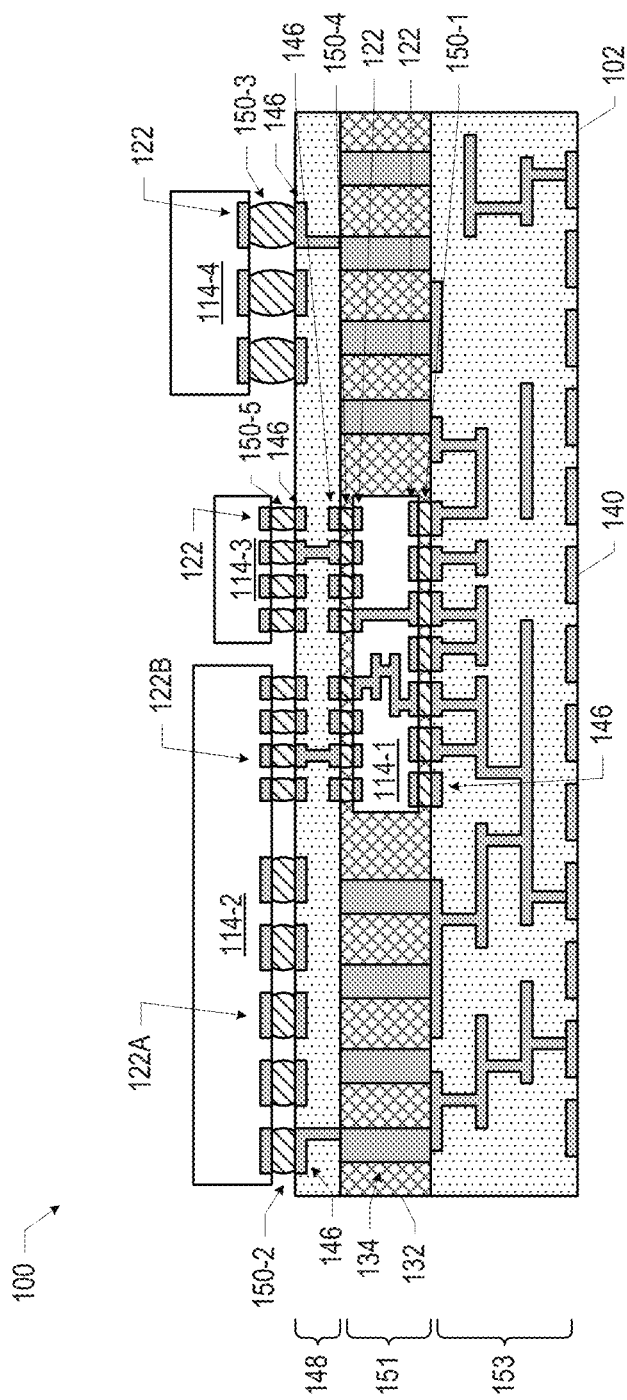
Figure 22:
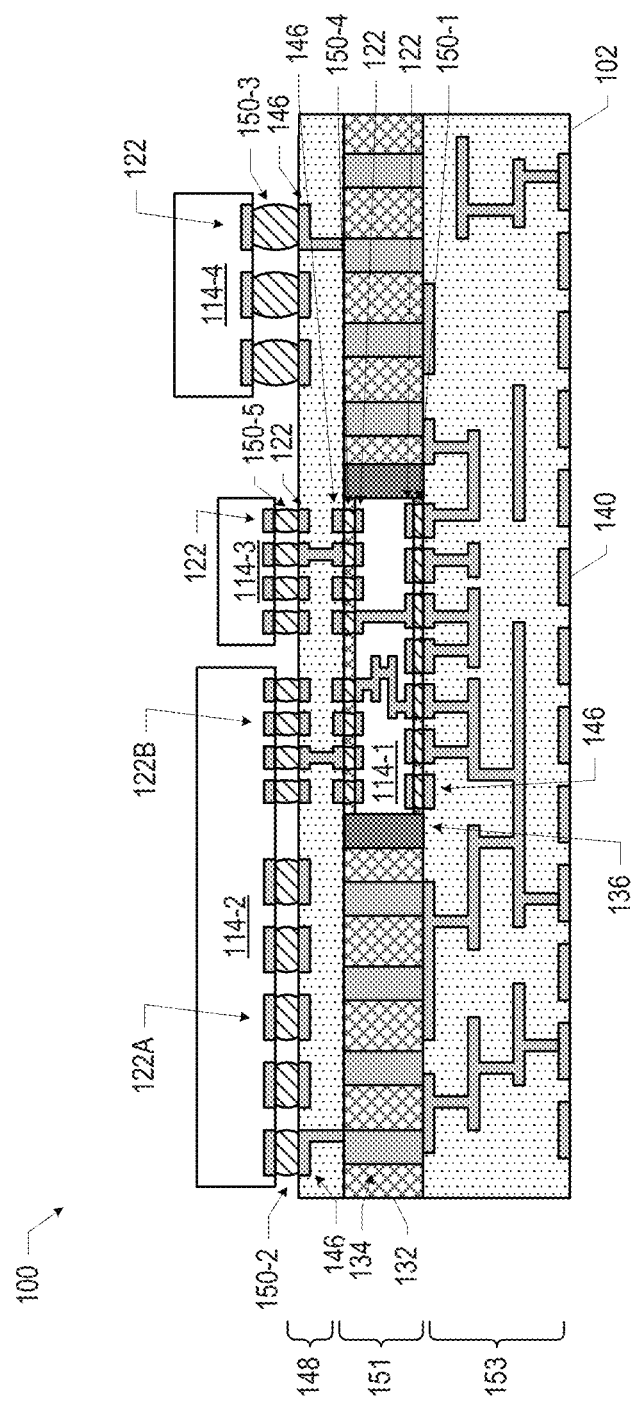

In the quantum computing assemblies 100 discussed above with reference to FIGS. 1-11, the die 114-1 is coupled directly to at least one die 114-2 without any intervening portion of the package substrate 102. In other embodiments of the quantum computing assemblies 100 disclosed herein, a portion of the package substrate 102 may be disposed between an embedded die 114-1 and a die 114-2. FIGS. 20-22 are side, cross-sectional views of example quantum computing assemblies 100 including such a feature, in accordance with various embodiments. In particular, FIGS. 20-22 illustrate arrangements of dies 114-1, 114-2, 114-3, and 114-4 that are similar to the arrangement illustrated in FIG. 1, but that further include a package substrate portion 148 between the top surface of the die 114-1 and the top surface of the package substrate 102. The dies 114-2, 114-3, and 114-4 may all be coupled to this package substrate portion 148. For example, the die 114-1 may include conductive contacts 122 at its bottom surface that couple to conductive contacts 146 of the package substrate 102 via DTPS interconnects 150-1, and the die 114-1 may include conductive contacts 122 at its top surface that couple to conductive contacts 146 of the package substrate 102 (in the package substrate portion 148) via DTPS interconnects 150-4.

In some embodiments, the package substrate portion 148 may include one or more areas 149 with higher conductive pathway density (e.g., the areas in which the footprint of the die 114-2 overlaps with the footprint of the die 114-1 and the package substrate portion 148 includes conductive pathways between the die 114-2 and the die 114-1, or the areas in which the footprint of the die 114-3 overlaps of the footprint of the die 114-1 and the package substrate portion 148 includes conductive pathways between the die 114-3 and the die 114-1). Thus, the die 114-2 may be a mixed-pitch die including larger-pitch conductive contacts 122A and smaller-pitch conductive contacts 122B; the larger-pitch conductive contacts 122A may couple (through some of the DTPS interconnects 150-2) to conductive contacts 146 on the top surface of the package substrate 102 (that themselves couple to conductive pathways through the bulk of the package substrate 102), and the smaller-pitch conductive contacts 122B may couple (through some of the DTPS interconnects 150-2) to conductive contacts 146 on the top surface of the package substrate 102 (that themselves couple to conductive pathways through the package substrate portion 148 and to the die 114-1). Similarly, the pitch of the conductive contacts 122 at the bottom surface of the die 114-3 (which may be coupled via the DTPS interconnects 150-5 to dense conductive pathways through the package substrate portion 148 to the die 114-1) may be smaller than the pitch of the conductive contacts 122 at the bottom surface of the die 114-4 (which may be coupled via the DTPS interconnects 150-3 to less dense conductive pathways through the package substrate 102). The package substrate 102 may also include a portion 151 adjacent to the die 114-1, and a portion 153 below the die 114-1.

FIG. 20 illustrates an embodiment in which the conductive pathways in the package substrate 102 are provided by conductive lines and vias, as known in the art. In other embodiments, the package substrate 102 may include conductive pillars (e.g., copper pillars) and other structures. For example, FIG. 21 illustrates a quantum computing assembly 100 similar to that of FIG. 20, but in which the package substrate portion 151 includes a plurality of conductive pillars 134 disposed around the die 114-1. The conductive pillars 134 may be substantially surrounded by a mold material 132, which may take the form of any of the mold materials 127 disclosed herein. The conductive pillars 134 may be part of conductive pathways between the package substrate portion 148 and the package substrate portion 153. Non-conductive pillars (e.g., pillars formed of a permanent resist or a dielectric) may be used instead of or in addition to conductive pillars 134 in any suitable ones of the embodiments disclosed herein.

The conductive pillars 134 may be formed of any suitable conductive material, such as a metal. In some embodiments, the conductive pillars 134 may include copper. The conductive pillars 134 may have any suitable dimensions. For example, in some embodiments, an individual conductive pillar 134 may have an aspect ratio (height:diameter) between 1:1 and 4:1 (e.g., between 1:1 and 3:1). In some embodiments, an individual conductive pillar 134 may have a diameter between 10 microns and 300 microns. In some embodiments, an individual conductive pillar 134 may have a diameter between 50 microns and 400 microns.

In some embodiments in which a package substrate 102 includes a plurality of conductive pillars 134, the package substrate portion 151 may also include a placement ring. For example, FIG. 22 illustrates an embodiment of the quantum computing assembly 100 similar to that of FIG. 21, but further including a placement ring 136. The placement ring 136 may be formed of any suitable material (e.g., a plated copper feature with a coating of an organic material, stainless steel, or a non-conductive material, such as glass, sapphire, polyimide, or epoxy with silica), and may be shaped so as to fit closely around the die 114-1. In some embodiments, the placement ring 136 may have slanted or straight walls to help guide the die 114-1 into position. Thus, the shape of the placement ring 136 may complement the shape of the footprint of the die 114-1, and the placement ring 136 may help to align the die 114-1 during manufacture, as discussed further below.

Quantum computing assemblies 100 including embedded dies 114 may include any suitable arrangement of dies 114. For example, any of the arrangements illustrated in FIGS. 12-16 may be implemented with the die 114A embedded in a package substrate, with the dies 114A and 114B embedded in a package substrate 102, or with the dies 114A, 114B, and 114C embedded in a package substrate 102. Additionally, any of the arrangements illustrated in FIGS. 1-11 may be implemented with the die 114-1 (and optionally more of the dies 114) embedded in a package substrate 102, in accordance with any of the embodiments of FIGS. 20-22.

Figure 23A:
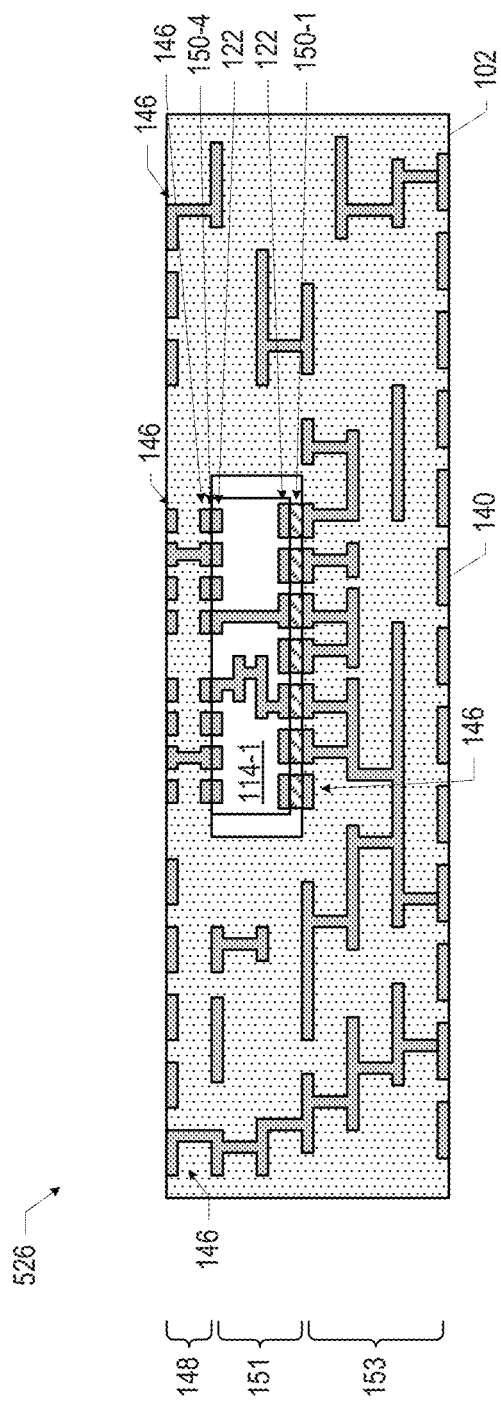
FIGS. 23A-23B are side, cross-sectional views of various stages in an example process for manufacturing the quantum computing assembly of FIG. 20, in accordance with various embodiments.
Figure 23B:
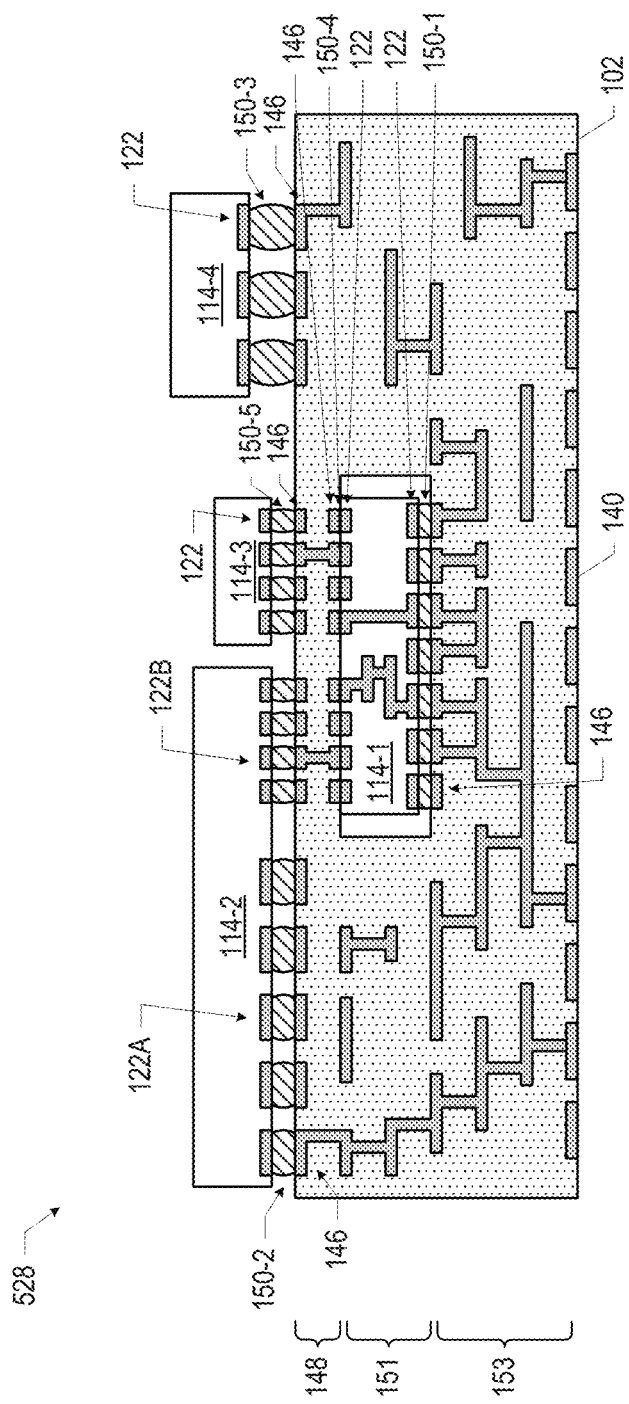

Any suitable techniques may be used to manufacture quantum computing assemblies 100 having an embedded die 114-1 (e.g., having a package substrate portion 148 between the die 114-1 and the die 114-2). For example, FIGS. 23A-23B are side, cross-sectional views of various stages in an example process for manufacturing the quantum computing assembly 100 of FIG. 20, in accordance with various embodiments. In some embodiments, quantum computing assemblies 100 manufactured in accordance with the process of FIGS. 23A-23B may have DTPS interconnects 150-1 that are solder interconnects, and DTPS interconnects 150-4 that are non-solder interconnects (e.g., plated interconnects).

FIG. 23A illustrates an assembly 526 subsequent to forming the package substrate portion 148 on the assembly 512 (FIG. 18A). The package substrate portion 148 may be formed using any suitable techniques, such as any of the techniques discussed above with reference to the formation of the package substrate portion 115 of FIG. 19G. In some embodiments, forming the package substrate portion 148 may include plating the conductive contacts 122 of the die 114-1 with a metal or other conductive material as part of forming the proximate conductive contacts 146 of the package substrate 102; consequently, the DTPS interconnects 150-4 between the die 114-1 and the package substrate portion 148 may be plated interconnects.

FIG. 23B illustrates an assembly 528 subsequent to attaching the dies 114-2, 114-3, and 114-4 to the assembly 526 (FIG. 23A). Any suitable techniques may be used to form the DTPS interconnects 150 between the dies 114-2, 114-3, and 114-4 and the package substrate 102, such as solder techniques or anisotropic conductive material techniques.

FIGS. 24A-24E are side, cross-sectional views of various stages in an example process for manufacturing the quantum computing assembly 100 of FIG. 21, in accordance with various embodiments. In some embodiments, quantum computing assemblies 100 manufactured in accordance with the process of FIGS. 24A-24E may have DTPS interconnects 150-1 that are solder interconnects, and DTPS interconnects 150-4 that are non-solder interconnects (e.g., plated interconnects).

Figure 24A:
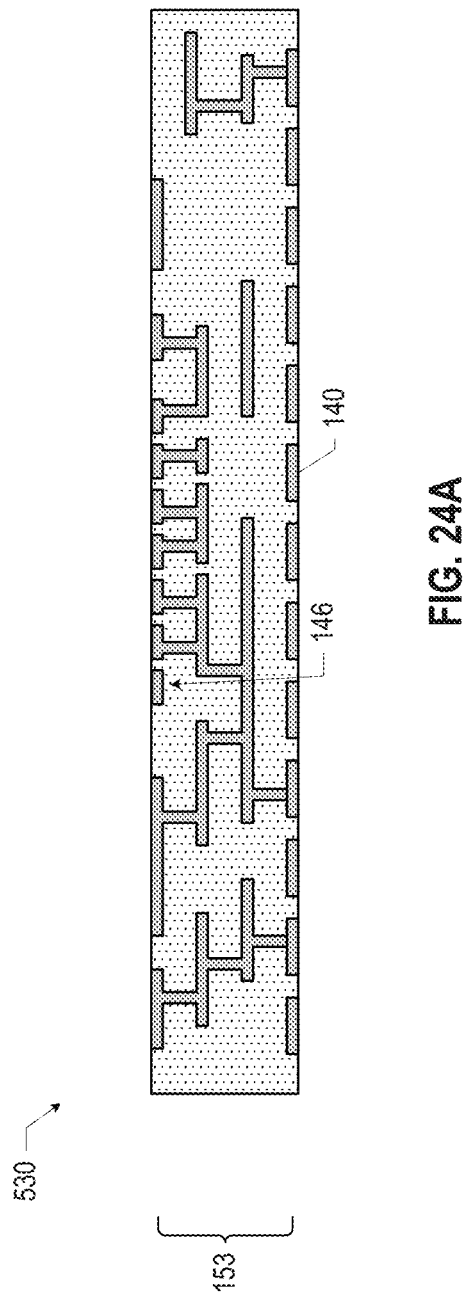
FIGS. 24A-24E are side, cross-sectional views of various stages in an example process for manufacturing the quantum computing assembly of FIG. 21, in accordance with various embodiments.

FIG. 24A illustrates an assembly 530 including the package substrate portion 153. The package substrate portion 153 may be manufactured using any suitable technique, such as a PCB technique or a redistribution layer technique.

Figure 24B:
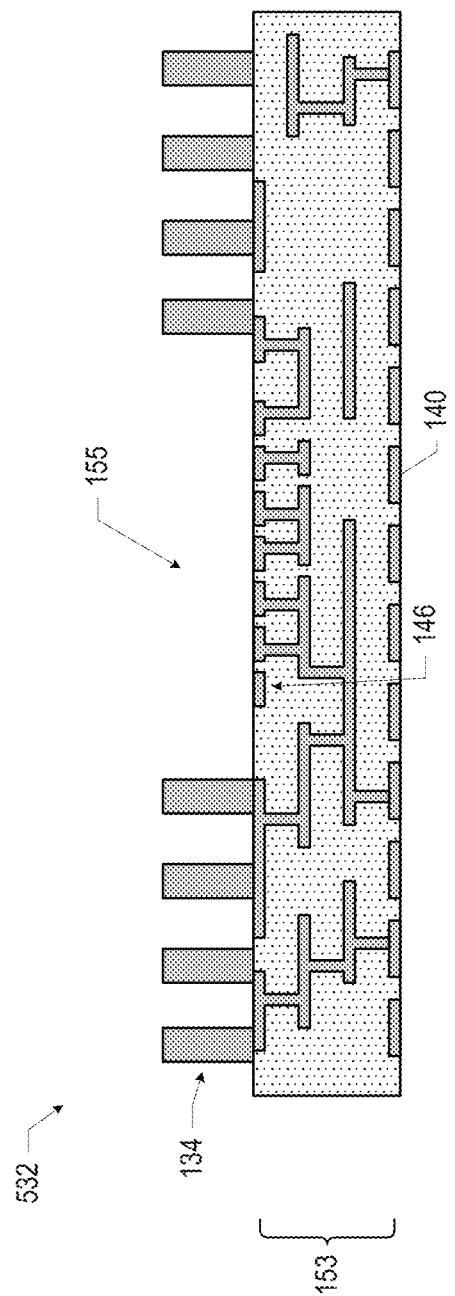

FIG. 24B illustrates an assembly 532 subsequent to forming conductive pillars 134 on the top surface of the package substrate portion 153 of the assembly 530 (FIG. 24A). The conductive pillars 134 may be disposed around a de-population region 155 in which no conductive pillars 134 are present. The conductive pillars 134 may take the form of any of the embodiments disclosed herein, and may be formed using any suitable technique (e.g., plating). For example, the conductive pillars 134 may include copper.

Figure 24C:
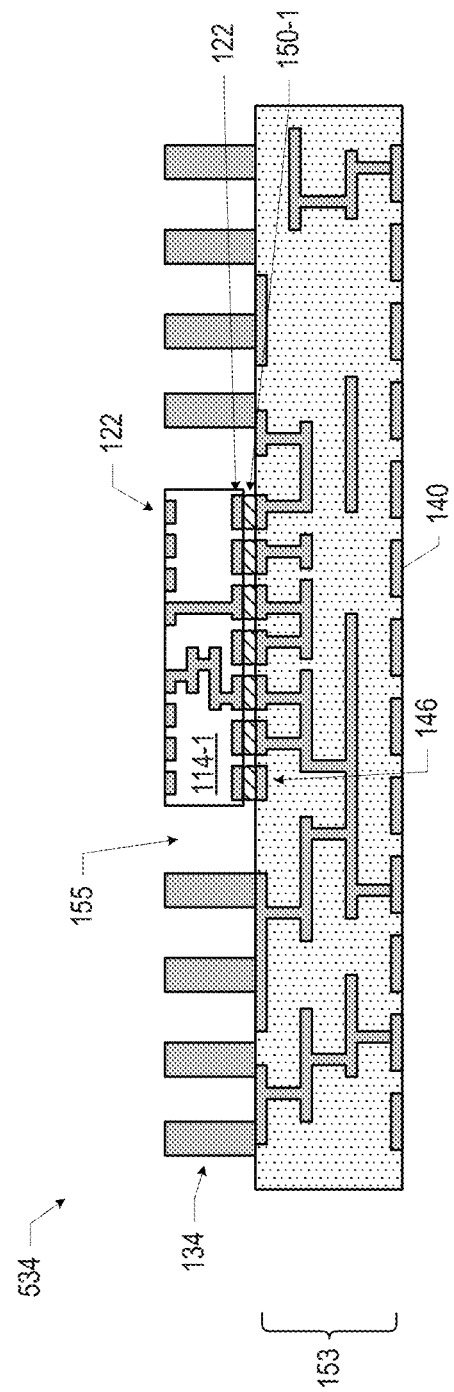

FIG. 24C illustrates an assembly 534 subsequent to placing the die 114-1 in the de-population region 155 of the assembly 532 (FIG. 24B) and coupling the die 114-1 to the package substrate portion 153. In particular, the conductive contacts 122 at the bottom surface of the die 114-1 may be coupled to the conductive contacts 146 at the top surface of the package substrate portion 153 via DTPS interconnects 150-1. The DTPS interconnects 150-1 may take any of the forms disclosed herein, such as solder interconnects or anisotropic conductive material interconnects.

Figure 24D:
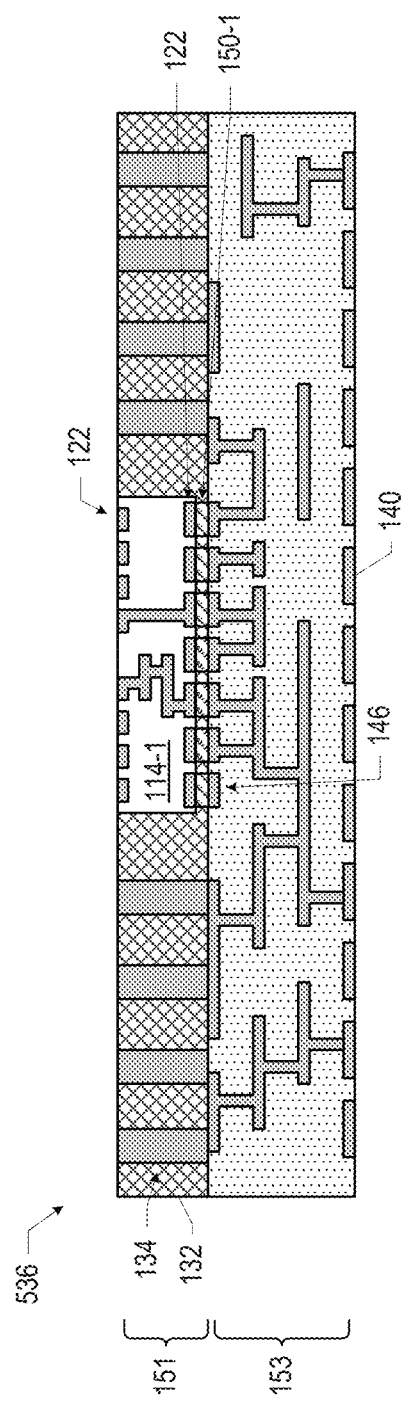

FIG. 24D illustrates an assembly 536 subsequent to providing a mold material 132 around the die 114-1 and the conductive pillars 134 of the assembly 534 (FIG. 24C) to complete the package substrate portion 151. In some embodiments, the mold material 132 may be initially deposited on and over the tops of the conductive pillars 134 and the die 114-1, then polished back to expose the conductive contacts 122 at the top surface of the die 114-1, and the top surfaces of the conductive pillars 134.

Figure 24E:
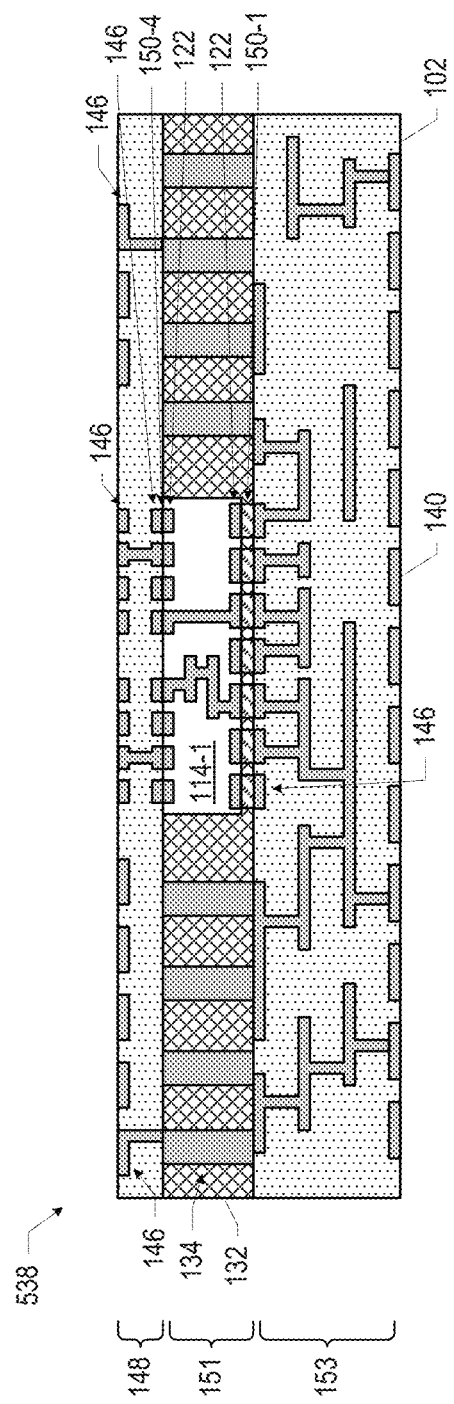

FIG. 24E illustrates an assembly 538 subsequent to forming the package substrate portion 148 on the assembly 536 (FIG. 24D). The package substrate portion 148 may be formed using any suitable techniques, such as any of the techniques discussed above with reference to the formation of the package substrate portion 115 of FIG. 19G. In some embodiments, forming the package substrate portion 148 may include plating the conductive contacts 122 of the die 114-1 with a metal or other conductive material as part of forming the proximate conductive contacts 146 of the package substrate 102; consequently, the DTPS interconnects 150-4 between the die 114-1 and the package substrate portion 148 may be plated interconnects. The dies 114-2, 114-3, and 114-4 may then be attached to the top surface of the package substrate portion 148 in accordance with any of the techniques discussed above with reference to FIG. 23B to form the quantum computing assembly 100 of FIG. 21.

FIGS. 25A-25F are side, cross-sectional views of various stages in an example process for manufacturing the quantum computing assembly 100 of FIG. 22, in accordance with various embodiments. In some embodiments, quantum computing assemblies 100 manufactured in accordance with the process of FIGS. 25A-25F may have DTPS interconnects 150-1 that are non-solder interconnects (e.g., plated interconnects), and DTPS interconnects 150-4 that are non-solder interconnects (e.g., plated interconnects).

FIG. 25A illustrates an assembly 540 subsequent to forming a plurality of conductive pillars 134 and a placement ring 136 on a carrier 202. The conductive pillars 134 may take any of the forms disclosed herein, and may be formed using any suitable technique (e.g., the techniques discussed above with reference to FIG. 24B). The placement ring 136 may take any of the forms disclosed herein, and may be formed using any suitable technique (e.g., any of the techniques disclosed herein). The placement ring 136 may surround a de-population region 155 in which no conductive pillars 134 are present.

Figure 25B:
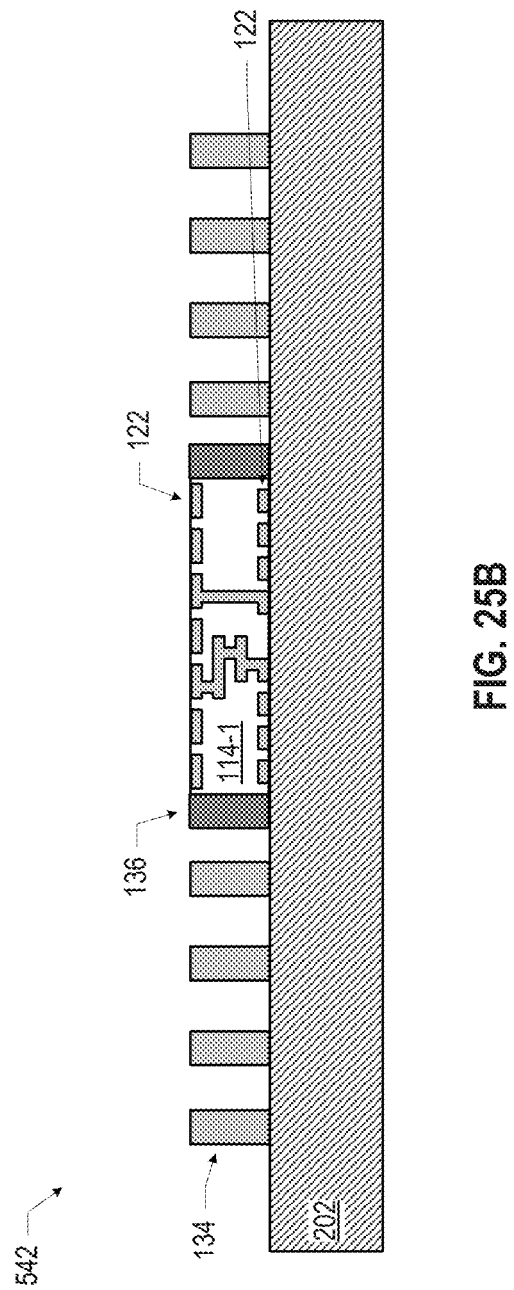

FIG. 25B illustrates an assembly 542 subsequent to positioning the die 114-1 in the de-population region 155 within the placement ring 136 of the assembly 540 (FIG. 25A). As noted above, the placement ring 136 may complement the footprint of the die 114-1, allowing the die 114-1 to be properly positioned.

FIG. 25C illustrates an assembly 544 subsequent to providing a mold material 132 around the conductive pillars 134 and placement ring 136 of the assembly 542 (FIG. 25B) to complete the package substrate portion 151. In some embodiments, the mold material 132 may be initially deposited on and over the tops of the conductive pillars 134 and the die 114-1, then polished back to expose the conductive contacts 122 at the surface of the die 114-1 and the surfaces of the conductive pillars 134.

Figure 25D:
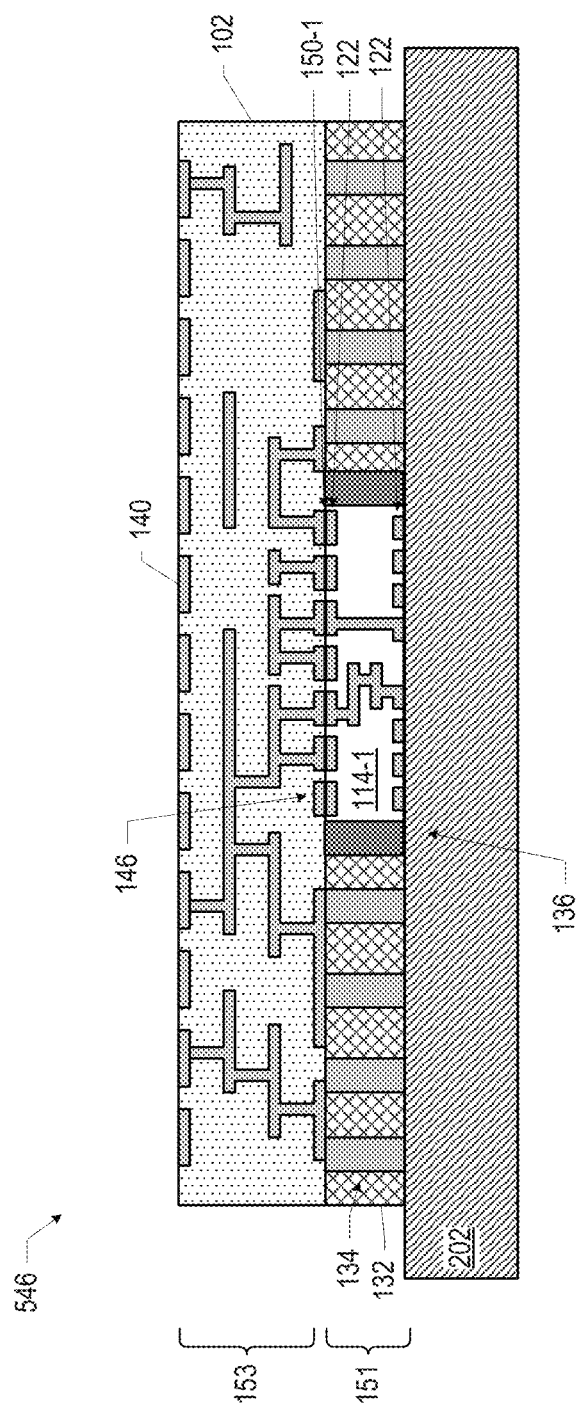

FIG. 25D illustrates an assembly 546 subsequent to forming the package substrate portion 153 on the assembly 544 (FIG. 25C). The package substrate portion 153 may be formed using any suitable techniques, such as any of the techniques discussed above with reference to the formation of the package substrate portion 115 of FIG. 19G. In some embodiments, forming the package substrate portion 153 may include plating the conductive contacts 122 of the die 114-1 with a metal or other conductive material as part of forming the proximate conductive contacts 146 of the package substrate 102; consequently, the DTPS interconnects 150-1 between the die 114-1 and the package substrate portion 148 may be plated interconnects.

Figure 25E:
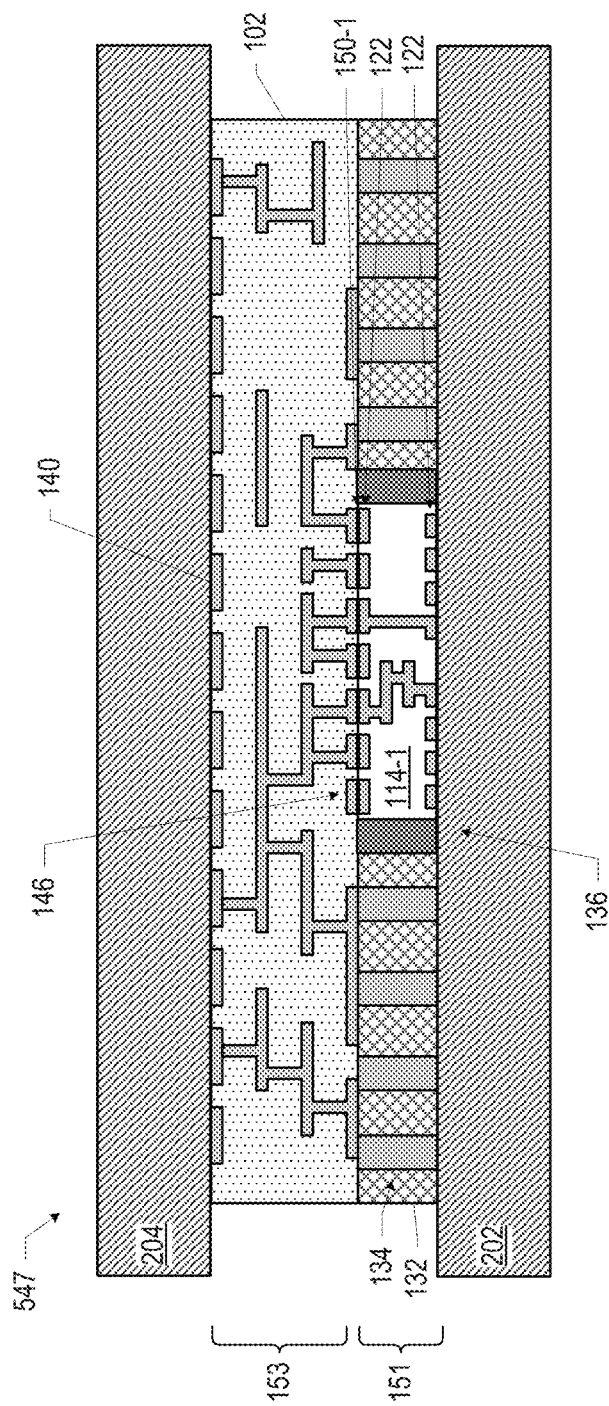

FIG. 25E illustrates an assembly 547 subsequent to attaching another carrier 204 to the top surface of the assembly 546 (FIG. 25D). The carrier 204 may take the form of any of the embodiments of the carrier 202 disclosed herein.

FIG. 25F illustrates an assembly 548 subsequent to removing the carrier 202 from the assembly 547 (FIG. 25E) and flipping the result so that the package substrate portion 151 and the other conductive contacts 122 of the die 114-1 are exposed. The package substrate portion 148 may then be formed on the assembly 548 in accordance with any of the techniques discussed above with reference to FIG. 24E, and the dies 114-2, 114-3, and 114-4 may be attached to the top surface of the package substrate portion 148 (e.g., in accordance with any of the techniques discussed above with reference to FIG. 23B) to form the quantum computing assembly 100 of FIG. 21.

In any of the embodiments disclosed herein, a portion of the package substrate 102 may be formed by assembling two separately manufactured sub-portions. For example, FIGS. 26A-26D are side, cross-sectional views of various stages in another example process for manufacturing the quantum computing assembly 100 of FIG. 21, in accordance with various embodiments. The process of FIGS. 26A-26D includes the assembly of the package substrate portion 153 from two sub-portions, but any package substrate 102 (or portion thereof) may be formed from multiple sub-portions.

Figure 26A:
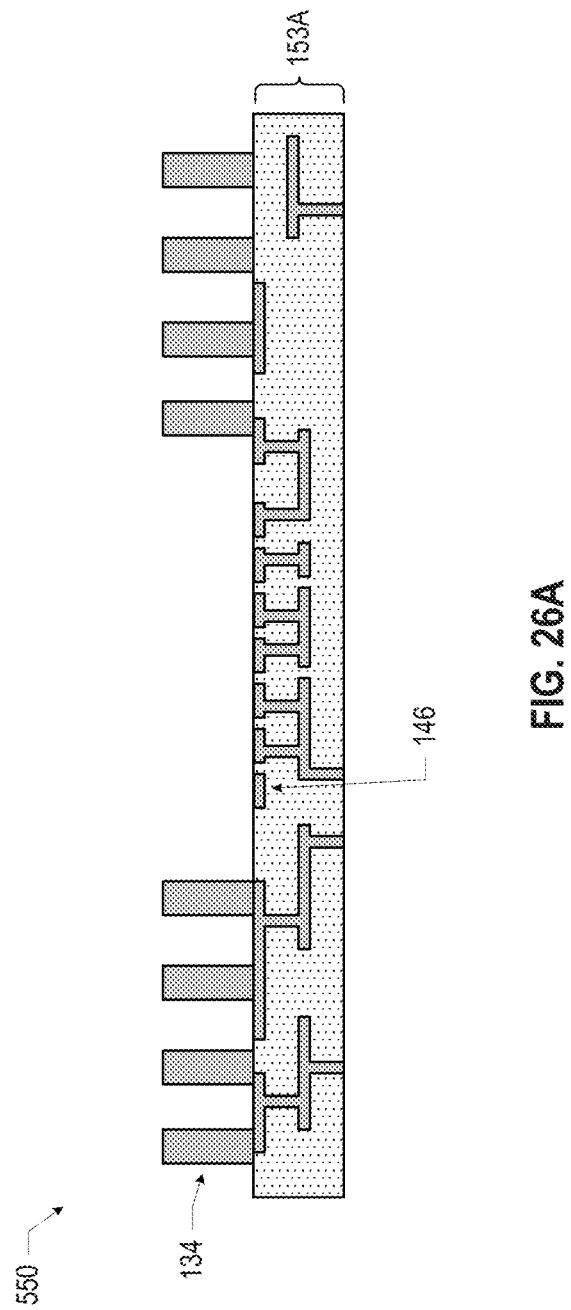
FIGS. 26A-26D are side, cross-sectional views of various stages in another example process for manufacturing the quantum computing assembly of FIG. 21, in accordance with various embodiments.

FIG. 26A illustrates an assembly 550 subsequent to forming a package substrate sub-portion 153A and forming conductive pillars 134 thereon. The conductive pillars 134 may take the form of any of the embodiments disclosed herein, and the package substrate sub-portion 153A may represent the top half of the package substrate portion 153, as discussed further below.

Figure 26B:
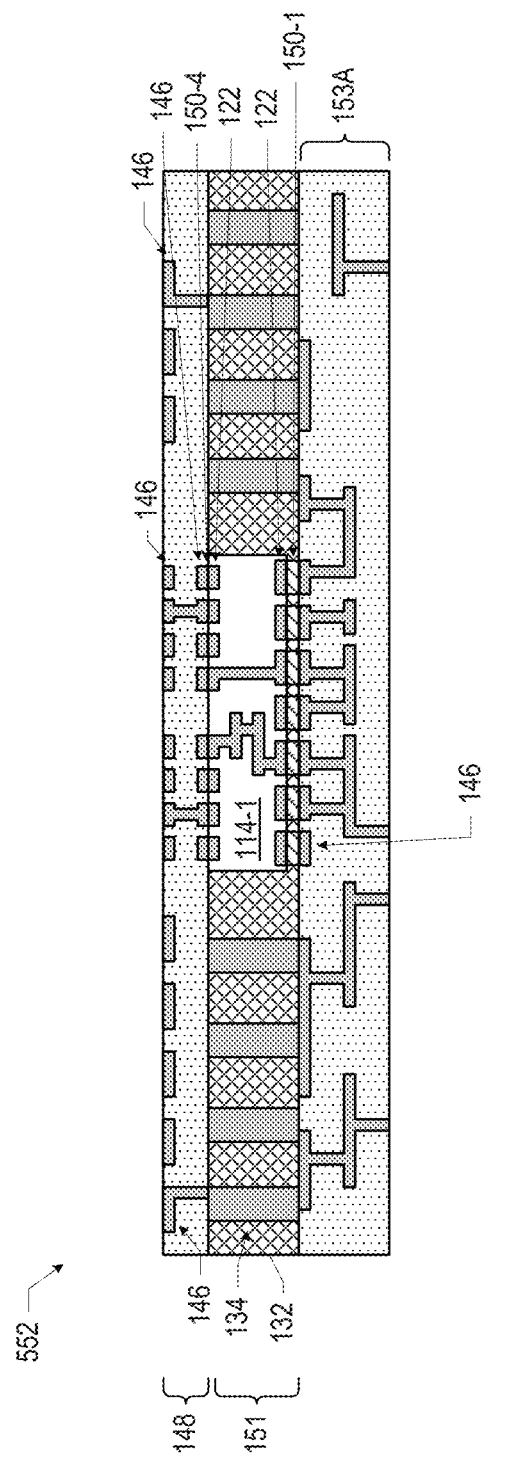

FIG. 26B illustrates an assembly 552 subsequent to attaching a die 114-1 to the assembly 550 (FIG. 26A), providing a mold material 132 around the conductive pillars 134 and the die 114-1 to complete the package substrate portion 151, and forming a package substrate portion 148 on the package substrate portion 151. These operations may take any of the forms discussed above.

Figure 26C:
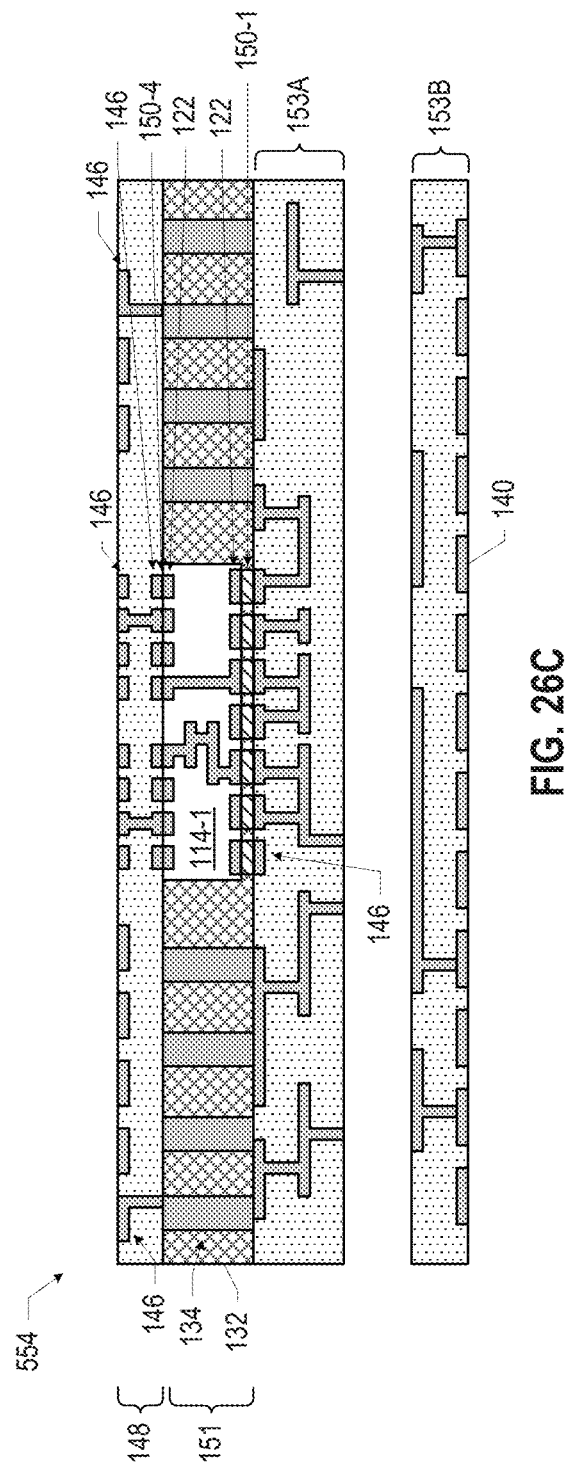

FIG. 26C illustrates an assembly 554 subsequent to bringing the assembly 552 (FIG. 26B) into alignment with a package substrate sub-portion 153B. In particular, the package substrate sub-portion 153A may be brought proximate to the package substrate sub-portion 153B.

Figure 26D:
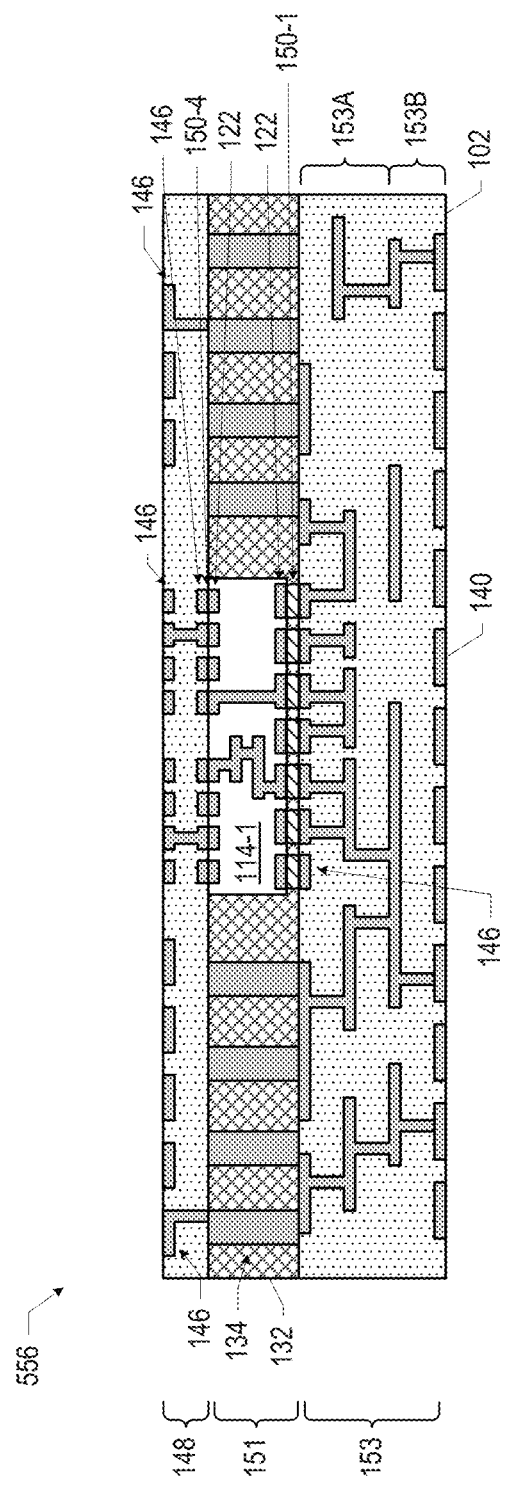

FIG. 26D illustrates an assembly 556 subsequent to coupling the package substrate sub-portion 153A and the package substrate sub-portion 153B of the assembly 554 (FIG. 26C) together to form the package substrate portion 153. The dies 114-2, 114-3, and 114-4 may be attached to the top surface of the package substrate portion 148 (e.g., in accordance with any of the techniques discussed above with reference to FIG. 23B, such as solder or anisotropic conductive material techniques) to form the quantum computing assembly 100 of FIG. 21.

Figure 27:
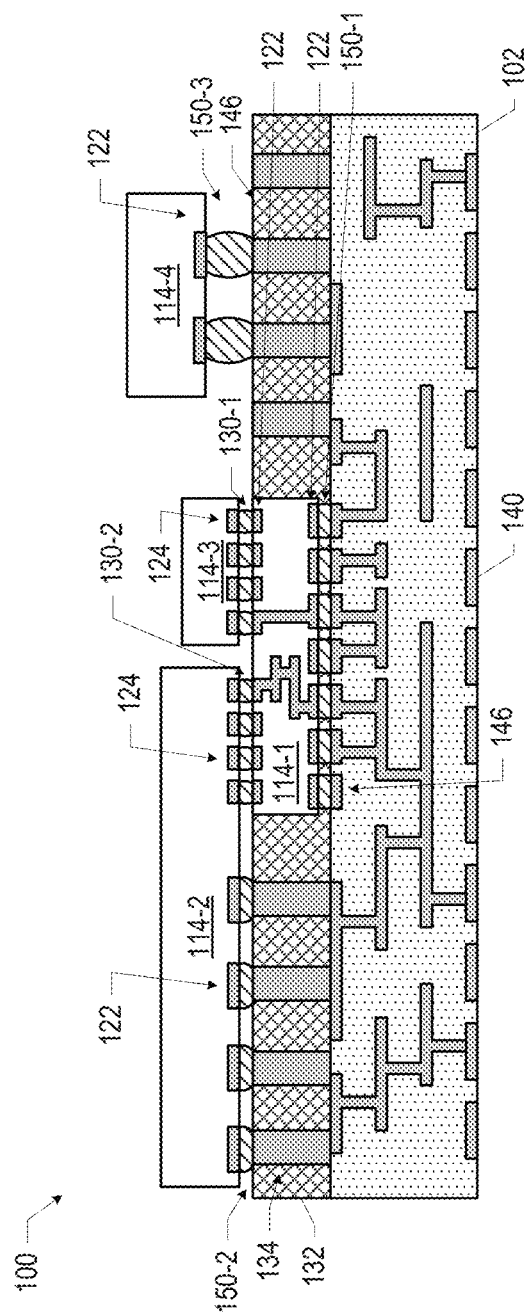
FIG. 27 is a side, cross-sectional view of an example quantum computing assembly, in accordance with various embodiments.

The quantum computing assemblies 100 disclosed herein may include conductive pillars 134 in the package substrate 102 even when the die 114-1 is not embedded in the package substrate 102 (e.g., even when no package substrate portion 148 is present). For example, FIG. 27 illustrates an example quantum computing assembly 100 in which the package substrate 102 includes conductive pillars 134 without a package substrate portion 148. In the quantum computing assembly 100 of FIG. 27, the conductive contacts 122 at the bottom surface of the die 114-2 are coupled to the conductive pillars 134 via DTPS interconnects 150-2, and the conductive contacts 124 at the bottom surface of the die 114-2 are coupled to the conductive contacts 122 at the top surface of the die 114-1 via DTD interconnects 130-2. Any of the other quantum computing assemblies 100 disclosed herein may include conductive pillars 134, as appropriate.

Communications between the die 114-1 and the die 114-2 may experience less delay than if such communications were routed through an intermediate device (e.g., a separate silicon bridge). In some embodiments, the pitch of the DTD interconnects 130-1 between the die 114-1 and the die 114-2 may be less than 100 microns (e.g., between 25 microns and 55 microns) and the pitch of the DTPS interconnects 150-2 between the die 114-2 and the package substrate 102 may be greater than 80 microns (e.g., between 100 microns and 150 microns).

More generally, the quantum computing assemblies 100 disclosed herein may allow "blocks" of different kinds of functional circuits to be distributed into different ones of the dies 114, instead of having all of the circuits included in a single large die, per some conventional approaches. Distributing different circuit elements into different dies may improve yield (e.g., by reducing the cost and size of individual dies, and thus reducing the waste generated in rejecting a die), improve performance (e.g., by allowing a manufacturer to select the dies with the best performance to include in a quantum computing assembly 100), and/or increase design flexibility (e.g., by allowing dies formed using different fabrication technologies to be readily swapped to achieve different functionality). Additionally, a die 114 stacked on top of another die 114 may be closer to the heat spreader 131 than if the circuitry of the two dies were combined into a single die farther from the heat spreader 131, improving thermal performance.

In another example, a die 114-1 that includes active circuitry in a quantum computing assembly 100 may be used to provide an "active" bridge between other dies 114 (e.g., between the dies 114-2 and 114-3, or between multiple different dies 114-2, in various embodiments). In some such embodiments, power delivery may be provided to the "bottoms" of the die 114-1 and the other dies 114 through the package substrate 102 without requiring additional layers of package substrate 102 above the die 140-1 through which to route power.

As noted above, in various embodiments, the dies 114 included in a quantum computing assembly 100 may be packaged or unpackaged dies. Examples of packaged dies may include wafer level chip scale packages, chip scale packages, embedded wafer level ball grid array packages, and ball grid array packages, among others. Further, in some embodiments, one or more of the dies 114 included in a quantum computing assembly 100 may be composite dies; a composite die itself may be a quantum computing assembly 100. As used herein, a "composite die" may refer to an assembly of multiple packaged or unpackaged dies that can be treated as a monolithic unit when coupling the composite die to a package substrate 102, another die 114, etc. Further, various ones of the quantum computing assemblies 100 disclosed herein may be formed by first assembling different ones of the dies 114 into a composite die, and then performing further assembly operations with the composite die (e.g., as discussed above with reference to FIG. 17).

Figure 30:
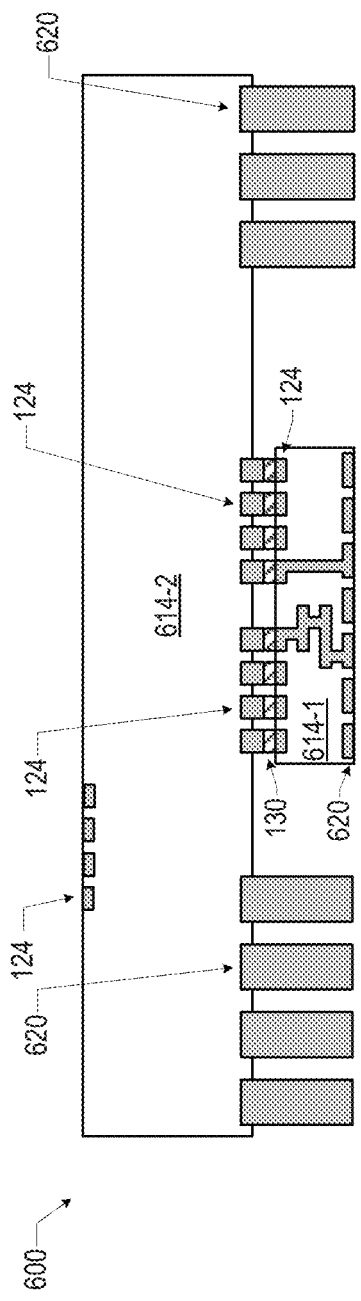

FIGS. 28-30 are side, cross-sectional views of example composite dies 600, in accordance with various embodiments. For example, FIG. 28 illustrates a composite die 600 including a die 614-1 and the die 614-2. The die 614-1 may be a double-sided die, and may take the form of any of the dies 114-1 disclosed herein. As illustrated in FIG. 28, the die 614-1 may have conductive contacts 620 at its bottom surface (which may be conductive contacts 122 or conductive contacts 124, as discussed in further detail below), and the die 614-1 may have conductive contacts 124 at its top surface. The conductive contacts 124 at the top surface of the die 614-1 may be coupled to conductive contacts 124 at the bottom surface of the die 614-2 by DTD interconnects 130. In the embodiment of FIG. 28, the die 614-2 may be a single-sided die as shown, and may take the form of any of the single-sided dies disclosed herein. The DTD interconnects 130 may take the form of any of the DTD interconnects 130 disclosed herein.

In some embodiments, the die 614-1 in a composite die 600 may be "entirely under" the die 614-2; that is, the footprint of the die 614-1 may be entirely contained in, and may be strictly smaller than, the footprint of the die 614-2. An example of such an arrangement as illustrated in FIG. 28, and other examples are illustrated in FIGS. 29-36.

The bottom surface of the die 614-2 may include conductive contacts to which the die 614-1 is not coupled. For example, FIG. 28 illustrates an embodiment in which the die 614-2 includes conductive contacts 620 at its bottom surface (which may be conductive contacts 122 or conductive contacts 124, as discussed in further detail below). The conductive contacts 620 of the dies 114 included in a composite die 600 may serve as the "outward facing" conductive contacts for the composite die 600 (e.g., the conductive contacts to which other components, such as a package substrate 102 or other dies 114, may couple). In the embodiment of FIG. 28, the die 614-1 also includes such conductive contacts 620. Different subsets of the conductive contacts 620 of a composite die 600 may have different pitches; for example, the conductive contacts 620 at the bottom surface of the die 614-1 may have a different pitch than the conductive contacts 620 at the bottom surface of the die 614-2, and/or different subsets of the conductive contacts 620 at the bottom surface of the die 614-2 may have different pitches. In some embodiments, the footprint of the conductive contacts 620 of the die 614-2 may be outside of and/or surround the footprint of the die 614-1 (e.g., as illustrated in FIG. 28). In some embodiments, the die 614-2 may include conductive pathways between the conductive contacts 124 and the conductive contacts 620 at the bottom surface of the die 614-2; these conductive pathways may serve to route some of the signals from the die 614-1 to the "periphery" of the die 614-2, and then to another component to which the conductive contact 620 of the die 614-2 is coupled (e.g., a package substrate 102 or another die 114).

As noted above, only a subset of the accompanying figures are labeled with reference numerals representing dimensions, but this is simply for clarity of illustration, and any of the quantum computing assemblies 100 disclosed herein may have components having the dimensions discussed herein. In some embodiments, the die 614-1 may be substantially thinner than the die 614-2. For example, in some embodiments, the thickness 187 of the die 614-1 may be between 10 microns and 100 microns (e.g., between 10 microns and 30 microns), while the thickness 185 of the die 614-2 may be between 10 microns and 780 microns (e.g., between 50 microns and 750 microns, between 50 microns and 400 microns, or between 50 microns and 300 microns). In such embodiments, the thicker die 614-2 may thus provide mechanical stability to the thinner die 614-1, and thus handling the composite die 600 may reduce the risk of mechanical damage to the die 614-1 relative to assembly operations in which the die 614-1 is handled independently.

In some embodiments, the conductive contacts 620 at the bottom surface of the die 614-2 may be metal posts (e.g., copper posts) that extend away from the bottom surface of the die 614-2. Such an embodiment is illustrated in FIG. 28. In some embodiments, the conductive contacts 620 at the bottom surface of the die 614-2 may have a height 181 (measured from the bottom surface of the die 614-2) between 5 microns and 80 microns (e.g., between 10 microns and 40 microns). In various embodiments, the height 181 of the conductive contacts 620 at the bottom surface of the die 614-2 may be greater than, equal to, or less than the distance 189 between the bottom surface of the die 614-1 and the bottom surface of the die 614-2.

In some embodiments, the conductive contacts 124 at the bottom surface of the die 614-2 may be metal posts (e.g., copper posts) that extend away from the bottom surface of the die 614-2. Such an embodiment is illustrated in FIG. 28. In some embodiments, the conductive contacts 124 at the bottom surface of the die 614-2 may have a height 183 (measured from the bottom surface of the die 614-2) between 1 micron and 10 microns (e.g., 5 microns). The height 183 may be less than the height 181, in some embodiments.

In some embodiments, multiple dies 614-1 may be coupled to a die 614-2 in a composite die 600. For example, FIG. 29A is a side view of an embodiment of a composite die 600 in which two dies 614-1 are coupled to a bottom surface of the die 614-2. The composite die 600 of FIG. 29A also includes conductive contacts 620 at the bottom surfaces of the dies 614-1, and conductive contacts 620 at the bottom surface of the die 614-2; the dies 614-1, the die 614-2, and the conductive contact 620 of these dies 614 may take any of the forms discussed above. Although the composite die 600 of FIG. 29A includes two dies 614-1, a composite die 600 may include any number of dies 614-1 (e.g., 3, 4, or more dies 614-1). For example, FIG. 29B is a top view of an embodiment of a composite die 600 in which an array of dies 614-1 (shown in dotted lines) are coupled to a bottom surface of the die 614-2, in accordance with any of the embodiments disclosed herein.

In some embodiments, the die 614-2 in a composite die 600 may be a double-sided die, and thus the composite die 600 may be a double-sided die. For example, FIG. 30 illustrates a composite die 600 that is similar to the composite die 600 of FIG. 28, but in which the die 614-2 has conductive contacts 124 at its top surface, and is thus a double-sided die. The die 614-2 of FIG. 30 may take the form of any of the double-sided dies disclosed herein, and a double-sided composite die 600 may be used in the place of any of the double-sided dies disclosed herein (e.g., the dies 114-1).

Figure 31:
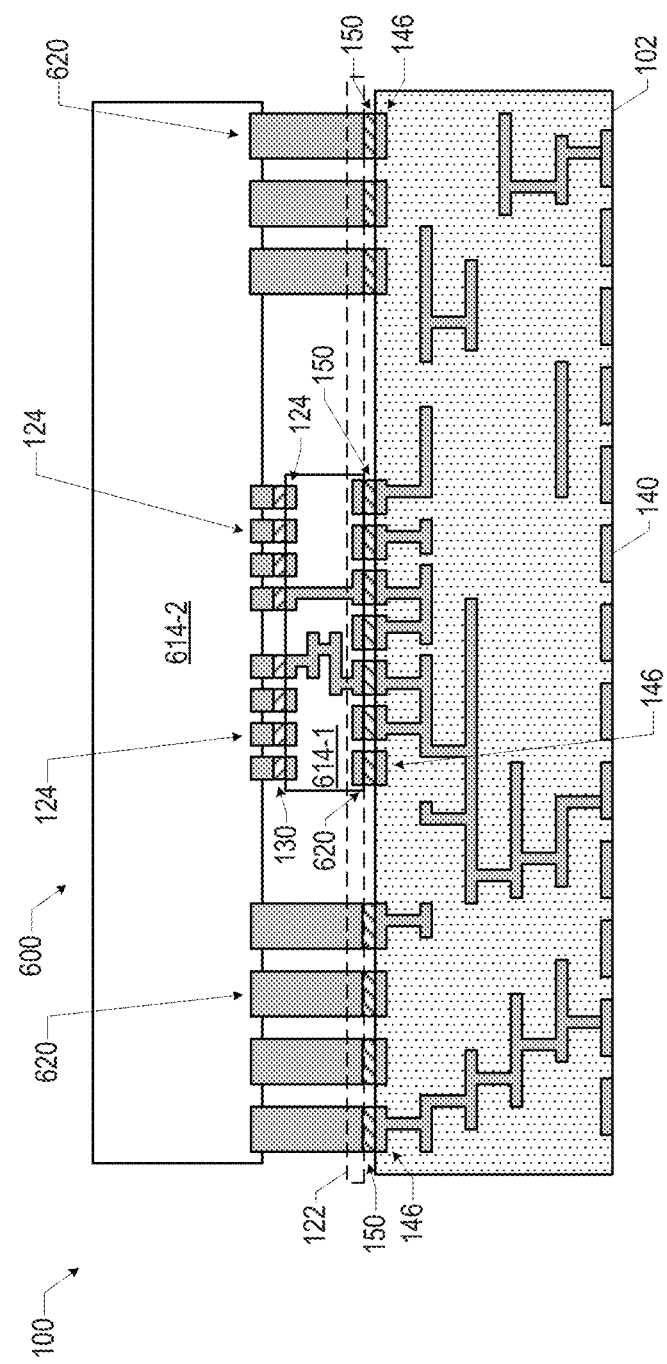
FIGS. 31-34 are side, cross-sectional views of example quantum computing assemblies including example composite dies, in accordance with various embodiments.

As noted above, the conductive contacts 620 of a composite die 600 may be coupled to a package substrate 102, a die 114, and/or any other component. FIGS. 31-34 are side, cross-sectional views of example quantum computing assemblies 100 including example composite dies 600, in accordance with various embodiments. FIG. 31 illustrates a quantum computing assembly 100 in which the composite die 600 of FIG. 28 is coupled to a package substrate 102. In particular, the conductive contacts 620 of the composite die 600 (on the bottom surfaces of the die 614-1 and the die 614-2) may be coupled to conductive contacts 146 at the top surface of the package substrate 102 by DTPS interconnects 150. Thus, in the embodiment of FIG. 31, the conductive contacts 620 of the composite die 600 may serve as conductive contacts 122 (the conductive contacts on the die side of a set of DTPS interconnects 150).

Figure 32:
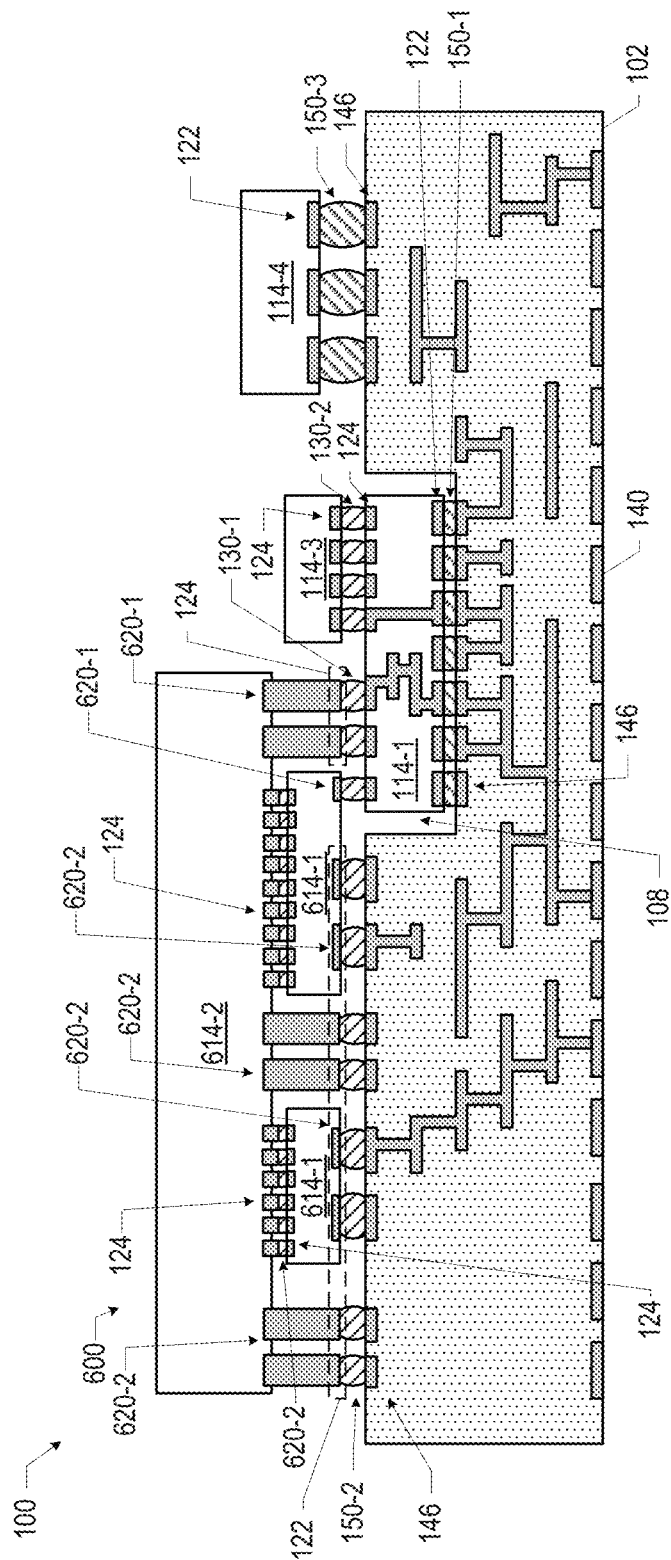

FIG. 32 illustrates a quantum computing assembly 100 similar to the quantum computing assembly 100 of FIG. 3, but in which the composite die 600 of FIG. 29A takes the place of the die 114-2 of FIG. 3. In particular, some of the conductive contacts 620 of the composite die 600 of FIG. 32 are coupled to conductive contacts 146 of the package substrate by DTPS interconnects 150-2, and others of the conductive contacts 620 of the composite die 600 of FIG. 32 are coupled to conductive contacts 124 of the die 114-1 by DTD interconnects 130-1. As illustrated in FIG. 32, the conductive contacts 620-1 of one of the dies 614-1 and the die 614-2 may be coupled to the conductive contacts 124 of the die 114-1 by DTD interconnects 130-1, and the conductive contacts 620-2 of the dies 614-1 and the die 614-2 may be coupled to the conductive contacts 146 of the package substrate 102 by DTPS interconnects 150-2. Thus, some of the conductive contacts 620 of the composite die 600 may serve as conductive contacts 122 (the conductive contacts on the die side of a set of DTPS interconnects 150-2) and some of the conductive contact 620 of the composite die 600 may serve as conductive contacts 124 (the conductive contacts on one side of a set of DTD interconnects 130-1). FIG. 32 is thus an example of an embodiment in which a composite die 600 may be directly coupled to both the package substrate 102 and a die 114-1; more generally, a composite die 600 may take the place of any of the dies 114-2 (or any of the other dies 114, such as the dies 114-1) disclosed herein.

Figure 33:
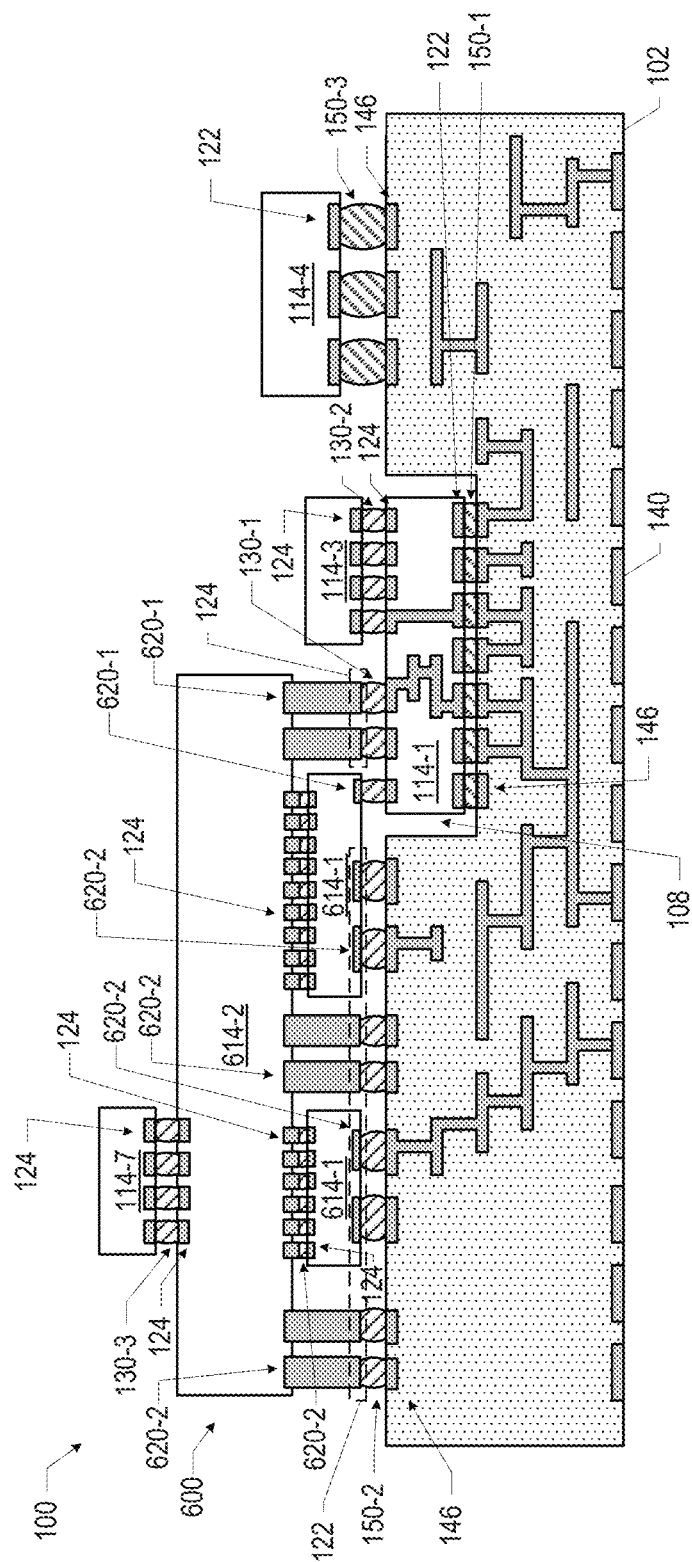

FIG. 33 illustrates a quantum computing assembly 100 similar to the quantum computing assembly 100 of FIG. 6, but in which the composite die 600 of FIG. 30 takes the place of the die 114-7 of FIG. 6. As was discussed above with reference to FIG. 32, in the embodiment of FIG. 33, the conductive contacts 620-1 of one of the dies 614-1 and the die 614-2 may be coupled to the conductive contacts 124 of the die 114-1 by DTD interconnects 130-1, and the conductive contacts 620-2 of the dies 614-1 and the die 614-2 may be coupled to the conductive contacts 146 of the package substrate 102 by DTPS interconnects 150-2. Additionally, a die 114-7 may have conductive contacts 124 at its bottom surface; these conductive contacts 124 may be coupled to conductive contacts 124 at the top surface of the die 614-2 by DTD interconnects 130-3. More generally, as noted above, a double-sided composite die 600 may be used in the place of any of the double-sided dies 114 disclosed herein.

Figure 34:
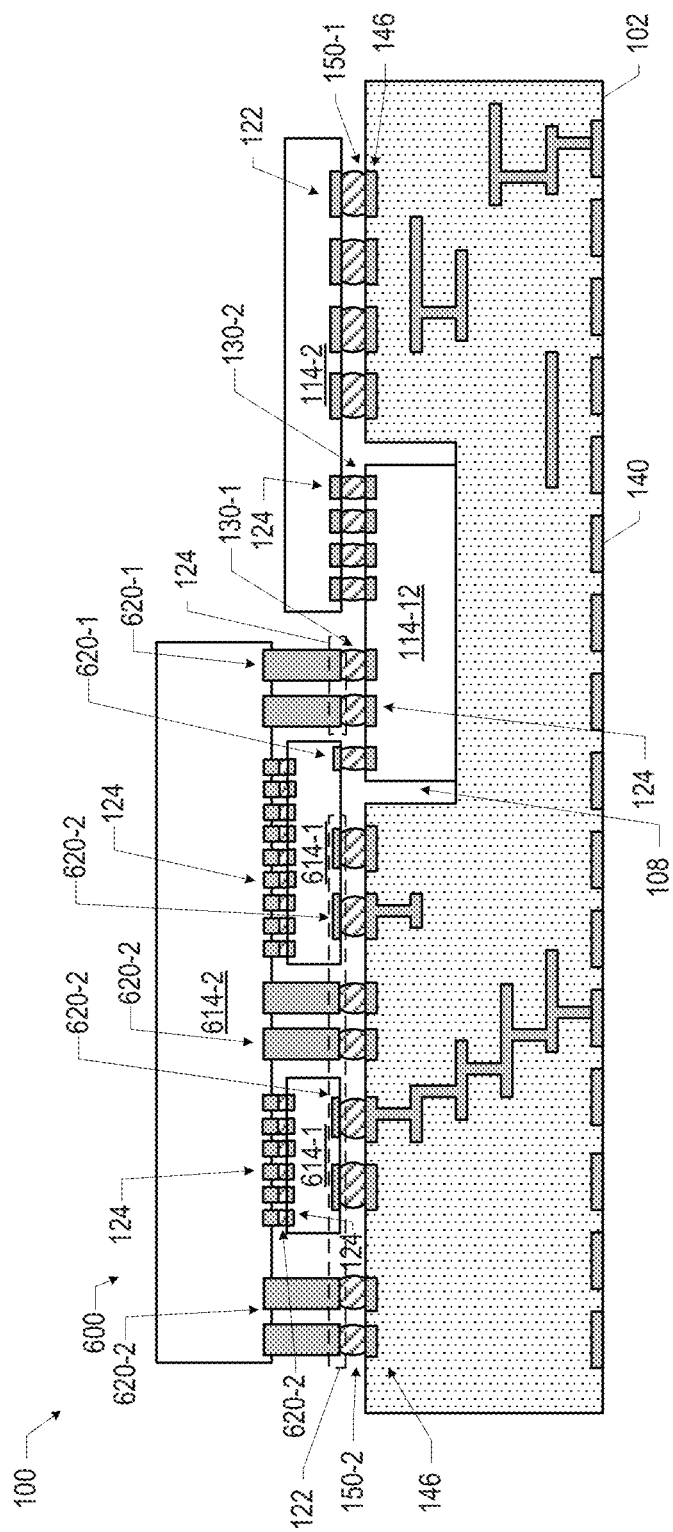

FIG. 34 illustrates a quantum computing assembly 100 similar to the quantum computing assembly 100 of FIG. 32, but in which a single-sided die 114-12 is disposed in the recess 108 and bridges the composite die 600 and another die 114-2. The single-sided die 114-12 may be referred to as an "embedded bridge," and may not have conductive contacts at its bottom surface. In the embodiment of FIG. 34, the conductive contacts 620-1 of one of the die 614-1 and the die 614-2 may be coupled to some of the conductive contacts 124 of the die 114-12 by DTD interconnects 130-1, and the conductive contacts 620-2 of the die 614-1 and the die 614-2 may be coupled to conductive contacts 146 of the package substrate 102 by DTPS interconnects 150-2. Additionally, conductive contacts 124 at the bottom surface of the die 114-2 may be coupled to others of the conductive contacts 124 of the die 114-12 by DTD interconnects 130-2, and conductive contacts 122 at the bottom surface of the die 114-2 may be coupled to conductive contacts 146 of the package substrate 102 by DTPS interconnects 150-1. The "embedded bridge" die 114-12 may provide conductive pathways through which the composite die 600 and the die 114-2 may communicate.

Figure 35:
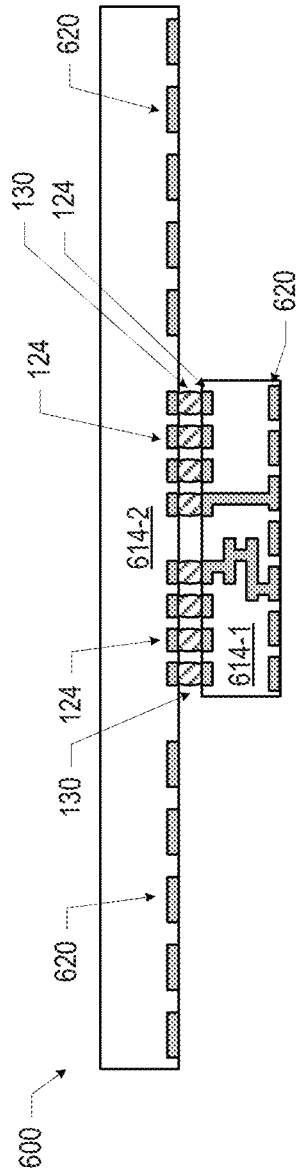
FIG. 35 is a side, cross-sectional view of another example composite die, in accordance with various embodiments.
Figure 36:
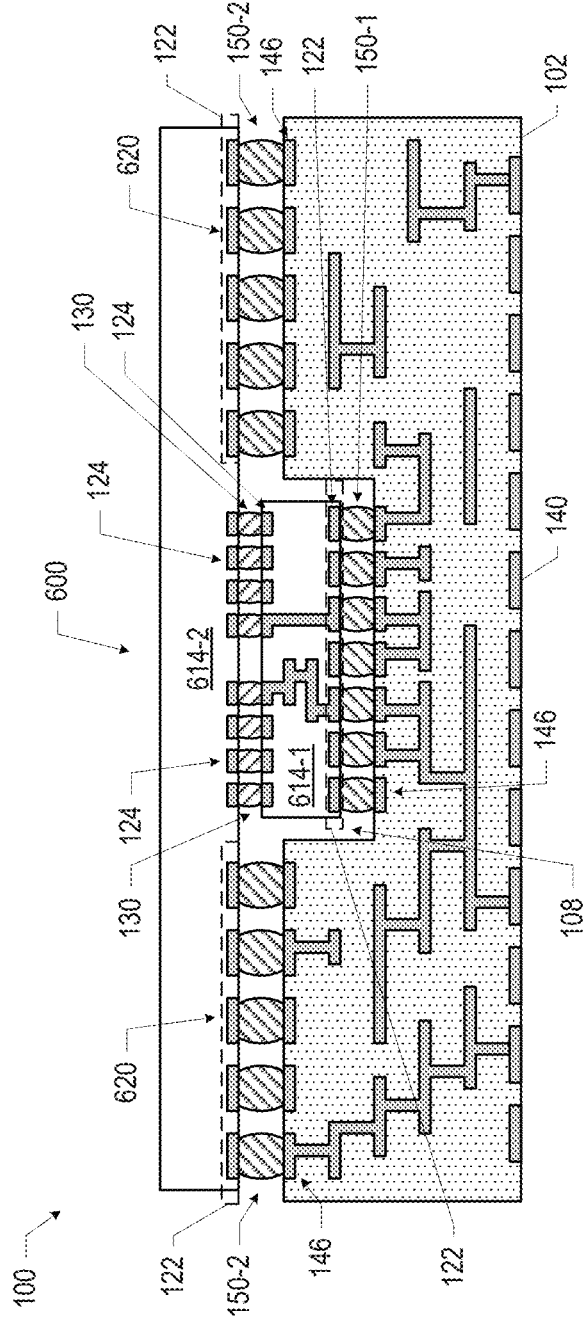
FIG. 36 is a side, cross-sectional view of an example quantum computing assembly including the composite die of FIG. 35, in accordance with various embodiments.

As noted above, in some composite dies 600, the distance 189 from the bottom surface of the dies 614-2 to the bottom surface of the die 614-1 may be greater than the height 181 of the conductive contacts 620 of the die 614-2. For example, FIG. 35 is a side, cross-sectional view of an example of such a composite die 600, in accordance with various embodiments, and FIG. 36 is a side, cross-sectional view of an example quantum computing assembly 100 including the composite die 600 of FIG. 35, in accordance with various embodiments. In the quantum computing assembly 100 of FIG. 36, the die 614-1 may extend into a recess 108 in the package substrate 102. In the embodiment of FIG. 36, like the embodiment of FIG. 31, the conductive contacts 620 of the composite die 600 may serve as conductive contacts 122 (the conductive contacts on the die side of a set of DTPS interconnects 150).

Any suitable techniques may be used to manufacture the composite die 600 (and related quantum computing assemblies 100) disclosed herein. For example, FIGS. 37A-37E are side, cross-sectional views of various stages in an example process for manufacturing the quantum computing assembly 100 of FIG. 31, in accordance with various embodiments. In some embodiments, only the operations of FIGS. 37A-37C may be performed to form the composite die 600. In some embodiments, operations like those discussed below with reference to FIG. 37B may be performed to couple the composite die 600 to another die (e.g., a die 114). In some embodiments, operations like those discussed below with reference to FIG. 37D or FIG. 37E may be performed to couple the composite die 600 to a package substrate (e.g., a package substrate 102).

FIG. 37A illustrates an assembly 360 including a carrier 202 and a die 614-2 disposed on the carrier 202. The carrier 202 may take the form of any of the carriers disclosed herein. The die 614-2 may be arranged "upside down" on the carrier 202 so that the conductive contacts 124 and the conductive contacts 620 of the die 614-2 are exposed. In some embodiments, the die 614-2 of the assembly 360 may not be disposed on a carrier 202, but may instead be included in a wafer (not shown) that includes multiple copies of the die 614-2. In embodiments in which the die 614-2 is disposed on a carrier 202 in the assembly 360, the die 614-2 may have been singulated from other dies 614-2 in a wafer before inclusion in the assembly 360. In some such embodiments, the die 614-2 may be overmolded on the carrier 202 (e.g., with a mold material 127, not shown), and the mold material may be polished back to expose the conductive contacts 620 and the conductive contacts 124 of the die 614-2; further metal may then be deposited on the conductive contacts 620 as needed to achieve a desired height (the height 181, not shown). As noted above, in some embodiments, the die 614-2 may be a packaged die (e.g., a wafer level chip scale package, a chip scale package, an embedded wafer level ball grid array package, a ball grid array package, etc.).

Figure 37B:
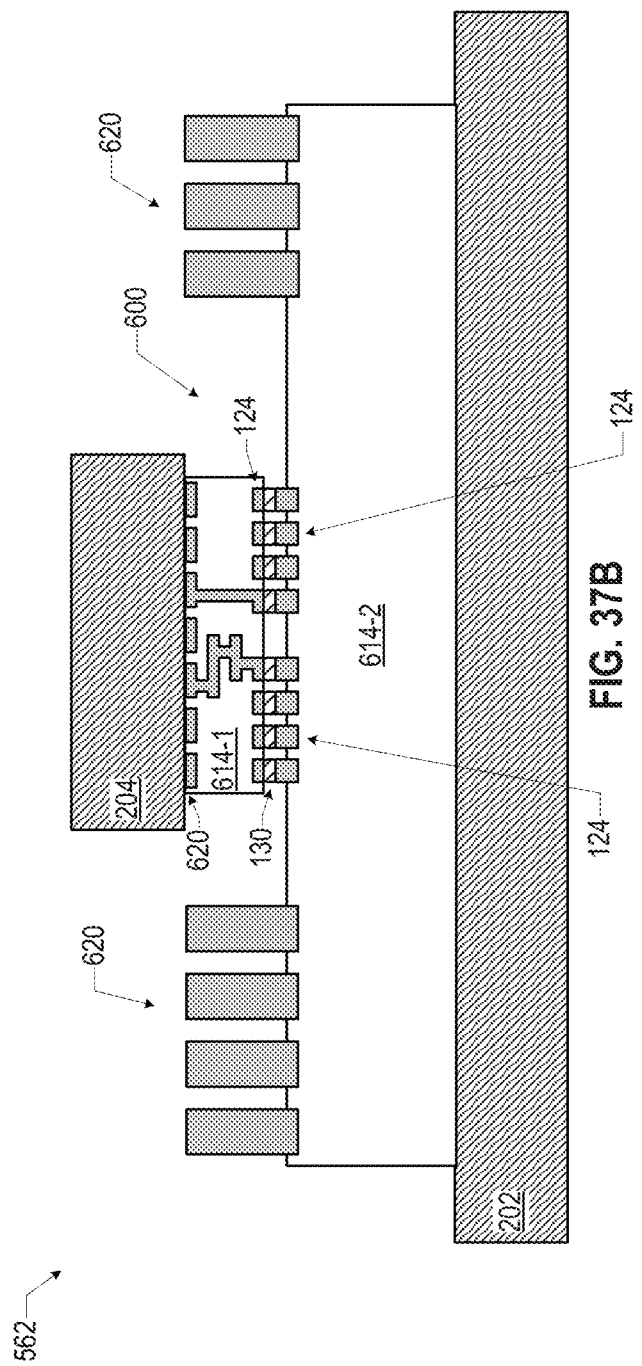

FIG. 37B illustrates an assembly 562 subsequent to coupling the die 614-1 to the die 614-2 of the assembly 560 (FIG. 37A). In some embodiments, the die 614-1 may be secured to a carrier 204 for improved handling while it is coupled to the die 614-2. The interconnects 130 between the die 614-1 and the die 614-2 may take any of the forms disclosed herein (e.g., metal-to-metal bonding, anisotropic conductive material interconnects, solder interconnects, etc.). In embodiments in which the die 614-2 of the assembly 560 is part of a wafer of multiple ones of the dies 614-2, the die 614-1 may be attached to the die 614-2 in a die-to-wafer bonding operation. In embodiments in which the die 614-2 is singulated from a wafer before the die 614-1 is attached, the die 614-1 may be attached to the die 614-2 in a die-to-die bonding operation. In some embodiments, a carrier 204 may not be used.

FIG. 37C illustrates an assembly 564 subsequent to removing the carrier 204 from the assembly 562 (FIG. 37B). In some embodiments, the carrier 204 may have been secured to the die 614-1 using a layer of release material whose adhesion may be reduced by the provision of laser energy, thermal energy, chemical energy, etc. In some embodiments, a mold material (e.g., the mold material 127 discussed above) may be provided on the assembly 564 (not shown) and then polished back to expose the conductive contacts 620. The dies 614-1 and 614-2 in the assembly 564 may form a composite die 600.

Figure 37D:
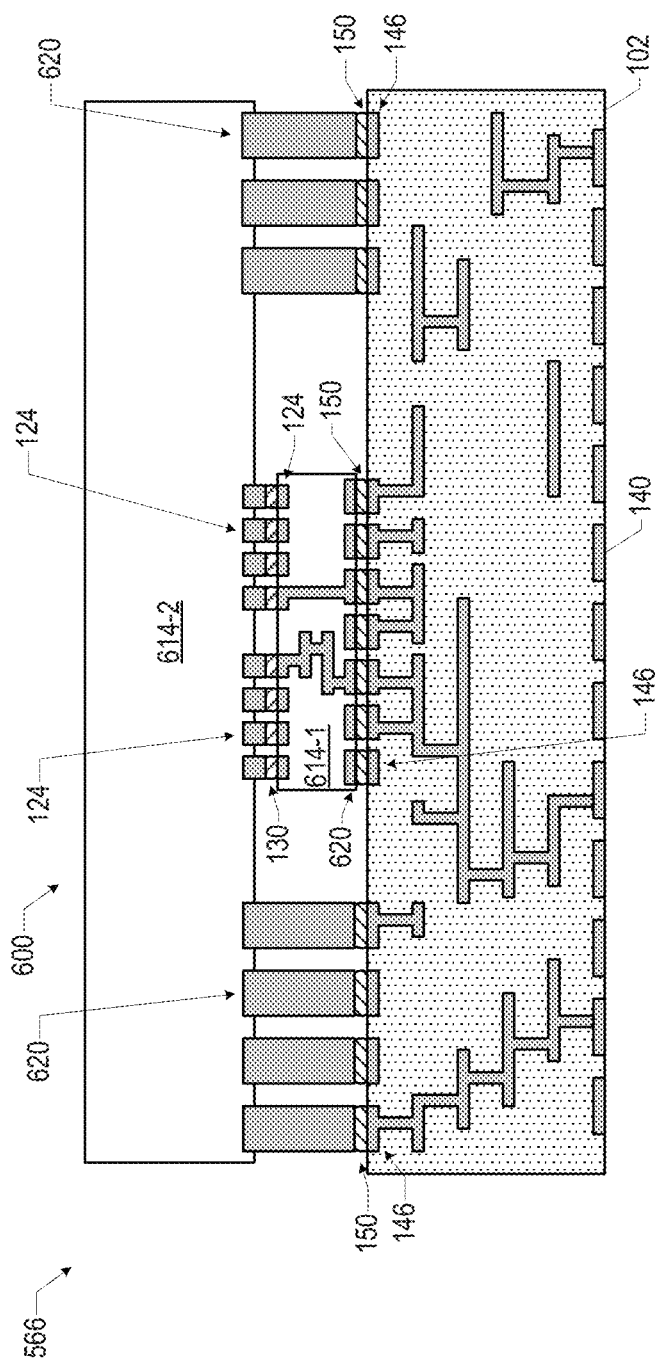

FIG. 37D illustrates an assembly 566 subsequent to forming interconnects 150 between the composite die 600 of the assembly 364 (FIG. 37C) and a package substrate 102, and removing the carrier 202. The interconnects 150 may be formed in accordance with any of the techniques disclosed herein (e.g., as discussed above with reference to FIGS. 17E and 17F), and the assembly 566 may take the form of the quantum computing assembly 100 of FIG. 31. In some embodiments, the carrier 202 may be removed by activating a release layer or by polishing the carrier 202 away. If the die 114-2 was part of a wafer at the time die 114-1 was attached, the wafer (and any mold material) may be cut to singulate the dies 114-2 before the composite die 600 is coupled to the package substrate 102.

Figure 37E:
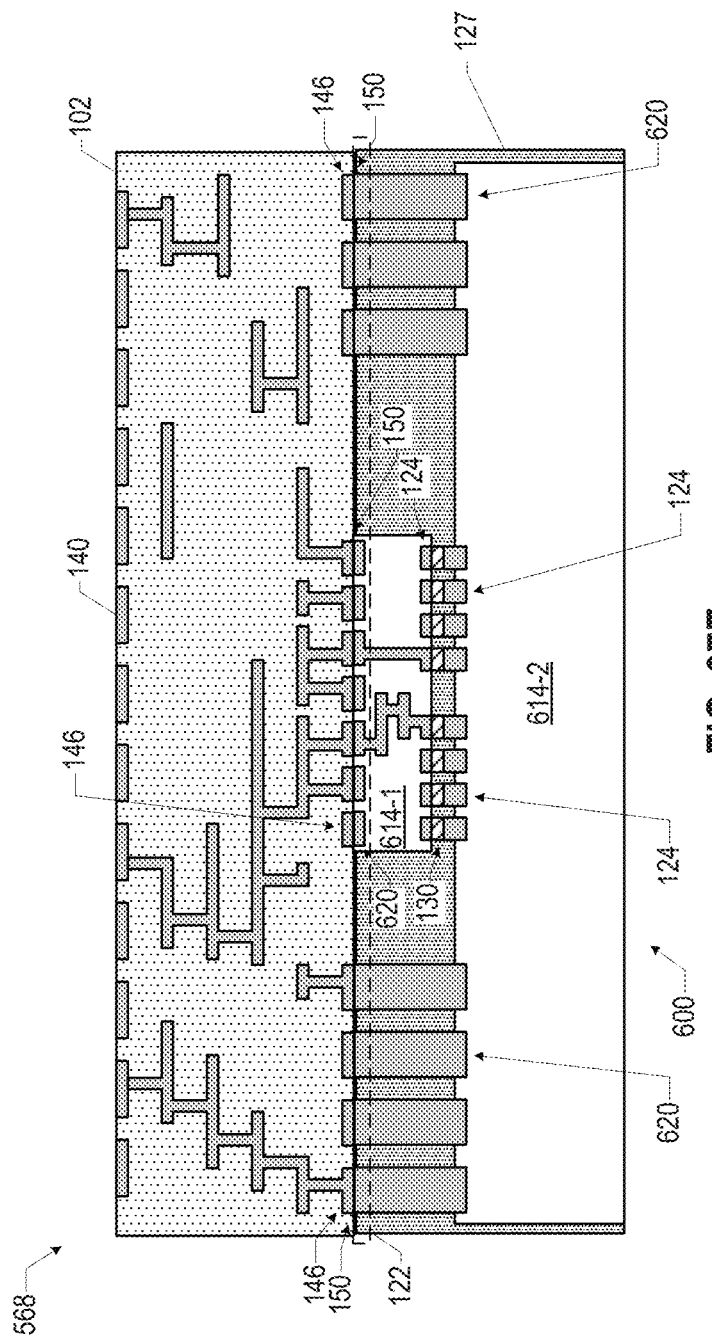

In some embodiments, the package substrate 102 of a quantum computing assembly 100 may be at least partially "built up" on a composite die 600. For example, FIG. 37E illustrates an assembly 568 subsequent to forming the package substrate 102 on the composite die 600 (e.g., using any of the techniques discussed above with reference to FIG. 19G or FIG. 25D). In such embodiments, the interconnects 150 between the conductive contacts 620 of the composite die 600 and the conductive contacts 146 of the package substrate 102 may be plated interconnects, as discussed above.

In some embodiments, the die 614-2 may be built on a different material system then the die 614-1. For example, in some embodiments, the die 614-1 may include a silicon or germanium die substrate, and the die 614-2 may include a III-V material die substrate (or vice versa). In another example, the die 614-1 may include a sapphire substrate, and the die 614-2 may include a semiconductor substrate (or vice versa). More generally, any different ones of the dies 114 of the quantum computing assemblies 100 disclosed herein may be built on substrates having different material compositions.

Figure 38:
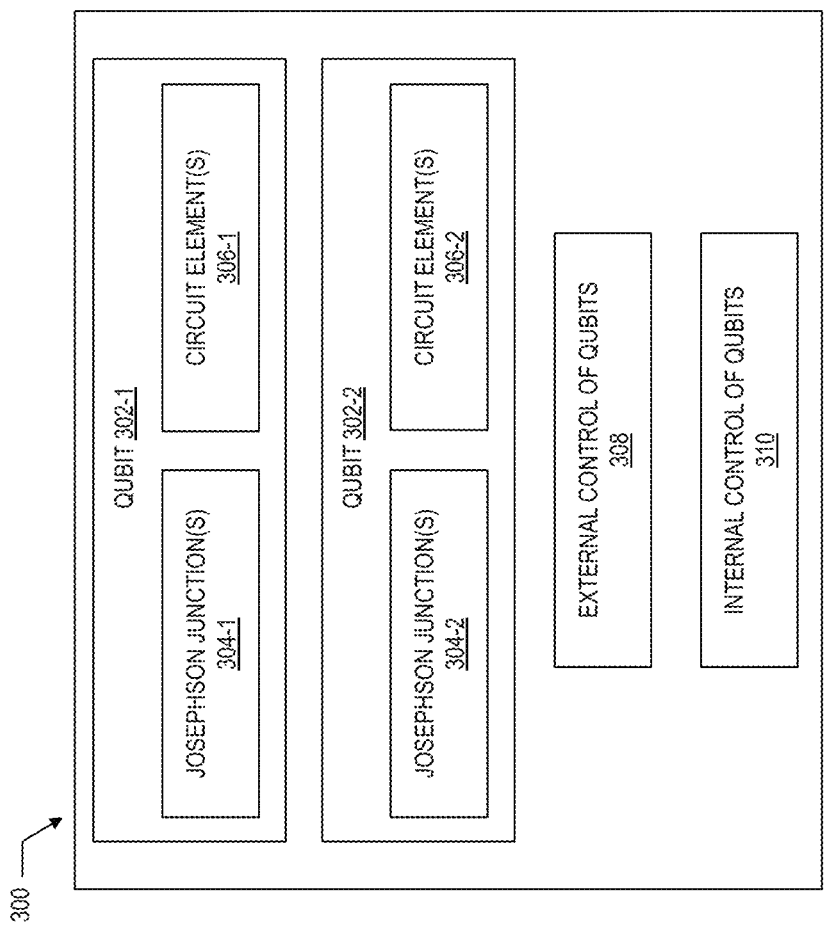
FIG. 38 is a block diagram of an example superconducting qubit-type quantum device, in accordance with various embodiments.
Figure 39:
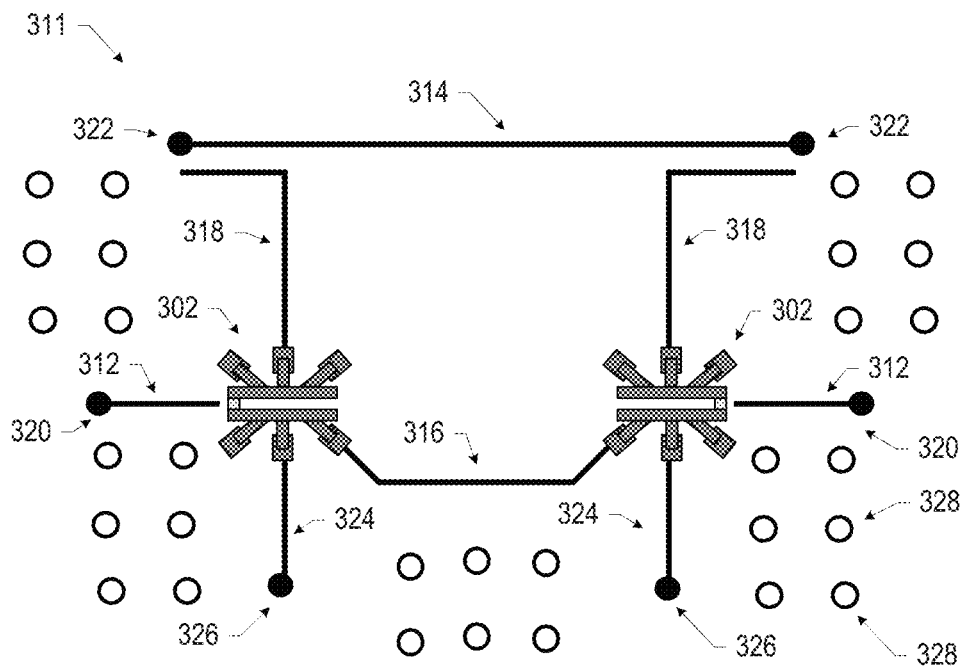
FIGS. 39 and 40 illustrate example physical layouts of superconducting qubit-type quantum devices, in accordance with various embodiments.
Figure 40:
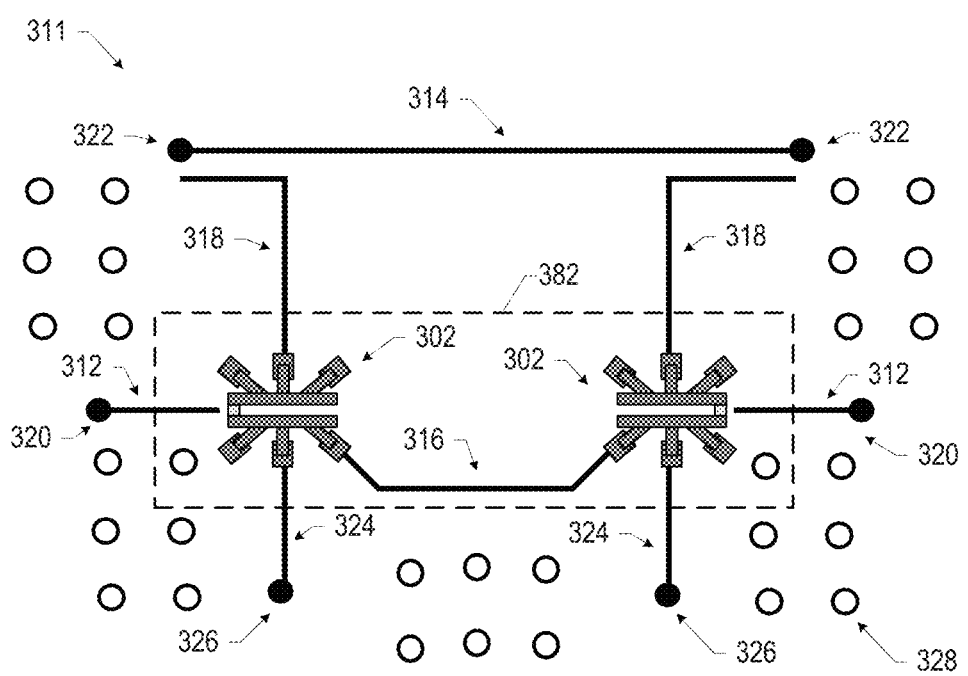

Any of the quantum computing assemblies 100 disclosed herein may include quantum computing circuitry distributed in any suitable manner between the dies therein (e.g., the dies 114 or 614). FIGS. 38-42 discuss various examples of quantum computing circuitry that may be distributed among the dies of any of the quantum computing assemblies 100 disclosed herein. FIGS. 38-40 discuss example embodiments in which the quantum computing circuitry is superconducting qubit-type quantum computing circuitry, and FIGS. 41-42 discuss example embodiments in which the quantum computing circuitry is spin qubit-type quantum computing circuitry.

The operation of superconducting qubit-type quantum devices may be based on the Josephson effect, a macroscopic quantum phenomenon in which a supercurrent (a current that, due to zero electrical resistance, flows for indefinitely long without any voltage applied) flows across a device known as a Josephson junction. Examples of superconducting qubit-type quantum devices may include charge qubits, flux qubits, and phase qubits. Transmons, a type of charge qubit with the name being an abbreviation of "transmission line shunted plasma oscillation qubits," may exhibit reduced sensitivity to charge noise, and thus may be particularly advantageous. Transmon-type quantum devices may include inductors, capacitors, and at least one nonlinear element (e.g., a Josephson junction) to achieve an effective two-level quantum state system.

Josephson junctions may provide the central circuit elements of a superconducting qubit-type quantum device. A Josephson junction may include two superconductors connected by a weak link. For example, a Josephson junction may be implemented as a thin layer of an insulating material, referred to as a barrier or a tunnel barrier and serving as the "weak link" of the junction, sandwiched between two layers of superconductor. Josephson junctions may act as superconducting tunnel junctions. Cooper pairs may tunnel across the barrier from one superconducting layer to the other. The electrical characteristics of this tunneling are governed by the Josephson relations. Because the inductance of a Josephson junction is nonlinear, when used in an inductor-capacitor circuit (which may be referred to as an LC circuit) in a transmon-type quantum device, the resulting circuit has uneven spacing between its energy states. In other classes of superconducting qubit-type quantum devices, Josephson junctions combined with other circuit elements may similarly provide the non-linearity necessary for forming an effective two-level quantum state to act as a qubit.

FIG. 38 is a block diagram of an example superconducting quantum circuit 300 that may be included in one or more dies of a quantum computing assembly 100. As shown in FIG. 38, a superconducting quantum circuit 300 includes two or more qubit elements, 302-1 and 302-2. Qubit elements 302-1 and 302-2 may be identical and thus the discussion of FIG. 38 may refer generally to the "qubit elements 302"; the same applies to Josephson junctions 304-1 and 304-2, which may generally be referred to as "Josephson junctions 304," and to circuit elements 306-1 and 306-2, which may generally be referred to as "circuit elements 306." As shown in FIG. 38, each of the superconducting qubit elements 302 may include one or more Josephson junctions 304 connected to one or more other circuit elements 306, which, in combination with the Josephson junction(s) 304, may form a nonlinear circuit providing a unique two-level quantum state for the qubit. The circuit elements 306 could be, for example, capacitors in transmons or superconducting loops in flux qubits.

A superconducting quantum circuit 300 may include circuitry 308 for providing external control of qubit elements 302 and circuitry 310 for providing internal control of qubit elements 302. In this context, "external control" refers to controlling the qubit elements 302 from outside of the die that includes the qubit elements 302, including control by a user of a quantum computer, while "internal control" refers to controlling the qubit elements 302 within the die that includes the qubit elements 302. For example, if qubit elements 302 are transmon qubit elements, external control may be implemented by means of flux bias lines (also known as "flux lines" and "flux coil lines") and by means of readout and drive lines (also known as "microwave lines" since qubit elements are typically designed to operate with microwave signals), described in greater detail below. On the other hand, internal control lines for such qubit elements may be implemented by means of resonators (e.g., coupling and readout resonators, also described in greater detail below).

FIG. 39 illustrates an example of a physical layout 311 of a superconducting quantum circuit where qubit elements are implemented as transmons. Like FIG. 38, FIG. 39 illustrates two qubit elements 302. In addition, FIG. 39 illustrates flux bias lines 312, microwave lines 314, a coupling resonator 316, a readout resonator 318, and conductive contacts 320 and 322. The flux bias lines 312 and the microwave lines 314 may be viewed as examples of the external control circuitry 308 shown in FIG. 38.

Running a current through the flux bias lines 312, provided from the conductive contacts 320, enables the tuning of the frequency of the corresponding qubit elements 302 to which each line 312 is connected. For example, a magnetic field is created by running the current in a particular flux bias line 312. If such a magnetic field is in sufficient proximity to the qubit element 302, the magnetic field couples to the qubit element 302, thereby changing the spacing between the energy levels of the qubit element 302. This, in turn, changes the frequency of the qubit element 302 since the frequency is related to the spacing between the energy levels via Planck's equation. Provided there is sufficient multiplexing, different currents can be sent down each of the flux lines 312, allowing for independent tuning of the various qubit elements 302.

Typically, the qubit frequency may be controlled to bring the frequency either closer to or further away from another resonant element, such as a coupling resonator 316 as shown in FIG. 39 that connects two or more qubit elements 302 together. For example, if it is desired that a first qubit element 302 (e.g. the qubit element 302 shown on the left side of FIG. 39) and a second qubit element 302 (e.g. the qubit element 302 shown on the right side of FIG. 39) interact, via the coupling resonator 316 connecting these qubit elements, then both qubit elements 302 may be tuned at nearly the same frequency. In other scenarios, two qubit elements 302 could interact via a coupling resonator 316 at specific frequencies, but these three elements do not have to be tuned to be at nearly the same frequency with one another. Interactions between the qubit elements 302 can similarly be reduced or prevented by controlling the current in the appropriate flux bias lines. The state(s) of each qubit element 302 may be read by way of its corresponding readout resonator 318. As discussed below, the qubit element 302 may induce a resonant frequency in the readout resonator 318. This resonant frequency is then passed to the microwave lines 314 and communicated to the conductive contacts 322.

A readout resonator 318 may be provided for each qubit element. The readout resonator 318 may be a transmission line that includes a capacitive connection to ground on one side and is either shorted to ground on the other side (for a quarter-wavelength resonator) or has a capacitive connection to ground (for a half-wavelength resonator), which results in oscillations within the transmission line (resonance). The resonant frequency of the oscillations may be close to the frequency of the qubit element 302. The readout resonator 318 may be coupled to the qubit element 302 by being in sufficient proximity to the qubit element 302 (e.g., through capacitive or inductive coupling). Due to the coupling between the readout resonator 318 and the qubit element 302, changes in the state of the qubit element 302 may result in changes of the resonant frequency of the readout resonator 318. In turn, because the readout resonator 318 is in sufficient proximity to the microwave line 314, changes in the resonant frequency of the readout resonator 318 may induce changes in the current in the microwave line 314, and that current can be read externally via the conductive contacts 322.

The coupling resonator 316 may be used to couple different qubit elements together to realize quantum logic gates. The coupling resonator 316 may be similar to the readout resonator 318 in that it is a transmission line that may include capacitive connections to ground on both sides (for a half-wavelength resonator), which may result in oscillations within the coupling resonator 316. Each side of the coupling resonator 316 may be coupled (again, either capacitively or inductively) to a respective qubit element 302 by being in sufficient proximity to the qubit element 302. Because each side of the coupling resonator 316 couples with a respective different qubit element 302, the two qubit elements 302 may be coupled together through the coupling resonator 316. In this manner, a state of one qubit element 302 may depend on the state of the other qubit element 302, and vice versa. Thus, coupling resonators 316 may be employed to use a state of one qubit element 302 to control a state of another qubit element 302.

In some implementations, the microwave line 314 may be used to not only readout the state of the qubit elements 302 as described above, but also to control the state of the qubit elements 302. When a single microwave line 314 is used for this purpose, the line 314 may operate in a half-duplex mode in which, at some times, it is configured to readout the state of the qubit elements 302, and, at other times, it is configured to control the state of the qubit elements 302. In other implementations, microwave lines such as the line 314 shown in FIG. 39 may be used to only readout the state of the qubit elements as described above, while separate drive lines (such as the drive lines 324 shown in FIG. 39) may be used to control the state of the qubit elements 302. In such implementations, the microwave lines used for readout may be referred to as readout lines (e.g., the readout line 314), while microwave lines used for controlling the state of the qubit elements may be referred to as drive lines (e.g., the drive lines 324). The drive lines 324 may control the state of their respective qubit elements 302 by providing (e.g., using conductive contacts 326 as shown in FIG. 39) a microwave pulse at the qubit frequency, which in turn stimulates a transition between the states of the qubit element 302. By varying the length of this pulse, a partial transition can be stimulated, giving a superposition of the states of the qubit element 302.

Flux bias lines, microwave lines, coupling resonators, drive lines, and readout resonators, such as those described above, together form interconnects for supporting propagation of microwave signals. Further, any other connections for providing direct electrical interconnection between different quantum circuit elements and components, such as connections from Josephson junction electrodes to capacitor plates or to superconducting loops of superconducting quantum interference devices (SQUIDS) or connections between two ground lines of a particular transmission line for equalizing electrostatic potential on the two ground lines, are also referred to herein as interconnects. Electrical interconnections may also be provided between quantum circuit elements and components and non-quantum circuit elements, which may also be provided in a quantum circuit, as well as to electrical interconnections between various non-quantum circuit elements provided in a quantum circuit. Examples of non-quantum circuit elements that may be provided in a quantum circuit may include various analog and/or digital systems, e.g. analog-to-digital converters, mixers, multiplexers, amplifiers, etc. In some embodiments, these non-quantum elements may be included in a control die.

Coupling resonators and readout resonators may be configured for capacitive coupling to other circuit elements at one or both ends to have resonant oscillations, whereas flux bias lines and microwave lines may be similar to conventional microwave transmission lines because there is no resonance in these lines. Each one of these interconnects may be implemented as any suitable architecture of a microwave transmission line, such as a coplanar waveguide, a stripline, a microstrip line, or an inverted microstrip line. Typical materials to make the interconnects include aluminum, niobium, niobium nitride, titanium nitride, molybdenum rhenium, and niobium titanium nitride, all of which are particular types of superconductors. However, in various embodiments, other suitable superconductors and alloys of superconductors may be used as well.

In various embodiments, the interconnects as shown in FIG. 39 could have different shapes and layouts. For example, some interconnects may comprise more curves and turns while other interconnects may comprise fewer curves and turns, and some interconnects may comprise substantially straight lines. In some embodiments, various interconnects may intersect one another, in such a manner that they don't make an electrical connection, which can be done by using a bridge to bridge one interconnect over the other, for example.

In addition, FIG. 39 further illustrates ground contacts 328, connecting to the ground plane. Such ground contacts 328 may be used when a die supports propagation of microwave signals to suppress microwave parallel plate modes, cross-coupling between circuit blocks, and/or substrate resonant modes. In general, providing ground pathways may improve signal quality, enable fast pulse excitation, and improve the isolation between the different lines.

Only two ground contacts are labeled in FIG. 39 with the reference numeral 328, but all white circles shown throughout FIG. 39 may illustrate exemplary locations of ground conductive contacts. The illustration of the location and the number of the ground contacts 328 in FIG. 39 is purely illustrative and, in various embodiments, ground contacts 328 may be provided at different places, as known in microwave engineering. More generally, any number of qubit elements 302, flux bias lines 312, microwave lines 314, coupling resonators 316, readout resonators 318, drive lines 324, contacts 320, 322, 326, and 328, and other components discussed herein with reference to the superconducting quantum circuit 300 may be included in a quantum computing assembly 100.

While FIGS. 38 and 39 illustrate examples of quantum circuits comprising only two qubit elements 302, embodiments with any larger number of qubit elements are possible and are within the scope of the present disclosure. Furthermore, while FIGS. 38 and 39 may illustrate various features specific to transmon-type quantum devices, the quantum computing assemblies 100 disclosed herein may include quantum circuits implementing other types of superconducting qubit elements.

In some embodiments, the face of the a die including quantum computing circuitry may be coated with a solder resist material (not shown). The solder resist may include silicon nitride, aluminum oxide, or silicon oxide, for example. Because the solder resist material may be lossy, it may be advantageous to avoid using solder resist material proximate to or around the coupling resonators 316. FIG. 40 illustrates the superconducting qubit-type quantum device 300 of FIG. 39 with an example area 382 around the resonator 316 in which no solder resist is provided. As discussed below, positioning a lossy material close to the resonators 316 may create spurious two-level systems that may compromise performance of the quantum computing circuitry (e.g., by leading to qubit decoherence).

Figure 41A:
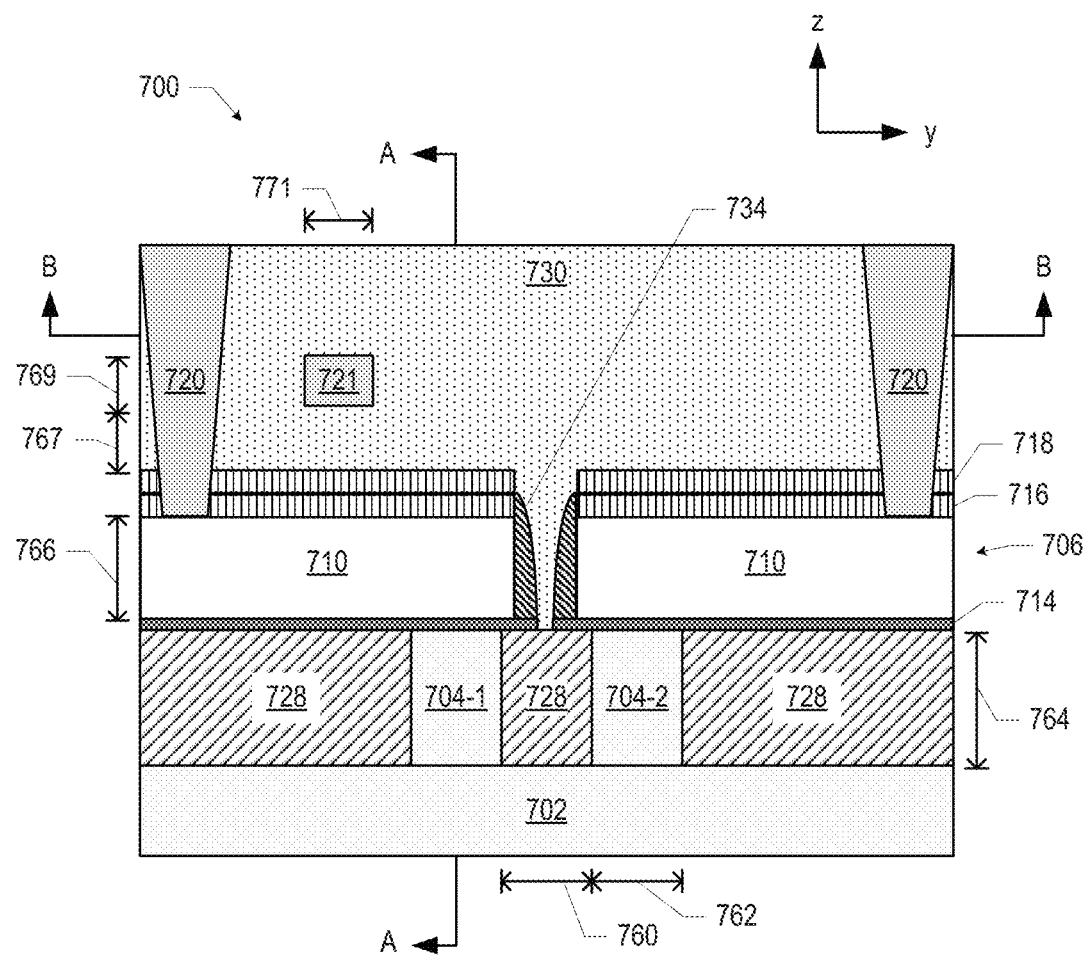
FIGS. 41A-41C are cross-sectional views of a spin qubit-type quantum device, in accordance with various embodiments.
Figure 41B:
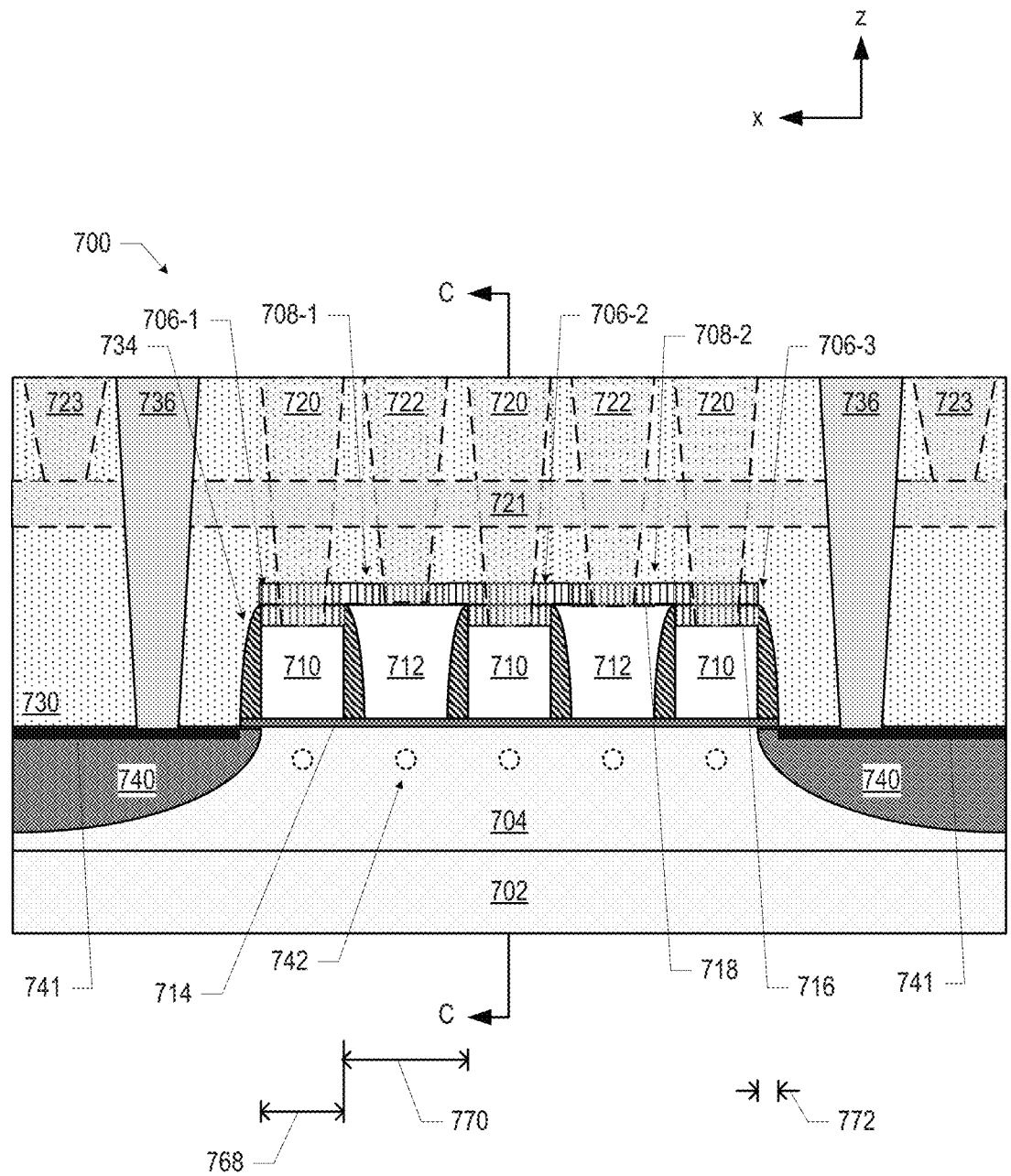
Figure 41C:
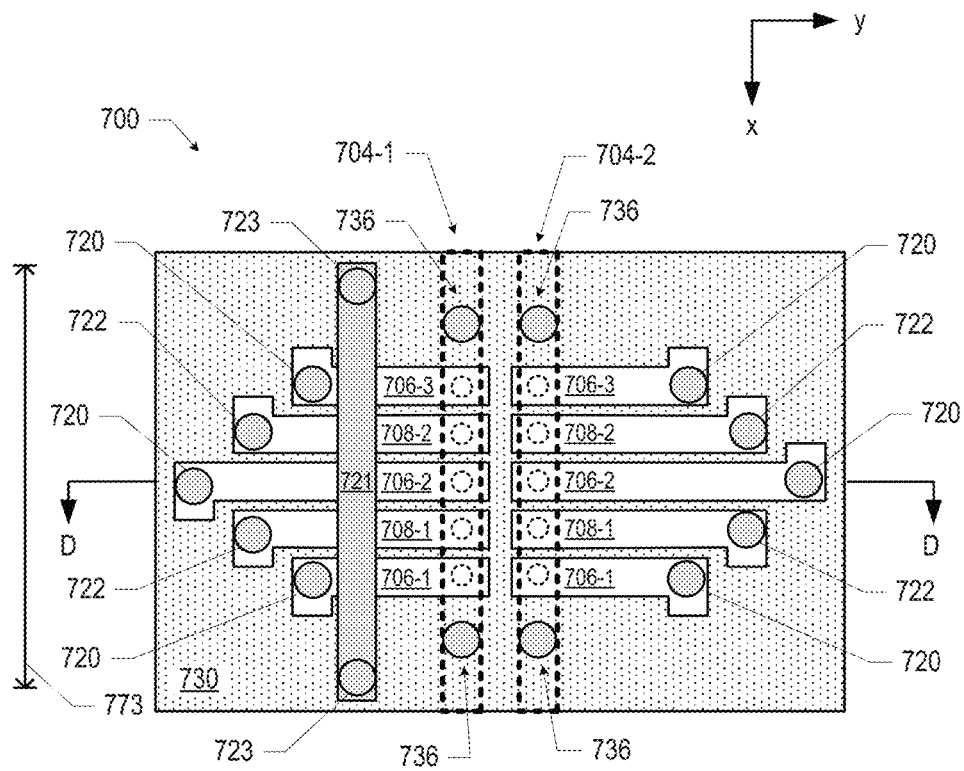

As noted above, in some embodiments, a quantum computing assembly 100 may include spin qubit-type quantum devices. FIG. 41 depicts cross-sectional views of an example spin qubit-type quantum device 700, in accordance with various embodiments. In particular, FIG. 41B illustrates the spin qubit-type quantum device 700 taken along the section A-A of FIG. 41A (while FIG. 41A illustrates the spin qubit-type quantum device 700 taken along the section C-C of FIG. 41B), and FIG. 41C illustrates the spin qubit-type quantum device 700 taken along the section B-B of FIG. 41A with a number of components not shown to more readily illustrate how the gates 706/708 and the magnet line 721 may be patterned (while FIG. 41A illustrates a spin qubit-type quantum device 700 taken along the section D-D of FIG. 41C). Although FIG. 41A indicates that the cross-section illustrated in FIG. 41B is taken through the fin 704-1, an analogous cross-section taken through the fin 704-2 may be identical, and thus the discussion of FIG. 41B refers generally to the "fin 704." The spin qubit-type quantum device 700 is simply illustrative, and other spin qubit-type quantum devices may be included in a quantum computing assembly 100.

The spin qubit-type quantum device 700 may include a base 702 and multiple fins 704 extending away from the base 702. The base 702 and the fins 704 may include a substrate and a quantum well stack (not shown in FIG. 41, but discussed below with reference to the substrate 744 and the quantum well stack 746), distributed in any of a number of ways between the base 702 and the fins 704. The base 702 may include at least some of the substrate, and the fins 704 may each include a quantum well layer of the quantum well stack (discussed below with reference to the quantum well layer 752).

Although only two fins, 704-1 and 704-2, are shown in FIG. 41, this is simply for ease of illustration, and more than two fins 704 may be included in the spin qubit-type quantum device 700. In some embodiments, the total number of fins 704 included in the spin qubit-type quantum device 700 is an even number, with the fins 704 organized into pairs including one active fin 704 and one read fin 704, as discussed in detail below. When the spin qubit-type quantum device 700 includes more than two fins 704, the fins 704 may be arranged in pairs in a line (e.g., 2N fins total may be arranged in a 1×2N line, or a 2×N line) or in pairs in a larger array (e.g., 2N fins total may be arranged as a 4×N/2 array, a 6×N/3 array, etc.). The discussion herein will largely focus on a single pair of fins 704 for ease of illustration, but all the teachings of the present disclosure apply to spin qubit-type quantum devices 700 with more fins 704.

As noted above, each of the fins 704 may include a quantum well layer (not shown in FIG. 41, but discussed below with reference to the quantum well layer 752). The quantum well layer included in the fins 704 may be arranged normal to the z-direction, and may provide a layer in which a two-dimensional electron gas (2DEG) may form to enable the generation of a quantum dot during operation of the spin qubit-type quantum device 700, as discussed in further detail below. The quantum well layer itself may provide a geometric constraint on the z-location of quantum dots in the fins 704, and the limited extent of the fins 704 (and therefore the quantum well layer) in the y-direction may provide a geometric constraint on the y-location of quantum dots in the fins 704. To control the x-location of quantum dots in the fins 704, voltages may be applied to gates disposed on the fins 704 to adjust the energy profile along the fins 704 in the x-direction and thereby constrain the x-location of quantum dots within quantum wells (discussed in detail below with reference to the gates 706/708). The dimensions of the fins 704 may take any suitable values. For example, in some embodiments, the fins 704 may each have a width 762 between 10 nanometers and 30 nanometers. In some embodiments, the fins 704 may each have a height 764 between 200 nanometers and 400 nanometers (e.g., between 250 nanometers and 350 nanometers, or equal to 300 nanometers).

The fins 704 may be arranged in parallel, as illustrated in FIGS. 41A and 41C, and may be spaced apart by an insulating material 728, which may be disposed on opposite faces of the fins 704. The insulating material 728 may be a dielectric material, such as silicon oxide. For example, in some embodiments, the fins 704 may be spaced apart by a distance 760 between 100 nanometers and 250 nanometers.

Multiple gates may be disposed on each of the fins 704. In the embodiment illustrated in FIG. 41B, three gates 706 and two gates 708 are shown as distributed on the top of the fin 704. This particular number of gates is simply illustrative, and any suitable number of gates may be used.

As shown in FIG. 41B, the gate 708-1 may be disposed between the gates 706-1 and 706-2, and the gate 708-2 may be disposed between the gates 706-2 and 706-3. Each of the gates 706/708 may include a gate dielectric 714; in the embodiment illustrated in FIG. 41B, the gate dielectric 714 for all the gates 706/708 is provided by a common layer of gate dielectric material. In other embodiments, the gate dielectric 714 for each of the gates 706/708 may be provided by separate portions of gate dielectric 714. In some embodiments, the gate dielectric 714 may be a multilayer gate dielectric (e.g., with multiple materials used to improve the interface between the fin 704 and the corresponding gate metal). The gate dielectric 714 may be, for example, silicon oxide, aluminum oxide, or a high-k dielectric, such as hafnium oxide. More generally, the gate dielectric 714 may include elements such as hafnium, silicon, oxygen, titanium, tantalum, lanthanum, aluminum, zirconium, barium, strontium, yttrium, lead, scandium, niobium, and zinc. Examples of materials that may be used in the gate dielectric 714 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 714 to improve the quality of the gate dielectric 714.

Each of the gates 706 may include a gate metal 710 and a hardmask 716. The hardmask 716 may be formed of silicon nitride, silicon carbide, or another suitable material. The gate metal 710 may be disposed between the hardmask 716 and the gate dielectric 714, and the gate dielectric 714 may be disposed between the gate metal 710 and the fin 704. Only one portion of the hardmask 716 is labeled in FIG. 41B for ease of illustration. In some embodiments, the gate metal 710 may be a superconductor, such as aluminum, titanium nitride (e.g., deposited via atomic layer deposition (ALD)), or niobium titanium nitride. In some embodiments, the hardmask 716 may not be present in the spin qubit-type quantum device 700 (e.g., a hardmask like the hardmask 716 may be removed during processing, as discussed below). The sides of the gate metal 710 may be substantially parallel, as shown in FIG. 41B, and insulating spacers 734 may be disposed on the sides of the gate metal 710 and the hardmask 716. As illustrated in FIG. 41B, the spacers 734 may be thicker closer to the fin 704 and thinner farther away from the fin 704. In some embodiments, the spacers 734 may have a convex shape. The spacers 734 may be formed of any suitable material, such as a carbon-doped oxide, silicon nitride, silicon oxide, or other carbides or nitrides (e.g., silicon carbide, silicon nitride doped with carbon, and silicon oxynitride). The gate metal 710 may be any suitable metal, such as titanium nitride.

Each of the gates 708 may include a gate metal 712 and a hardmask 718. The hardmask 718 may be formed of silicon nitride, silicon carbide, or another suitable material. The gate metal 712 may be disposed between the hardmask 718 and the gate dielectric 714, and the gate dielectric 714 may be disposed between the gate metal 712 and the fin 704. In the embodiment illustrated in FIG. 41B, the hardmask 718 may extend over the hardmask 716 (and over the gate metal 710 of the gates 706), while in other embodiments, the hardmask 718 may not extend over the gate metal 710. In some embodiments, the gate metal 712 may be a different metal from the gate metal 710; in other embodiments, the gate metal 712 and the gate metal 710 may have the same material composition. In some embodiments, the gate metal 712 may be a superconductor, such as aluminum, titanium nitride (e.g., deposited via ALD), or niobium titanium nitride. In some embodiments, the hardmask 718 may not be present in the spin qubit-type quantum device 700 (e.g., a hardmask like the hardmask 718 may be removed during processing, as discussed below).

The gate 708-1 may extend between the proximate spacers 734 on the sides of the gate 706-1 and the gate 706-2, as shown in FIG. 41B. In some embodiments, the gate metal 712 of the gate 708-1 may extend between the spacers 734 on the sides of the gate 706-1 and the gate 706-2. Thus, the gate metal 712 of the gate 708-1 may have a shape that is substantially complementary to the shape of the spacers 734, as shown. Similarly, the gate 708-2 may extend between the proximate spacers 734 on the sides of the gate 706-2 and the gate 706-3. In some embodiments in which the gate dielectric 714 is not a layer shared commonly between the gates 708 and 706, but instead is separately deposited on the fin 704 between the spacers 734, the gate dielectric 714 may extend at least partially up the sides of the spacers 734, and the gate metal 712 may extend between the portions of gate dielectric 714 on the spacers 734. The gate metal 712, like the gate metal 710, may be any suitable metal, such as titanium nitride.

The dimensions of the gates 706/708 may take any suitable values. For example, in some embodiments, the z-height 766 of the gate metal 710 may be between 40 nanometers and 75 nanometers (e.g., approximately 50 nanometers); the z-height of the gate metal 712 may be in the same range. In embodiments like the ones illustrated in FIG. 41B, the z-height of the gate metal 712 may be greater than the z-height of the gate metal 710. In some embodiments, the length 768 of the gate metal 710 (i.e., in the x-direction) may be between 20 nanometers and 40 nanometers (e.g., 30 nanometers). In some embodiments, the distance 770 between adjacent ones of the gates 706 (e.g., as measured from the gate metal 710 of one gate 706 to the gate metal 710 of an adjacent gate 706 in the x-direction, as illustrated in FIG. 41B), may be between 40 nanometers and 60 nanometers (e.g., 50 nanometers). In some embodiments, the thickness 772 of the spacers 734 may be between 1 nanometer and 10 nanometers (e.g., between 3 nanometers and 5 nanometers, between 4 nanometers and 6 nanometers, or between 4 nanometers and 7 nanometers). The length of the gate metal 712 (i.e., in the x-direction) may depend on the dimensions of the gates 706 and the spacers 734, as illustrated in FIG. 41B. As indicated in FIG. 41A, the gates 706/708 on one fin 704 may extend over the insulating material 728 beyond their respective fins 704 and towards the other fin 704, but may be isolated from their counterpart gates by the intervening insulating material 730 and spacers 734.

Although all the gates 706 are illustrated in the accompanying drawings as having the same length 768 of the gate metal 710, in some embodiments, the "outermost" gates 706 (e.g., the gates 706-1 and 706-3 of the embodiment illustrated in FIG. 41B) may have a greater length 768 than the "inner" gates 706 (e.g., the gate 706-2 in the embodiment illustrated in FIG. 41B). Such longer "outside" gates 706 may provide spatial separation between the doped regions 740 and the areas under the gates 708 and the inner gates 706 in which quantum dots 742 may form, and thus may reduce the perturbations to the potential energy landscape under the gates 708 and the inner gates 706 caused by the doped regions 740.

As shown in FIG. 41B, the gates 706 and 708 may be alternatingly arranged along the fin 704 in the x-direction. During operation of the spin qubit-type quantum device 700, voltages may be applied to the gates 706/708 to adjust the potential energy in the quantum well layer (not shown) in the fin 704 to create quantum wells of varying depths in which quantum dots 742 may form. Only one quantum dot 742 is labeled with a reference numeral in FIGS. 41B and 41C for ease of illustration, but five are indicated as dotted circles in each fin 704. The location of the quantum dots 742 in FIG. 41B is not intended to indicate a particular geometric positioning of the quantum dots 742. The spacers 734 may themselves provide "passive" barriers between quantum wells under the gates 706/708 in the quantum well layer, and the voltages applied to different ones of the gates 706/708 may adjust the potential energy under the gates 706/708 in the quantum well layer; decreasing the potential energy may form quantum wells, while increasing the potential energy may form quantum barriers.

The fins 704 may include doped regions 740 that may serve as a reservoir of charge carriers for the spin qubit-type quantum device 700. For example, an n-type doped region 740 may supply electrons for electron-type quantum dots 742, and a p-type doped region 740 may supply holes for hole-type quantum dots 742. In some embodiments, an interface material 741 may be disposed at a surface of a doped region 740, as shown. The interface material 741 may facilitate electrical coupling between a conductive contact (e.g., a via 736, as discussed below) and the doped region 740. The interface material 741 may be any suitable metal-semiconductor ohmic contact material; for example, in embodiments in which the doped region 740 includes silicon, the interface material 741 may include nickel silicide, aluminum silicide, titanium silicide, molybdenum silicide, cobalt silicide, tungsten silicide, or platinum silicide. In some embodiments, the interface material 741 may be a non-silicide compound, such as titanium nitride. In some embodiments, the interface material 741 may be a metal (e.g., aluminum, tungsten, or indium).

The spin qubit-type quantum devices 700 disclosed herein may be used to form electron-type or hole-type quantum dots 742. Note that the polarity of the voltages applied to the gates 706/708 to form quantum wells/barriers depends on the charge carriers used in the spin qubit-type quantum device 700. In embodiments in which the charge carriers are electrons (and thus the quantum dots 742 are electron-type quantum dots), amply negative voltages applied to a gate 706/708 may increase the potential barrier under the gate 706/708, and amply positive voltages applied to a gate 706/708 may decrease the potential barrier under the gate 706/708 (thereby forming a potential well in which an electron-type quantum dot 742 may form). In embodiments in which the charge carriers are holes (and thus the quantum dots 742 are hole-type quantum dots), amply positive voltages applied to a gate 706/708 may increase the potential barrier under the gate 706/708, and amply negative voltages applied to a gate 706/708 may decrease the potential barrier under the gate 706/708 (thereby forming a potential well in which a hole-type quantum dot 742 may form). The spin qubit-type quantum devices 700 disclosed herein may be used to form electron-type or hole-type quantum dots.

Voltages may be applied to each of the gates 706 and 708 separately to adjust the potential energy in the quantum well layer under the gates 706 and 708, and thereby control the formation of quantum dots 742 under each of the gates 706 and 708. Additionally, the relative potential energy profiles under different ones of the gates 706 and 708 allow the spin qubit-type quantum device 700 to tune the potential interaction between quantum dots 742 under adjacent gates. For example, if two adjacent quantum dots 742 (e.g., one quantum dot 742 under a gate 706 and another quantum dot 742 under a gate 708) are separated by only a short potential barrier, the two quantum dots 742 may interact more strongly than if they were separated by a taller potential barrier. Since the depth of the potential wells/height of the potential barriers under each gate 706/708 may be adjusted by adjusting the voltages on the respective gates 706/708, the differences in potential between adjacent gates 706/708 may be adjusted, and thus the interaction tuned.

In some applications, the gates 708 may be used as plunger gates to enable the formation of quantum dots 742 under the gates 708, while the gates 706 may be used as barrier gates to adjust the potential barrier between quantum dots 742 formed under adjacent gates 708. In other applications, the gates 708 may be used as barrier gates, while the gates 706 are used as plunger gates. In other applications, quantum dots 742 may be formed under all the gates 706 and 708, or under any desired subset of the gates 706 and 708.

Vias and lines may contact the gates 706/708 and the doped regions 740 to enable electrical connection to the gates 706/708 and the doped regions 740 to be made in desired locations. As shown in FIG. 41, the gates 706 may extend away from the fins 704, and vias 720 may contact the gates 706 (and are drawn in dashed lines in FIG. 41B to indicate their location behind the plane of the drawing). The vias 720 may extend through the hardmask 716 and the hardmask 718 to contact the gate metal 710 of the gates 706. The gates 708 may extend away from the fins 704, and the vias 722 may contact the gates 708 (also drawn in dashed lines in FIG. 41B to indicate their location behind the plane of the drawing). The vias 722 may extend through the hardmask 718 to contact the gate metal 712 of the gates 708. Vias 736 may contact the interface material 741 and may thereby make electrical contact with the doped regions 740. The spin qubit-type quantum device 700 may include further vias and/or lines (not shown) to make electrical contact to the gates 706/708 and/or the doped regions 740, as desired. The vias and lines included in a spin qubit-type quantum device 700 may include any suitable materials, such as copper, tungsten (deposited, e.g., by chemical vapor deposition (CVD)), or a superconductor (e.g., aluminum, tin, titanium nitride, niobium titanium nitride, tantalum, niobium, or other niobium compounds such as niobium tin and niobium germanium).

During operation, a bias voltage may be applied to the doped regions 740 (e.g., via the vias 736 and the interface material 741) to cause current to flow through the doped regions 740. When the doped regions 740 are doped with an n-type material, this voltage may be positive; when the doped regions 740 are doped with a p-type material, this voltage may be negative. The magnitude of this bias voltage may take any suitable value (e.g., between 0.25 volts and 2 volts).

The spin qubit-type quantum device 700 may include one or more magnet lines 721. For example, a single magnet line 721 is illustrated in FIG. 41 proximate to the fin 704-1. The magnet line 721 may be formed of a conductive material, and may be used to conduct current pulses that generate magnetic fields to influence the spin states of one or more of the quantum dots 742 that may form in the fins 704. In some embodiments, the magnet line 721 may conduct a pulse to reset (or "scramble") nuclear and/or quantum dot spins. In some embodiments, the magnet line 721 may conduct a pulse to initialize an electron in a quantum dot in a particular spin state. In some embodiments, the magnet line 721 may conduct current to provide a continuous, oscillating magnetic field to which the spin of a qubit may couple. The magnet line 721 may provide any suitable combination of these embodiments, or any other appropriate functionality.

In some embodiments, the magnet line 721 may be formed of copper. In some embodiments, the magnet line 721 may be formed of a superconductor, such as aluminum. The magnet line 721 illustrated in FIG. 41 is non-coplanar with the fins 704, and is also non-coplanar with the gates 706/708. In some embodiments, the magnet line 721 may be spaced apart from the gates 706/708 by a distance 767. The distance 767 may take any suitable value (e.g., based on the desired strength of the magnetic field interaction with the quantum dots 742); in some embodiments, the distance 767 may be between 25 nanometers and 1 micron (e.g., between 50 nanometers and 200 nanometers).

In some embodiments, the magnet line 721 may be formed of a magnetic material. For example, a magnetic material (such as cobalt) may be deposited in a trench in the insulating material 730 to provide a permanent magnetic field in the spin qubit-type quantum device 700.

The magnet line 721 may have any suitable dimensions. For example, the magnet line 721 may have a thickness 769 between 25 nanometers and 100 nanometers. The magnet line 721 may have a width 771 between 25 nanometers and 100 nanometers. In some embodiments, the width 771 and thickness 769 of a magnet line 721 may be equal to the width and thickness, respectively, of other conductive pads in the spin qubit-type quantum device 700 (not shown) used to provide electrical interconnects, as known in the art. The magnet line 721 may have a length 773 that may depend on the number and dimensions of the gates 706/708 that are to form quantum dots 742 with which the magnet line 721 is to interact. The magnet line 721 illustrated in FIG. 41 is substantially linear, but this need not be the case; the magnet lines 721 disclosed herein may take any suitable shape. Vias 723 may contact the magnet line 721.

The vias 720, 722, 736, and 723 may be electrically isolated from each other by an insulating material 730. The insulating material 730 may be any suitable material, such as an interlayer dielectric (ILD). Examples of the insulating material 730 may include silicon oxide, silicon nitride, aluminum oxide, carbon-doped oxide, and/or silicon oxynitride. As known in the art of integrated circuit manufacturing, vias and lines may be formed in an iterative process in which layers of structures are formed on top of each other. In some embodiments, the vias 720/722/736/723 may have a width that is 20 nanometers or greater at their widest point (e.g., 30 nanometers), and a pitch of 80 nanometers or greater (e.g., 100 nanometers). In some embodiments, conductive pads (not shown) included in the spin qubit-type quantum device 700 may have a width that is 100 nanometers or greater, and a pitch of 100 nanometers or greater. The particular arrangement of vias shown in FIG. 41 is simply illustrative, and any electrical routing arrangement may be implemented.

As discussed above, the structure of the fin 704-1 may be the same as the structure of the fin 704-2; similarly, the construction of gates 706/708 on the fin 704-1 may be the same as the construction of gates 706/708 on the fin 704-2. The gates 706/708 on the fin 704-1 may be mirrored by corresponding gates 706/708 on the parallel fin 704-2, and the insulating material 730 may separate the gates 706/708 on the different fins 704-1 and 704-2. In particular, quantum dots 742 formed in the fin 704-1 (under the gates 706/708) may have counterpart quantum dots 742 in the fin 704-2 (under the corresponding gates 706/708). In some embodiments, the quantum dots 742 in the fin 704-1 may be used as "active" quantum dots in the sense that these quantum dots 742 act as qubits and are controlled (e.g., by voltages applied to the gates 706/708 of the fin 704-1) to perform quantum computations. The quantum dots 742 in the fin 704-2 may be used as "read" quantum dots in the sense that these quantum dots 742 may sense the quantum state of the quantum dots 742 in the fin 704-1 by detecting the electric field generated by the charge in the quantum dots 742 in the fin 704-1, and may convert the quantum state of the quantum dots 742 in the fin 704-1 into electrical signals that may be detected by the gates 706/708 on the fin 704-2. Each quantum dot 742 in the fin 704-1 may be read by its corresponding quantum dot 742 in the fin 704-2. Thus, the spin qubit-type quantum device 700 enables both quantum computation and the ability to read the results of a quantum computation.

As discussed above, the base 702 and the fin 704 of a spin qubit-type quantum device 700 may be formed from a substrate 744 and a quantum well stack 746 disposed on the substrate 744. The quantum well stack 746 may include a quantum well layer in which a 2DEG may form during operation of the spin qubit-type quantum device 700. The quantum well stack 746 may take any of a number of forms, several of which are illustrated in FIG. 42. The various layers in the quantum well stacks 746 discussed below may be grown on the substrate 744 (e.g., using epitaxial processes).

Figure 42A:
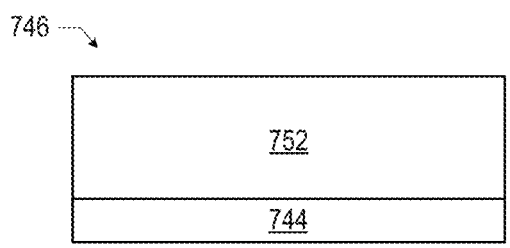
FIGS. 42A-42C are cross-sectional views of various examples of quantum well stacks that may be used in a spin qubit-type quantum device, in accordance with various embodiments.

FIG. 42A is a cross-sectional view of a quantum well stack 746 including only a quantum well layer 752. The quantum well layer 752 may be disposed on the substrate 744, and may be formed of a material such that, during operation of the spin qubit-type quantum device 700, a 2DEG may form in the quantum well layer 752 proximate to the upper surface of the quantum well layer 752. The gate dielectric 714 of the gates 706/708 may be disposed on the upper surface of the quantum well layer 752. In some embodiments, the quantum well layer 752 of FIG. 42A may be formed of intrinsic silicon, and the gate dielectric 714 may be formed of silicon oxide; in such an arrangement, during use of the spin qubit-type quantum device 700, a 2DEG may form in the intrinsic silicon at the interface between the intrinsic silicon and the silicon oxide. Embodiments in which the quantum well layer 752 of FIG. 42A is formed of intrinsic silicon may be particularly advantageous for electron-type spin qubit-type quantum devices 700. In some embodiments, the quantum well layer 752 of FIG. 42A may be formed of intrinsic germanium, and the gate dielectric 714 may be formed of germanium oxide; in such an arrangement, during use of the spin qubit-type quantum device 700, a 2DEG may form in the intrinsic germanium at the interface between the intrinsic germanium and the germanium oxide. Such embodiments may be particularly advantageous for hole-type spin qubit-type quantum devices 700. In some embodiments, the quantum well layer 752 may be strained, while in other embodiments, the quantum well layer 752 may not be strained. The thicknesses (i.e., z-heights) of the layers in the quantum well stack 746 of FIG. 42A may take any suitable values. For example, in some embodiments, the thickness of the quantum well layer 752 (e.g., intrinsic silicon or germanium) may be between 0.8 microns and 1.2 microns.

Figure 42B:
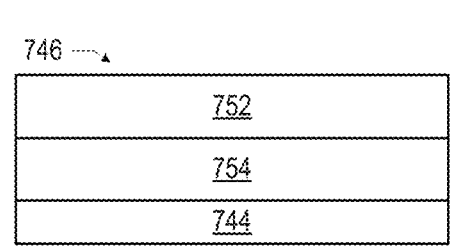

FIG. 42B is a cross-sectional view of a quantum well stack 746 including a quantum well layer 752 and a barrier layer 754. The quantum well stack 746 may be disposed on a substrate 744 such that the barrier layer 754 is disposed between the quantum well layer 752 and the substrate 744. The barrier layer 754 may provide a potential barrier between the quantum well layer 752 and the substrate 744. As discussed above, the quantum well layer 752 of FIG. 42B may be formed of a material such that, during operation of the spin qubit-type quantum device 700, a 2DEG may form in the quantum well layer 752 proximate to the upper surface of the quantum well layer 752. For example, in some embodiments in which the substrate 744 is formed of silicon, the quantum well layer 752 of FIG. 42B may be formed of silicon, and the barrier layer 754 may be formed of silicon germanium. The germanium content of this silicon germanium may be 20-80 atomic % (e.g., 30%). In some embodiments in which the quantum well layer 752 is formed of germanium, the barrier layer 754 may be formed of silicon germanium (with a germanium content of 20-80% (e.g., 70%)). The thicknesses (i.e., z-heights) of the layers in the quantum well stack 746 of FIG. 42B may take any suitable values. For example, in some embodiments, the thickness of the barrier layer 754 (e.g., silicon germanium) may be between 0 nanometers and 400 nanometers. In some embodiments, the thickness of the quantum well layer 752 (e.g., silicon or germanium) may be between 5 nanometers and 30 nanometers.

Figure 42C:
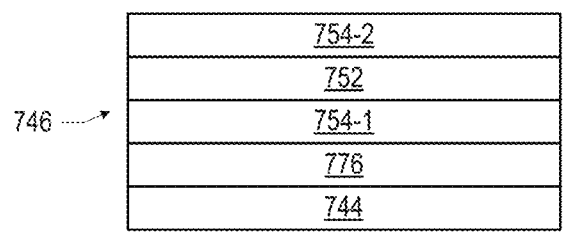

FIG. 42C is a cross-sectional view of a quantum well stack 746 including a quantum well layer 752 and a barrier layer 754-1, as well as a buffer layer 776 and an additional barrier layer 754-2. The quantum well stack 746 may be disposed on the substrate 744 such that the buffer layer 776 is disposed between the barrier layer 754-1 and the substrate 744. The buffer layer 776 may be formed of the same material as the barrier layer 754, and may be present to trap defects that form in this material as it is grown on the substrate 744. In some embodiments, the buffer layer 776 may be grown under different conditions (e.g., deposition temperature or growth rate) from the barrier layer 754-1. In particular, the barrier layer 754-1 may be grown under conditions that achieve fewer defects than the buffer layer 776. In some embodiments in which the buffer layer 776 includes silicon germanium, the silicon germanium of the buffer layer 776 may have a germanium content that varies from the substrate 744 to the barrier layer 754-1; for example, the silicon germanium of the buffer layer 776 may have a germanium content that varies from zero percent at the silicon substrate 744 to a nonzero percent (e.g., 30%) at the barrier layer 754-1. The thicknesses (i.e., z-heights) of the layers in the quantum well stack 746 of FIG. 42C may take any suitable values. For example, in some embodiments, the thickness of the buffer layer 776 (e.g., silicon germanium) may be between 0.3 microns and 4 microns (e.g., 0.3 microns to 2 microns, or 0.5 microns). In some embodiments, the thickness of the barrier layer 754-1 (e.g., silicon germanium) may be between 0 nanometers and 400 nanometers. In some embodiments, the thickness of the quantum well layer 752 (e.g., silicon or germanium) may be between 5 nanometers and 30 nanometers (e.g., 10 nanometers). The barrier layer 754-2, like the barrier layer 754-1, may provide a potential energy barrier around the quantum well layer 752, and may take the form of any of the embodiments of the barrier layer 754-1. In some embodiments, the thickness of the barrier layer 754-2 (e.g., silicon germanium) may be between 25 nanometers and 75 nanometers (e.g., 32 nanometers).

As discussed above with reference to FIG. 42B, the quantum well layer 752 of FIG. 42C may be formed of a material such that, during operation of the spin qubit-type quantum device 700, a 2DEG may form in the quantum well layer 752 proximate to the upper surface of the quantum well layer 752. For example, in some embodiments in which the substrate 744 is formed of silicon, the quantum well layer 752 of FIG. 42C may be formed of silicon, and the barrier layer 754-1 and the buffer layer 776 may be formed of silicon germanium. In some such embodiments, the silicon germanium of the buffer layer 776 may have a germanium content that varies from the substrate 744 to the barrier layer 754-1; for example, the silicon germanium of the buffer layer 776 may have a germanium content that varies from zero percent at the silicon substrate 744 to a nonzero percent (e.g., 30%) at the barrier layer 754-1. In other embodiments, the buffer layer 776 may have a germanium content equal to the germanium content of the barrier layer 754-1 but may be thicker than the barrier layer 754-1 to absorb the defects that arise during growth.

In some embodiments, the quantum well layer 752 of FIG. 42C may be formed of germanium, and the buffer layer 776 and the barrier layer 754-1 may be formed of silicon germanium. In some such embodiments, the silicon germanium of the buffer layer 776 may have a germanium content that varies from the substrate 744 to the barrier layer 754-1; for example, the silicon germanium of the buffer layer 776 may have a germanium content that varies from zero percent at the substrate 744 to a nonzero percent (e.g., 70%) at the barrier layer 754-1. The barrier layer 754-1 may in turn have a germanium content equal to the nonzero percent. In other embodiments, the buffer layer 776 may have a germanium content equal to the germanium content of the barrier layer 754-1 but may be thicker than the barrier layer 754-1 to absorb the defects that arise during growth. In some embodiments of the quantum well stack 746 of FIG. 42C, the buffer layer 776 and/or the barrier layer 754-2 may be omitted.

Any of the quantum computing circuitry discussed above with reference to FIGS. 38-42 may be distributed in any manner between any of the dies 114 (and the package substrate 102) of any of the quantum computing assemblies 100 disclosed herein (e.g., any of the quantum computing assemblies 100 discussed herein with reference to FIG. 4, 5, 10, or 27-31). FIGS. 43-49 illustrate some particular examples of arrangements of quantum computing circuitry in quantum computing assemblies 100.

Figure 43:
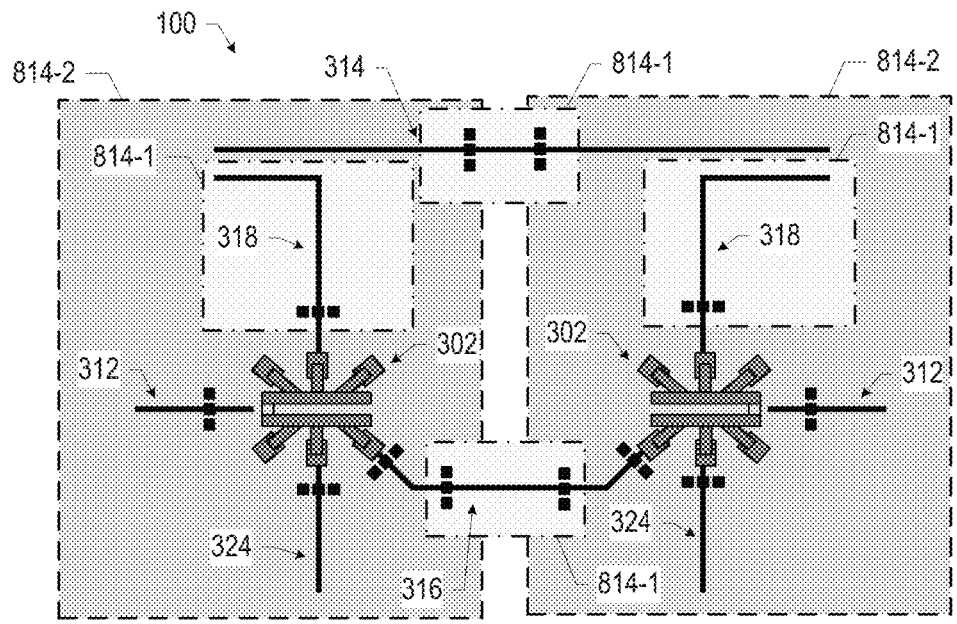
FIGS. 43-49 are views of example quantum computing assemblies, in accordance with various embodiments.

In some embodiments, the resonators in a set of quantum computing circuitry may be included in different dies than other elements of the set of quantum computing circuitry. For example, FIG. 43 illustrates a particular distribution of the quantum computing circuitry of FIG. 38 into multiple dies 814, omitting the ground contacts 328 for ease of illustration. In particular, FIG. 43 illustrates an embodiment in which the qubit elements 302, the flux bias lines 312, the drive lines 324, and portions of the microwave line 314 are included in dies 814-2 (which may be, for example, any of the dies 114-2 or 614-2 disclosed herein), and the coupling resonators 316, the readout resonators 318, and a portion of the microwave line 314 are included in dies 814-1 (which may be, for example, any of the dies 114-1 or 614-1 disclosed herein). The dies 814-1 may be coupled to the dies 814-2 by DTD interconnects 130 (represented by three black squares), as shown. These DTD interconnects 130 may be shielded (e.g., having a coaxial structure). The dies 814-1 and 814-2 may also each be coupled to a package substrate 102 (not shown), in accordance with any of the embodiments disclosed herein. In some embodiments, different dies 814-2 may include a single qubit element 302, a single associated flux bias line 312, a single associated drive line 324, and a single associated portion of the microwave line 314; different ones of the dies 814-2 may be coupled together through dies 814-1 that "bridge" the dies 814-1 by providing portions of the microwave line 314 and the coupling resonators 316. In other embodiments, a single die 814-2 may include multiple qubit elements 302, multiple associated flux bias lines 312, multiple associated drive lines 324, and the microwave line 314; the coupling resonators 316 and the readout resonators 318 may be provided by dies 814-1. Although not shown, the dies 814 of FIG. 43 may include TSVs to couple to a ground of the package substrate 102 via DTPS interconnects 150 (e.g., "grounding bumps"), thereby providing the ground contacts 328 of FIG. 38; these TSVs may be present at a small enough pitch to suppress spurious resonances in the dies 814. In some embodiments, the qubit elements 302, the flux bias lines 312, the drive lines 324, and portions of the microwave line 314 included in the dies 814-2 may be located closer to the bottom surface of the dies 814-2 (and closer to the dies 814-1) than to the top surface of the dies 814-2 in order to minimize losses; similarly, the coupling resonators 316, the readout resonators 318, and a portion of the microwave line 314 included in the dies 814-1 may be located closer to the top surface of the dies 814-1 (and closer to the dies 814-2) than to the bottom surface of the dies 814-1.

Figure 44:
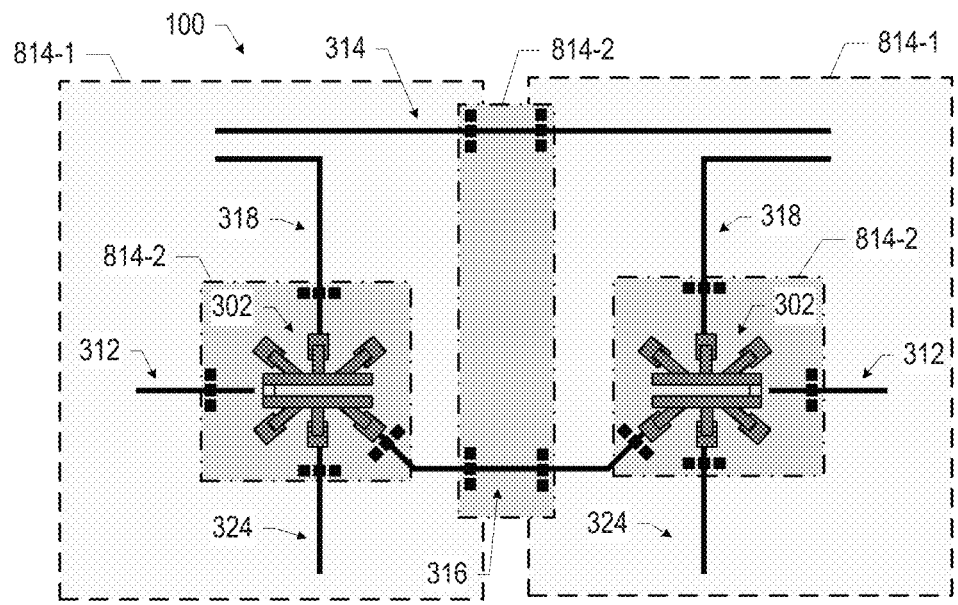

Quantum computing circuitry may be distributed into the dies of a quantum computing assembly 100 in other ways. For example, FIG. 44 illustrates a particular distribution of the quantum computing circuitry of FIG. 38 into multiple dies 814, omitting the ground contacts 328 for ease of illustration. In particular, FIG. 44 illustrates an embodiment in which the qubit elements 302, the coupling resonators 316, and portions of the microwave line 314 are included in dies 814-2 (which may be, for example, any of the dies 114-2 or 614-2 disclosed herein), and the flux bias lines 312, the drive lines 324, the readout resonators 318, and a portion of the microwave line 314 are included in dies 814-1 (which may be, for example, any of the dies 114-1 or 614-1 disclosed herein). The dies 814-1 may be coupled to the dies 814-2 by DTD interconnects 130, as shown. These DTD interconnects 130 may be shielded (e.g., having a coaxial structure). The dies 814-1 and 814-2 may also each be coupled to a package substrate 102 (not shown), in accordance with any of the embodiments disclosed herein. In some embodiments, different dies 814-2 may include a single qubit element 302, or a single coupling resonator 316; different ones of the dies 814-2 may be coupled together through dies 814-1 that "bridge" the dies 814-1 by providing the flux bias lines 312, the drive lines 324, and the readout resonators 318. In other embodiments, a single die 814-2 may include multiple qubit elements 302 and multiple coupling resonators 316; the readout resonators 318 may be provided by dies 814-1. Although not shown, the dies 814 of FIG. 44 may include TSVs and other structures to providing grounding and suppression of spurious resonances, as discussed above. In some embodiments, the qubit elements 302, the coupling resonators 316, and portions of the microwave line 314 included in the dies 814-2 may be located closer to the bottom surface of the dies 814-2 (and closer to the dies 814-1) than to the top surface of the dies 814-2 in order to minimize losses; similarly, the flux bias lines 312, the drive lines 324, the readout resonators 318, and portions of the microwave line 314 included in the dies 814-1 may be located closer to the top surface of the dies 814-1 (and closer to the dies 814-2) than to the bottom surface of the dies 814-1.

Figure 45:
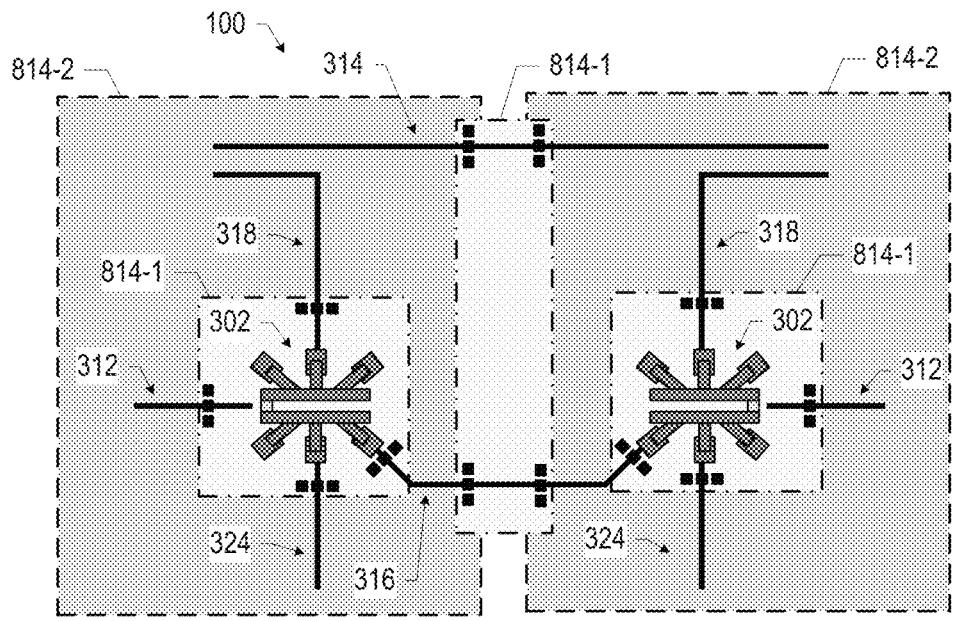

FIG. 45 illustrates a particular distribution of the quantum computing circuitry of FIG. 38 into multiple dies 814, omitting the ground contacts 328 for ease of illustration. In particular, FIG. 44 illustrates an embodiment in which the qubit elements 302, the coupling resonators 316, and portions of the microwave line 314 are included in dies 814-1 (which may be, for example, any of the dies 114-1 or 614-1 disclosed herein), and the flux bias lines 312, the drive lines 324, the readout resonators 318, and a portion of the microwave line 314 are included in dies 814-2 (which may be, for example, any of the dies 114-2 or 614-2 disclosed herein). The dies 814-2 may be coupled to the dies 814-1 by DTD interconnects 130, as shown. These DTD interconnects 130 may be shielded (e.g., having a coaxial structure). The dies 814-1 and 814-2 may also each be coupled to a package substrate 102 (not shown), in accordance with any of the embodiments disclosed herein. In some embodiments, different dies 814-1 may include a single qubit element 302, or a single coupling resonator 316; different ones of the dies 814-1 may be coupled together through dies 814-2 that "bridge" the dies 814-2 by providing the flux bias lines 312, the drive lines 324, and the readout resonators 318. In other embodiments, a single die 814-1 may include multiple qubit elements 302 and multiple coupling resonators 316; the readout resonators 318 may be provided by dies 814-2. Although not shown, the dies 814 of FIG. 45 may include TSVs and other structures to providing grounding and suppression of spurious resonances, as discussed above. In some embodiments, the qubit elements 302, the coupling resonators 316, and portions of the microwave line 314 included in the dies 814-1 may be located closer to the top surface of the dies 814-1 (and closer to the dies 814-2) than to the bottom surface of the dies 814-1 in order to minimize losses; similarly, the flux bias lines 312, the drive lines 324, the readout resonators 318, and portions of the microwave line 314 included in the dies 814-2 may be located closer to the bottom surface of the dies 814-2 (and closer to the dies 814-1) than to the top surface of the dies 814-2.

Figure 46:
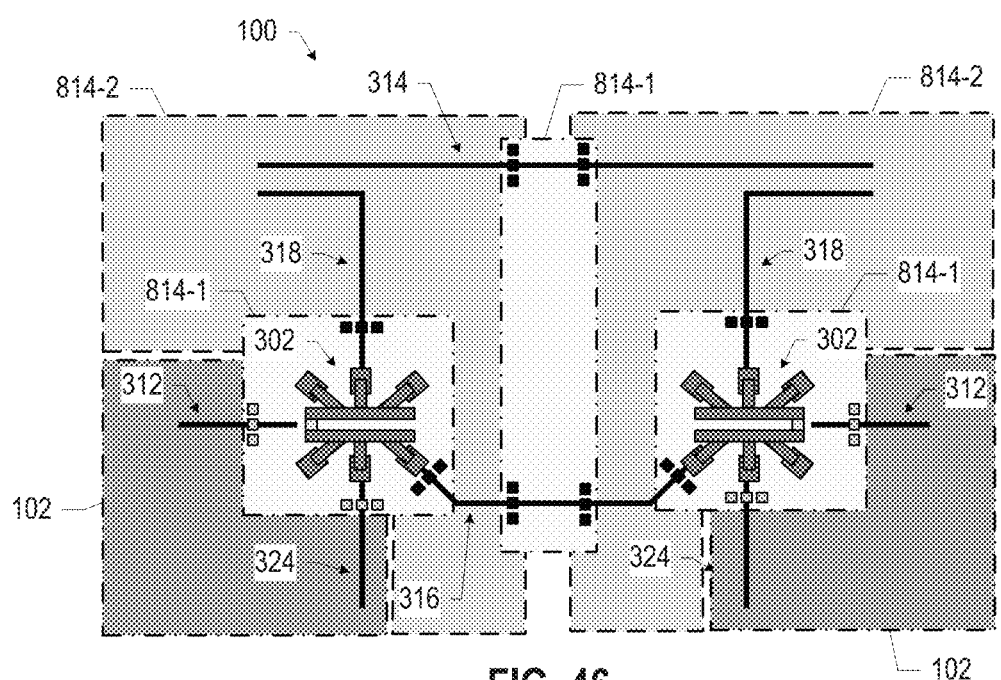

FIG. 46 illustrates a particular distribution of the quantum computing circuitry of FIG. 38 into multiple dies 814, omitting the ground contacts 328 for ease of illustration. In particular, FIG. 46 illustrates an embodiment in which the qubit elements 302, the coupling resonators 316, and portions of the microwave line 314 are included in dies 814-1 (which may be, for example, any of the dies 114-1 or 614-1 disclosed herein), the readout resonators 318 and a portion of the microwave line 314 are included in dies 814-2 (which may be, for example, any of the dies 114-2 or 614-2 disclosed herein), and the flux bias lines 312 and the drive lines 324 are included in the package substrate 102. Because some of the quantum computing circuitry is included in the package substrate 102 instead of in the die 814-2, relative to the embodiment of FIG. 45, the dies 814-2 of FIG. 46 may be smaller than the dies 814-2 of FIG. 45. The dies 814-2 may be coupled to the dies 814-1 by DTD interconnects 130, as shown, and the package substrate 102 may be coupled to the dies 814-1 by DTPS interconnects 150 (represented by three grey squares). The dies 814-1 may include TSVs or other interconnect structures to couple the flux bias lines 312 and the drive lines 324 to the qubit elements 302 (which may be located proximate to a top surface of the dies 814-1). In some embodiments, proximity coupling may be used to couple the flux bias lines 312 and the drive lines 324 to the qubit elements 302 in the dies 814-1. The DTD interconnects 130 and DTPS interconnects 150 may be shielded (e.g., having a coaxial structure). The dies 814-1 and 814-2 may also each be coupled to the package substrate 102 to achieve ground shielding, as discussed above, or to facilitate other signal or power pathways. In some embodiments, different dies 814-1 may include a single qubit element 302, or a single coupling resonator 316. In other embodiments, a single die 814-1 may include multiple qubit elements 302 and multiple coupling resonators 316.

Figure 47:
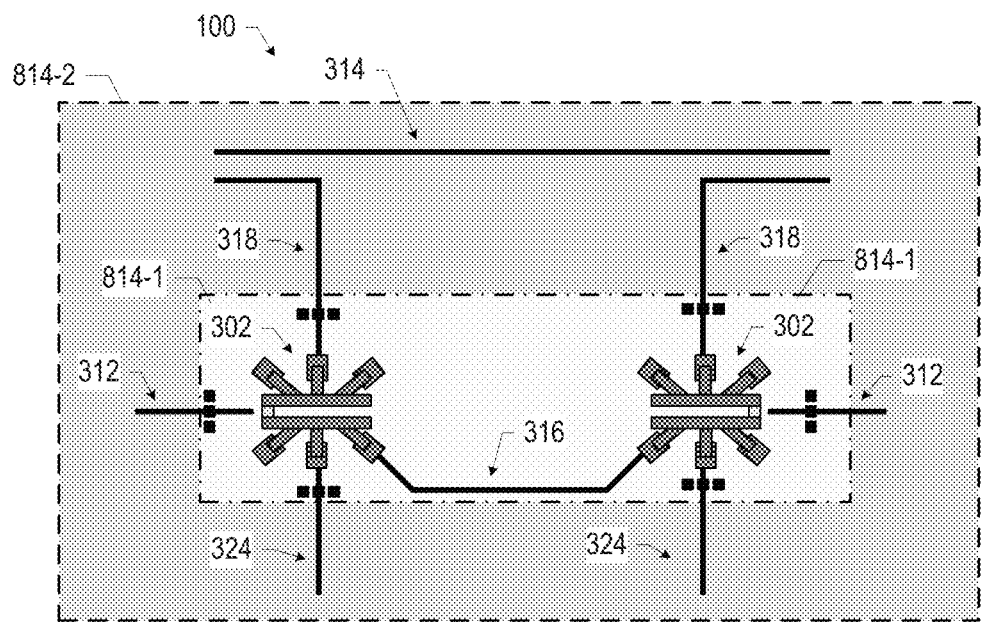

FIG. 47 illustrates a particular distribution of the quantum computing circuitry of FIG. 38 into multiple dies 814, omitting the ground contacts 328 for ease of illustration. In particular, FIG. 47 illustrates an embodiment in which multiple qubit elements 302 and the coupling resonators 316 are included in a die 814-1 (which may be, for example, any of the dies 114-1 or 614-1 disclosed herein), and the flux bias lines 312, the drive lines 324, the readout resonators 318, and the microwave lines 314 are included in a die 814-2 (which may be, for example, any of the dies 114-2 or 614-2 disclosed herein). The die 814-2 may be coupled to the die 814-1 by DTD interconnects 130, as shown. These DTD interconnects 130 may be shielded (e.g., having a coaxial structure). The dies 814-1 and 814-2 may also each be coupled to a package substrate 102 (not shown), in accordance with any of the embodiments disclosed herein. Although not shown, the dies 814 of FIG. 47 may include TSVs and other structures to providing grounding and suppression of spurious resonances, as discussed above. In some embodiments, the qubit elements 302 and the coupling resonators 316 may be located closer to the top surface of the die 814-1 (and closer to the die 814-2) than to the bottom surface of the die 814-1 in order to minimize losses; similarly, the flux bias lines 312, the drive lines 324, the readout resonators 318, and the microwaves line 314 included in the die 814-2 may be located closer to the bottom surface of the die 814-2 (and closer to the die 814-1) than to the top surface of the die 814-2.

Figure 48:
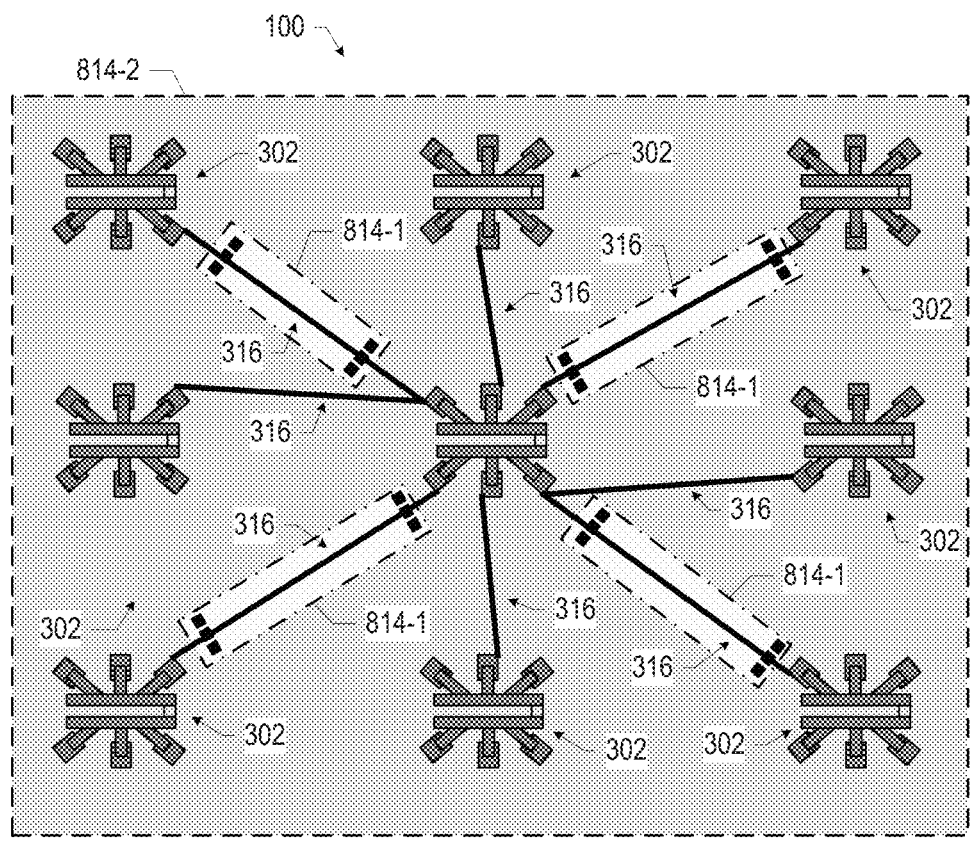

In some embodiments, circuitry included in one die of a quantum computing assembly 100 may be used to provide conductive pathways between different elements of circuitry included in another die of the quantum computing assembly 100. For example, FIG. 48 illustrates quantum computing circuitry that includes an array of qubit elements 302 coupled in various ways by coupling resonators 316. Other elements of the quantum computing circuitry of FIG. 38 are not shown in FIG. 48 for ease of illustration. In the embodiment of FIG. 48, the qubit elements 302 are included in a die 814-2 (which may be, for example, any of the dies 114-2 or 614-2 disclosed herein), and the die 814-2 may also include four coupling resonators 316 coupling the central qubit element 302 to its four nearest neighbor qubit elements 302. Additional coupling resonators 316 may be included in one or more dies 814-1 (which may be, for example, any of the dies 114-1 or 614-1 disclosed herein), and these dies 814-1 may be coupled to the die 814-2 by DTD interconnects 130 so that the additional coupling resonators 316 couple the central qubit element 302 to its four diagonal neighbor qubit elements 302. In this manner, the dies 814-1 may provide additional, high quality factor coupling pathways between qubit elements 302 included in the die 814-2. The dies 814-1 and 814-2 may also each be coupled to a package substrate 102 (not shown), in accordance with any of the embodiments disclosed herein. Although not shown, the dies 814 of FIG. 48 may include TSVs and other structures to providing grounding and suppression of spurious resonances, as discussed above. In some embodiments, the quantum computing assembly 100 of FIG. 48 may be "duplicated" so as to include two qubit "planes" (including the dies 814-2) whose qubits may be coupled within the planes and across the planes by dies 814-1.

Figure 49:
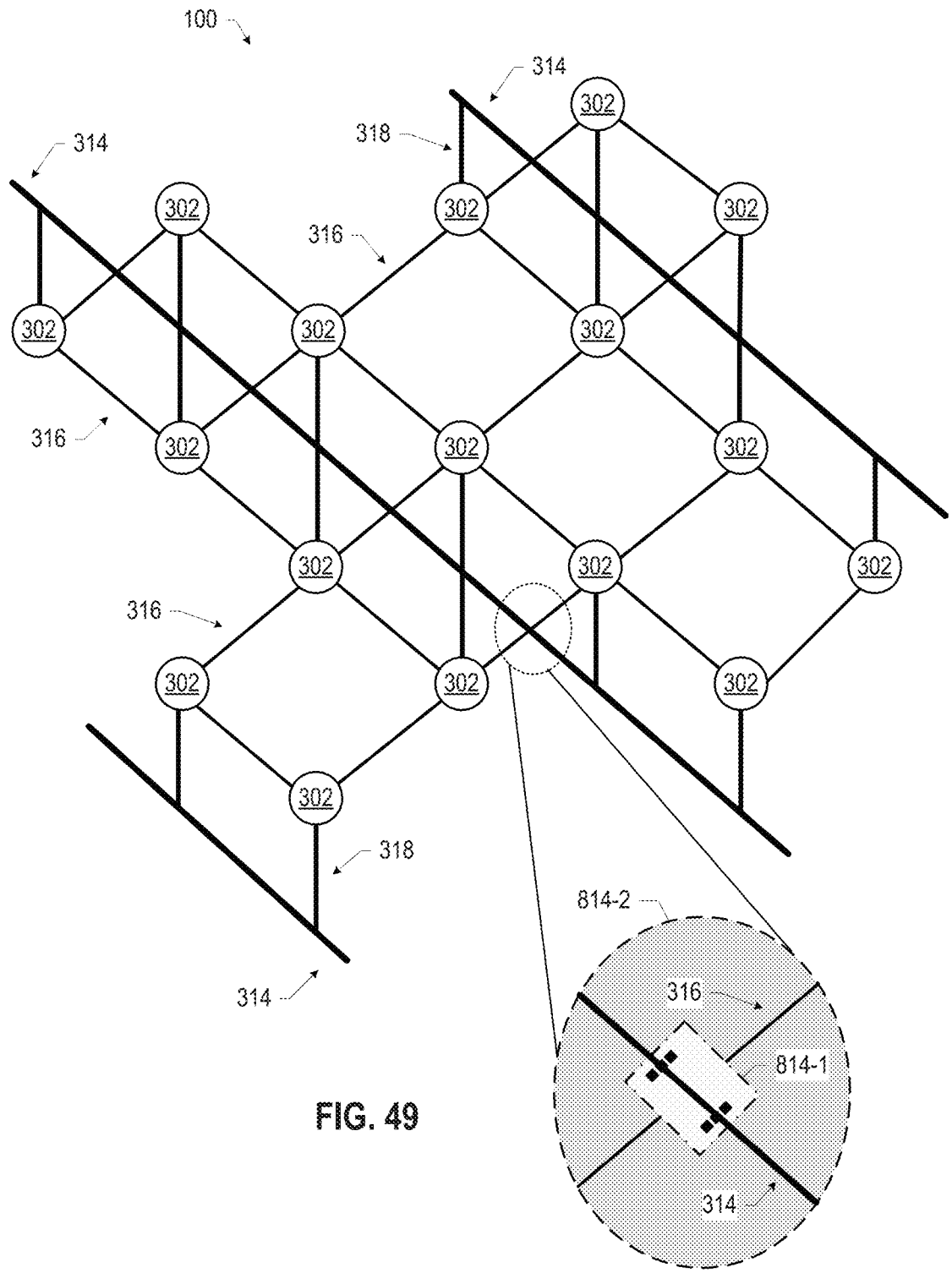

FIG. 49 illustrates quantum computing circuitry that includes a surface code array of qubit elements 302 coupled in various ways by coupling resonators 316 (thin diagonal lines). Each qubit element 302 may be coupled to a readout resonator 318 that is coupled to a microwave line 314 (bold diagonal lines). As illustrated in the detail view of FIG. 49, in some embodiments, the qubit elements 302, the coupling resonators 316, the readout resonators 318, and portions of the microwave lines 314 may be included in a die 814-2 (which may be, for example, any of the dies 114-2 or 614-2 disclosed herein), while the portions of the microwave lines 314 that cross over a coupling resonator 316 may be included in dies 814-1 (which may be, for example, any of the dies 114-1 or 614-1 disclosed herein). The portions of the microwave lines 314 included in the dies 814-1 may be referred to as "jump-over transitions" of the microwave lines 314. Thus, FIG. 49 illustrates another example of a quantum computing assembly 100 in which different dies are used to facilitate the interconnection between different elements in a quantum computing circuit. The die 814-2 may be coupled to the dies 814-1 by DTD interconnects 130, as shown. These DTD interconnects 130 may be shielded (e.g., having a coaxial structure). The dies 814-1 and 814-2 may also each be coupled to a package substrate 102 (not shown), in accordance with any of the embodiments disclosed herein. Although not shown, the dies 814 of FIG. 49 may include TSVs and other structures to providing grounding and suppression of spurious resonances, as discussed above.

Figure 50:
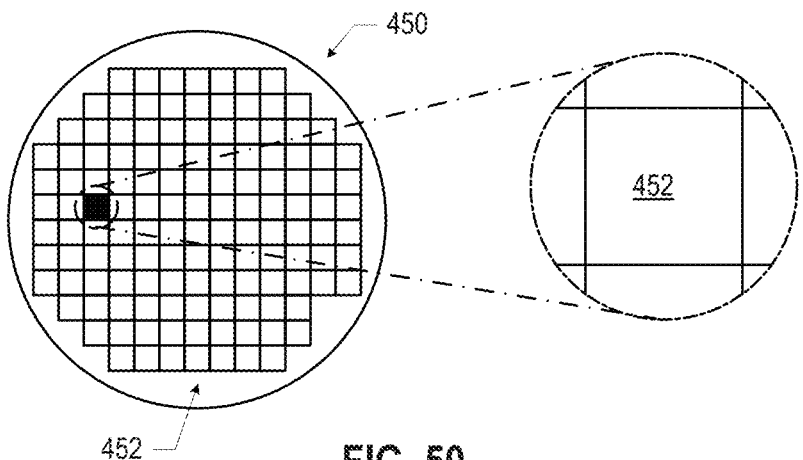
FIG. 50 is a top view of a wafer and dies that may be included in any of the quantum computing assemblies disclosed herein.

FIG. 50 is a top view of a wafer 450 and dies 452 that may be formed from the wafer 450; the dies 452 may be any of the dies discussed herein. The wafer 450 may include semiconductor material and may include one or more dies 452 having conventional and/or quantum computing device elements formed on a surface of the wafer 450. Each of the dies 452 may be a repeating unit of a semiconductor product that includes any suitable conventional and/or quantum computing device. After the fabrication of the semiconductor product is complete, the wafer 450 may undergo a singulation process in which each die 452 is separated from the others to provide discrete "chips" of the semiconductor product. A die 452 may include one or more quantum computing devices (e.g., the devices discussed above with reference to FIGS. 38-42) and/or supporting circuitry to route electrical signals to the quantum computing devices (e.g., interconnects including vias and lines, or control circuitry), as well as any other integrated circuit components. In some embodiments, the wafer 450 or the die 452 may include a memory device (e.g., a static random access memory (SRAM) device), a logic device (e.g., AND, OR, NAND, or NOR gate), or any other suitable circuit element. Multiple ones of these devices may be combined on a single die 452. For example, a memory array formed by multiple memory devices may be formed on a same die 452 as a processing device (e.g., the processing device 2002 of FIG. 51) or other logic that is configured to store information in the memory devices or execute instructions stored in the memory array.

Figure 51:
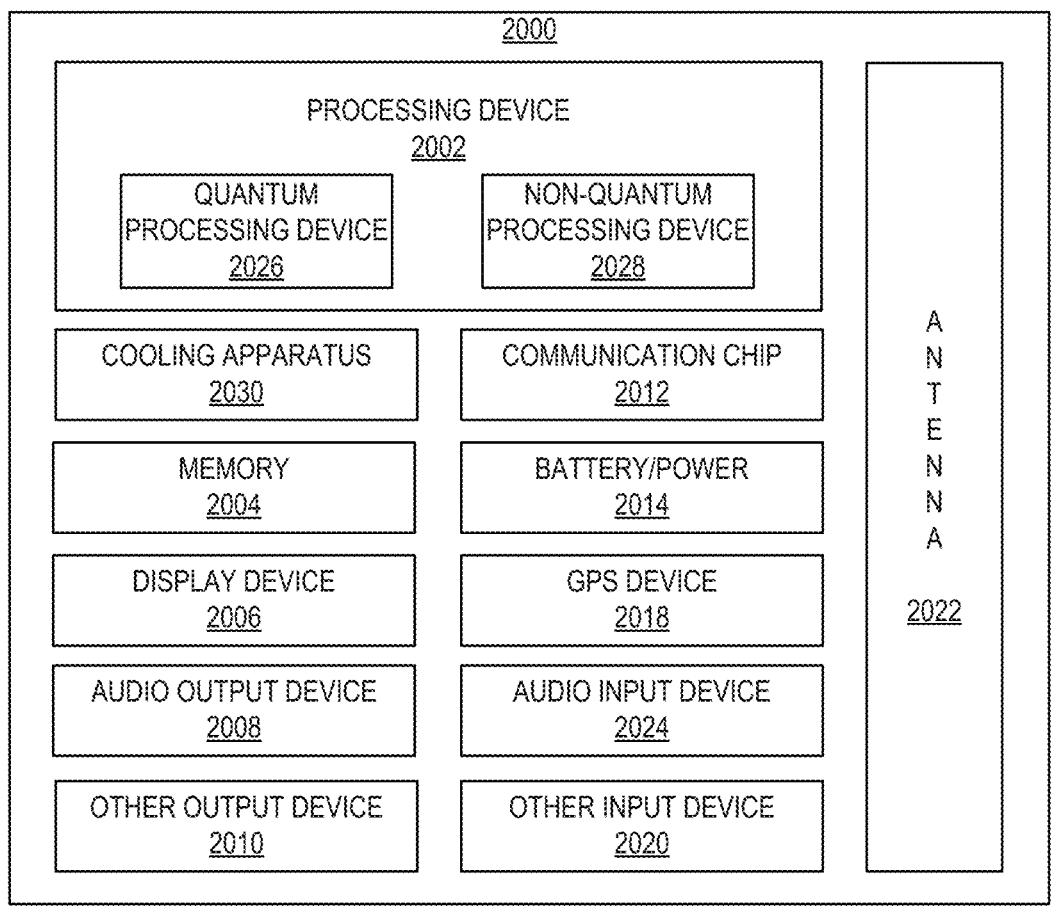
FIG. 51 is a block diagram of an example quantum computing device that may include any of the quantum computing assemblies disclosed herein, in accordance with various embodiments.

FIG. 51 is a block diagram of an example quantum computing device 2000 that may include any of the quantum computing assemblies 100 disclosed herein. A number of components are illustrated in FIG. 51 as included in the quantum computing device 2000, but any one or more of these components may be omitted or duplicated, as suitable for the application. In some embodiments, some or all the components included in the quantum computing device 2000 may be attached to one or more PCBs (e.g., a motherboard). In some embodiments, various ones of these components may be fabricated onto a single system-on-a-chip (SoC) die. Additionally, in various embodiments, the quantum computing device 2000 may not include one or more of the components illustrated in FIG. 51, but the quantum computing device 2000 may include interface circuitry for coupling to the one or more components. For example, the quantum computing device 2000 may not include a display device 2006, but may include display device interface circuitry (e.g., a connector and driver circuitry) to which a display device 2006 may be coupled. In another set of examples, the quantum computing device 2000 may not include an audio input device 2024 or an audio output device 2008, but may include audio input or output device interface circuitry (e.g., connectors and supporting circuitry) to which an audio input device 2024 or audio output device 2008 may be coupled.

The quantum computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include a quantum processing device 2026 (e.g., one or more quantum processing devices), and a non-quantum processing device 2028 (e.g., one or more non-quantum processing devices). The quantum processing device 2026 may include one or more of the dies disclosed herein, and may perform data processing by performing operations on the qubits that may be generated in the dies, and monitoring the result of those operations. For example, as discussed above, different qubits may be allowed to interact, the quantum states of different qubits may be set or transformed, and the quantum states of qubits may be read. The quantum processing device 2026 may be a universal quantum processor, or specialized quantum processor configured to run one or more particular quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output channels, multiplexers, signal mixers, quantum amplifiers, and analog-to-digital converters.

As noted above, the processing device 2002 may include a non-quantum processing device 2028. In some embodiments, the non-quantum processing device 2028 may provide peripheral logic to support the operation of the quantum processing device 2026. For example, the non-quantum processing device 2028 may control the performance of a read operation, control the performance of a write operation, control the clearing of quantum bits, control the performance of any of the operations discussed herein, etc. The non-quantum processing device 2028 may also perform conventional computing functions to supplement the computing functions provided by the quantum processing device 2026. For example, the non-quantum processing device 2028 may interface with one or more of the other components of the quantum computing device 2000 (e.g., the communication chip 2012 discussed below, the display device 2006 discussed below, etc.) in a conventional manner, and may serve as an interface between the quantum processing device 2026 and conventional components. The non-quantum processing device 2028 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices.

The quantum computing device 2000 may include a memory 2004, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the states of qubits in the quantum processing device 2026 may be read and stored in the memory 2004. In some embodiments, the memory 2004 may include memory that shares a die with the non-quantum processing device 2028. This memory may be used as cache memory and may include embedded dynamic random access memory (eDRAM) or spin transfer torque magnetic random access memory (STT-M RAM).

The quantum computing device 2000 may include a cooling apparatus 2030. The cooling apparatus 2030 may maintain the quantum processing device 2026 at a predetermined low temperature during operation to reduce the effects of scattering in the quantum processing device 2026. This predetermined low temperature may vary depending on the setting; in some embodiments, the temperature may be 5. Kelvin or less. In some embodiments, the non-quantum processing device 2028 (and various other components of the quantum computing device 2000) may not be cooled by the cooling apparatus 2030, and may instead operate at room temperature. The cooling apparatus 2030 may be, for example, a dilution refrigerator, a helium-3 refrigerator, or a liquid helium refrigerator.

In some embodiments, the quantum computing device 2000 may include a communication chip 2012 (e.g., one or more communication chips). For example, the communication chip 2012 may be configured for managing wireless communications for the transfer of data to and from the quantum computing device 2000. The term "wireless" and its derivatives may be used to describe circuits, devices, systems, methods, techniques, communications channels, etc. that may communicate data through the use of modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The quantum computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as global positioning system (GPS), EDGE, GPRS, CDMA, WiMAX, LTE, EV-DO, or others. In some embodiments, a first communication chip 2012 may be dedicated to wireless communications, and a second communication chip 2012 may be dedicated to wired communications.

The quantum computing device 2000 may include battery/power circuitry 2014. The battery/power circuitry 2014 may include one or more energy storage devices (e.g., batteries or capacitors) and/or circuitry for coupling components of the quantum computing device 2000 to an energy source separate from the quantum computing device 2000 (e.g., AC line power).

The quantum computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display.

The quantum computing device 2000 may include an audio output device 2008 (or corresponding interface circuitry, as discussed above). The audio output device 2008 may include any device that generates an audible indicator, such as speakers, headsets, or earbuds, for example.

The quantum computing device 2000 may include an audio input device 2024 (or corresponding interface circuitry, as discussed above). The audio input device 2024 may include any device that generates a signal representative of a sound, such as microphones, microphone arrays, or digital instruments (e.g., instruments having a musical instrument digital interface (MIDI) output).

The quantum computing device 2000 may include a GPS device 2018 (or corresponding interface circuitry, as discussed above). The GPS device 2018 may be in communication with a satellite-based system and may receive a location of the quantum computing device 2000, as known in the art.

The quantum computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The quantum computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The following paragraphs provide various examples of the embodiments disclosed herein.

Example 1 is a quantum computing assembly, including: a package substrate having a first surface and an opposing second surface; a first die having a first surface and an opposing second surface, wherein the first surface of the first die is coupled to the second surface of the package substrate by first interconnects, and the first surface of the first die is at least partially between the second surface of the package substrate and the second surface of the first die; and a second die having a first surface and an opposing second surface, wherein the first surface of the second die is coupled to the second surface of the package substrate by second interconnects, the first surface of the second die is coupled to the second surface of the first die by third interconnects, and the first surface of the second die is at least partially between the second surface of the package substrate and the second surface of the second die; wherein the first die or the second die includes quantum processing circuitry.

Example 2 may include the subject matter of Example 1, and may further specify that the quantum processing circuitry includes resonators.

Example 3 may include the subject matter of Example 2, and may further specify that the resonators are included in the first die.

Example 4 may include the subject matter of any of Examples 1-3, and may further specify that the quantum processing circuitry includes superconducting qubit elements.

Example 5 may include the subject matter of Example 4, and may further specify that the superconducting qubit elements are included in the first die.

Example 6 may include the subject matter of Example 1, and may further specify that the quantum processing circuitry includes a quantum well stack and a plurality of gates above the quantum well stack.

Example 7 may include the subject matter of any of Examples 1-6, and may further specify that the third interconnects include a solder and the solder includes a superconductor.

Example 8 may include the subject matter of any of Examples 1-7, and may further specify that the first die includes multiple ground vias extending between the first surface of the first die and the second surface of the first die.

Example 9 may include the subject matter of any of Examples 1-8, and may further specify that the first die and the second die include quantum processing circuitry.

Example 10 may include the subject matter of any of Examples 1-9, and may further specify that the first die or the second die includes control circuitry.

Example 11 may include the subject matter of any of Examples 1-10, and may further specify that the package substrate includes a recess, and the first die is at least partially in the recess.

Example 12 may include the subject matter of any of Examples 1-11, and may further specify that the first interconnects and the second interconnects include a solder and the solder includes a superconductor.

Example 13 may include the subject matter of any of Examples 1-12, and may further specify that the first die and the second die are hermetically sealed.

Example 14 may include the subject matter of any of Examples 1-13, and may further specify that the package substrate includes flux lines or drive lines.

Example 15 may include the subject matter of any of Examples 1-14, and may further specify that the first die or the second die includes a multiplexer or a filter.

Example 16 is a quantum computing assembly, including: a first die having a first surface and an opposing second surface, first conductive contacts at the first surface of the first die, and second conductive contacts at the second surface of the first die; and a second die having a first surface and an opposing second surface, first conductive contacts at the first surface of the second die, and second conductive contacts at the first surface of the second die; wherein the second conductive contacts of the first die are coupled to the first conductive contacts of the second die by interconnects, the second conductive contacts of the second die are not coupled to conductive contacts at the second surface of the first die, the second surface of the first die is between the first surface of the first die and the first surface of the second die, a footprint of the first die is contained within a footprint of the second die, and the first die or the second die includes quantum processing circuitry.

Example 17 may include the subject matter of Example 16, and may further specify that the quantum processing circuitry includes resonators.

Example 18 may include the subject matter of Example 17, and may further specify that the resonators are included in the first die.

Example 19 may include the subject matter of Example 18, and may further specify that the resonators are included in the second die.

Example 20 may include the subject matter of any of Examples 16-19, and may further specify that the quantum processing circuitry includes drive lines or flux lines for superconducting qubit elements.

Example 21 may include the subject matter of Example 20, and may further specify that the drive lines or flux lines are included in the first die.

Example 22 may include the subject matter of Example 20, and may further specify that the drive lines or flux lines are included in the second die.

Example 23 may include the subject matter of any of Examples 16-22, and may further specify that the quantum processing circuitry includes superconducting qubit elements.

Example 24 may include the subject matter of Example 23, and may further specify that the superconducting qubit elements are included in the first die.

Example 25 may include the subject matter of Example 24, and may further specify that the quantum processing circuitry includes drive lines, flux lines, and resonators, and the resonators are included in the second die.

Example 26 may include the subject matter of Example 25, and may further specify that the first die is one of a plurality of first dies, individual ones of the first dies having a first surface and an opposing second surface, individual ones of the first dies having first conductive contacts at the first surface of the first die, and second conductive contacts at the second surface of the first die, individual ones of the first dies having second conductive contacts coupled to the first conductive contacts of the second die by interconnects, the second conductive contacts of the second die are not coupled to conductive contacts at the second surfaces of the first dies, the second surfaces of the first dies are between the first surfaces of the first dies and the first surface of the second die, footprint of the first dies are contained within a footprint of the second die, and the first dies include superconducting qubit elements.

Example 27 may include the subject matter of Example 23, and may further specify that the superconducting qubit elements are included in the second die.

Example 28 may include the subject matter of Example 16, and may further specify that the quantum processing circuitry includes a quantum well stack and a plurality of gates above the quantum well stack.

Example 29 may include the subject matter of any of Examples 16-28, and may further specify that the interconnects include a solder and the solder includes a superconductor.

Example 30 may include the subject matter of any of Examples 16-29, and may further specify that the first die includes multiple ground vias extending between the first surface of the first die and the second surface of the first die.

Example 31 may include the subject matter of any of Examples 16-30, and may further specify that the first die and the second die include quantum processing circuitry.

Example 32 may include the subject matter of any of Examples 16-31, and may further specify that the first die or the second die includes control circuitry.

Example 33 may include the subject matter of any of Examples 16-32, and may further specify that the interconnects are first interconnects, the second die further includes second conductive contacts at the first surface of the second die, and the quantum computing assembly further includes: a package substrate, wherein the first conductive contacts of the first die are coupled to conductive contacts of the package substrate with second interconnects, and the second conductive contacts of the second die are coupled to conductive contacts of the package substrate with third interconnects.

Example 34 may include the subject matter of Example 33, and may further specify that the package substrate includes a recess, and the first die is at least partially in the recess.

Example 35 may include the subject matter of any of Examples 33-34, and may further specify that the first interconnects, second interconnects, and third interconnects include a solder and the solder includes a superconductor.

Example 36 may include the subject matter of any of Examples 16-35, and may further specify that the first die or the second die includes a multiplexer or a filter.

Example 37 is a quantum computing assembly, including: a plurality of first dies, individual ones of the first dies having a first surface and an opposing second surface, first conductive contacts at the first surfaces of individual ones of the first dies, and second conductive contacts at the second surfaces of individual ones of the first die; and a second die having a first surface and an opposing second surface, first conductive contacts at the first surface of the second die, and second conductive contacts at the first surface of the second die; wherein the second conductive contacts of the first dies are coupled to the first conductive contacts of the second die by interconnects, the second conductive contacts of the second die are not coupled to conductive contacts at the second surfaces of the first dies, the second surfaces of the first dies are between the first surfaces of the first dies and the first surface of the second die, and footprint of the first dies are contained within a footprint of the second die, and a first die or the second die includes quantum processing circuitry.

Example 38 may include the subject matter of Example 37, and may further specify that the first dies include superconducting qubit elements.

Example 39 may include the subject matter of Example 38, and may further specify that the second die includes flux lines and drive lines.

Example 40 may include the subject matter of any of Examples 37-39, and may further specify that the first dies include jump-over transitions for microwave lines.

Example 41 may include the subject matter of any of Examples 37-40, and may further specify that the second die includes a plurality of superconducting qubit elements, and the first dies include conductive pathways between different ones of the superconducting qubit elements.

Example 42 may include the subject matter of any of Examples 37-41, and may further specify that the first dies include resonators.

Example 43 may include the subject matter of Example 42, and may further specify that the second die includes superconducting qubit elements.

Example 44 may include the subject matter of any of Examples 37-43, and may further specify that the interconnects are first interconnects, the second die further includes second conductive contacts at the first surface of the second die, and the quantum computing assembly further includes: a package substrate, wherein the first conductive contacts of the first die are coupled to conductive contacts of the package substrate with second interconnects, and the second conductive contacts of the second die are coupled to conductive contacts of the package substrate with third interconnects.

Example 45 may include the subject matter of Example 44, and may further specify that the package substrate includes a plurality of recesses, and the first dies are at least partially in corresponding ones of the recesses.

Example 46 may include the subject matter of Example 37-45, and may further specify that the interconnects include a solder and the solder includes a superconductor.

Example 47 may include the subject matter of Example 37-46, and may further specify that a first die or the second die includes a multiplexer or a filter.

The invention claimed is:

1. A quantum computing assembly, comprising:
   a package substrate having a first surface and an opposing second surface;
   a first die having a first surface and an opposing second surface, wherein the first surface of the first die is coupled to the second surface of the package substrate by first interconnects, and the first surface of the first die is at least partially between the second surface of the package substrate and the second surface of the first die; and
   a second die having a first surface and an opposing second surface, wherein the first surface of the second die is coupled to the second surface of the package substrate by second interconnects, the first surface of the second die is coupled to the second surface of the first die by third interconnects, and the first surface of the second die is at least partially between the second surface of the package substrate and the second surface of the second die;
   wherein the first die or the second die includes quantum processing circuitry, and
   wherein the quantum processing circuitry includes at least one of:
     resonators, and
     superconducting qubit elements.

2. The quantum computing assembly of claim 1, wherein the quantum processing circuitry includes the resonators and the resonators are in the first die.

3. The quantum computing assembly of claim 1, wherein the quantum processing circuitry further includes a quantum well stack and a plurality of gates above the quantum well stack.

4. The quantum computing assembly of claim 1, wherein the third interconnects include a solder and the solder includes a superconductor.

5. The quantum computing assembly of claim 1, wherein the first die includes multiple ground vias extending between the first surface of the first die and the second surface of the first die.

6. The quantum computing assembly of claim 1, wherein the first die and the second die include quantum processing circuitry.

7. The quantum computing assembly of claim 1, wherein the third interconnects include metal-to-metal interconnects.

8. The quantum computing assembly of claim 1, further comprising:
   a non-quantum processing device, coupled to the quantum processing circuitry.

9. A quantum computing assembly, comprising:
   a first die having a first surface and an opposing second surface, first conductive contacts at the first surface of the first die, and second conductive contacts at the second surface of the first die; and
   a second die having a first surface and an opposing second surface, first conductive contacts at the first surface of the second die, and second conductive contacts at the first surface of the second die;
   wherein the second conductive contacts of the first die are coupled to the first conductive contacts of the second die by interconnects, the second conductive contacts of the second die are not coupled to conductive contacts at the second surface of the first die, the second surface of the first die is between the first surface of the first die and the first surface of the second die, a footprint of the first die is contained within a footprint of the second die, and the first die or the second die includes quantum processing circuitry.

10. The quantum computing assembly of claim 9, wherein the quantum processing circuitry includes superconducting qubit elements.

11. The quantum computing assembly of claim 10, wherein the superconducting qubit elements are included in the second die.

12. The quantum computing assembly of claim 9, wherein the quantum processing circuitry includes drive lines, flux lines, and resonators, and the resonators are included in the second die.

13. The quantum computing assembly of claim 9, wherein the first die is one of a plurality of first dies, individual ones of the first dies having a first surface and an opposing second surface, individual ones of the first dies having first conductive contacts at the first surface of the first die, and second conductive contacts at the second surface of the first die, individual ones of the first dies having second conductive contacts coupled to the first conductive contacts of the second die by interconnects, the second conductive contacts of the second die are not coupled to conductive contacts at the second surfaces of the first dies, the second surfaces of the first dies are between the first surfaces of the first dies and the first surface of the second die, footprint of the first dies are contained within a footprint of the second die, and the first dies include superconducting qubit elements.

14. The quantum computing assembly of claim 9, wherein the interconnects include metal-to-metal interconnects.

15. The quantum computing assembly of claim 9, further comprising:
   a non-quantum processing device, coupled to the quantum processing circuitry.

16. A quantum computing assembly, comprising:
   a first die having a first surface and an opposing second surface, and conductive contacts at the second surface of the first die; and
   a second die having a first surface and an opposing second surface, and conductive contacts at the first surface of the second die;
   wherein the conductive contacts of the first die are coupled to the conductive contacts of the second die by interconnects, the second surface of the first die is between the first surface of the first die and the first surface of the second die, the first die includes qubit elements, and the second die includes transistors.

17. The quantum computing assembly of claim 16, wherein the interconnects include metal-to-metal interconnects.

18. The quantum computing assembly of claim 16, wherein the interconnects include hybrid bonded interconnects.

19. The quantum computing assembly of claim 16, wherein the qubit elements include spin qubit elements.

20. The quantum computing assembly of claim 16, further comprising:
a package substrate;
wherein (1) the first die is between the second die and the package substrate, or (2) the second die is between the first die and the package substrate.

\* \* \* \* \*